(12) United States Patent
Lekas et al.

(10) Patent No.: US 12,125,713 B2
(45) Date of Patent: Oct. 22, 2024

(54) METHOD FOR MANUFACTURING FERROMAGNETIC-DIELECTRIC COMPOSITE MATERIAL

(71) Applicant: Ferric Inc., New York, NY (US)

(72) Inventors: Michael Lekas, Brooklyn, NY (US); Salahuddin Raju, Long Island City, NY (US); Noah Sturcken, New York, NY (US); Ryan Davies, New York, NY (US); Denis Shishkov, Brooklyn, NY (US)

(73) Assignee: Ferric Inc., New York, NY (US)

(*) Notice: Subject to any disclaimer, the term of this patent is extended or adjusted under 35 U.S.C. 154(b) by 0 days.

(21) Appl. No.: 17/655,832

(22) Filed: Mar. 22, 2022

(65) Prior Publication Data
US 2023/0343602 A1    Oct. 26, 2023

(51) Int. Cl.
*H01L 21/3205* (2006.01)
*H01F 17/00* (2006.01)
(Continued)

(52) U.S. Cl.
CPC ......... *H01L 21/3205* (2013.01); *H01F 41/32* (2013.01); *H01L 21/02172* (2013.01);
(Continued)

(58) Field of Classification Search
CPC .......... H01F 41/14; H01F 41/24; H01F 41/26; H01F 1/42; H01F 1/442; H01F 1/445;
(Continued)

(56) References Cited

U.S. PATENT DOCUMENTS 1,553,983 A    9/1925  Casper
2,931,966 A    4/1960  Rockey
(Continued)

FOREIGN PATENT DOCUMENTS

CN    101840993 A    9/2010
CN    106910602 A    6/2017
(Continued)

OTHER PUBLICATIONS

N. Sturcken et al., "Design of Coupled Power Inductors with Crossed Anisotropy Magnetic Core for Integrated Power Conversion" IEEE-APEC 2012, pp. 417-423, doi: 10.1109/APEC.2012.6165853.
(Continued)

*Primary Examiner* — Shaun M Campbell
*Assistant Examiner* — Aneta B Cieslewicz
(74) *Attorney, Agent, or Firm* — Intrinsic Law Corp.

(57) ABSTRACT

A method for manufacturing a ferromagnetic-dielectric composite material comprises: (a) placing patterned ferromagnetic layer regions, in a patterning substrate assembly that includes a patterning substrate and a first dielectric layer, in physical contact with a second dielectric layer, the second dielectric layer in a receiving substrate assembly that includes a receiving substrate, (b) forming a bond between the patterned ferromagnetic layer regions and the second dielectric layer; (c) releasing the patterning substrate from the patterning substrate assembly to transfer the patterned ferromagnetic layer regions and the first dielectric layer from the patterning substrate assembly to the receiving substrate assembly; and (d) releasing the receiving substrate from the receiving substrate assembly to form the ferromagnetic-dielectric composite material.

8 Claims, 51 Drawing Sheets

(51) Int. Cl.
*H01F 41/32* (2006.01)
*H01L 21/02* (2006.01)
*H01L 21/324* (2006.01)
*H01L 21/78* (2006.01)
*H01L 23/522* (2006.01)
*H01L 49/02* (2006.01)

(52) U.S. Cl.
CPC ........ *H01L 21/324* (2013.01); *H01L 21/7806* (2013.01); *H01L 23/5227* (2013.01); *H01F 17/0033* (2013.01); *H01L 28/10* (2013.01)

(58) Field of Classification Search
CPC ... H01F 1/04; H01F 1/047; H01F 1/09; H01F 1/10; H01F 1/11; H01F 1/113; H01F 1/14; H01F 1/33; H01F 1/34; H01F 1/36; H01F 1/37; H01F 41/00–34; H01F 1/44–447; H01F 1/032–117; H01F 1/12–38; H01F 10/08–245; H01F 17/00–08; H01L 21/3205; H01L 21/324; H01L 21/7806; H01L 21/02172–02197; H01L 21/30–326; H01L 23/5227; H01L 28/10; H10N 50/85
See application file for complete search history.

(56) References Cited

U.S. PATENT DOCUMENTS

| | | | |
|---|---|---|---|
| 3,110,613 | A | 11/1963 | Bean |
| 3,543,249 | A | 11/1970 | Bobeck et al. |
| 3,573,760 | A | 4/1971 | Chang et al. |
| 3,614,554 | A | 10/1971 | Shield et al. |
| 4,025,379 | A | 5/1977 | Whetstone |
| 4,103,315 | A | 7/1978 | Hempstead et al. |
| 4,236,946 | A | 12/1980 | Aboaf et al. |
| 5,070,317 | A | 12/1991 | Bhagat |
| 5,079,534 | A | 1/1992 | Steingroever et al. |
| 5,225,971 | A | 7/1993 | Spreen |
| 5,238,507 | A | 8/1993 | Kugimiya et al. |
| 5,319,343 | A | 6/1994 | Jeffries |
| 5,399,372 | A | 3/1995 | Grimes et al. |
| 5,583,474 | A | 12/1996 | Mizoguchi et al. |
| 5,635,892 | A | 6/1997 | Ashby et al. |
| 5,831,431 | A | 11/1998 | Gottfried-Gottfried et al. |
| 5,912,553 | A | 6/1999 | Mengelkoch |
| 6,118,351 | A | 9/2000 | Kossives et al. |
| 6,362,986 | B1 | 3/2002 | Schultz et al. |
| 6,542,060 | B2 | 4/2003 | Fedeli |
| 6,542,379 | B1 | 4/2003 | Lauffer et al. |
| 6,856,226 | B2 | 2/2005 | Gardner |
| 6,940,384 | B2 | 9/2005 | Hooey et al. |
| 7,230,408 | B1 | 6/2007 | Vinn et al. |
| 7,554,399 | B1 | 6/2009 | Gaboriau et al. |
| 7,636,242 | B2 | 12/2009 | Hazucha et al. |
| 7,719,084 | B2 | 5/2010 | Gardner et al. |
| 7,791,837 | B2 | 9/2010 | Fujiwara |
| 7,867,787 | B2 | 1/2011 | Gardner et al. |
| 7,868,431 | B2 | 1/2011 | Feng et al. |
| 7,875,955 | B1 | 1/2011 | Hopper et al. |
| 8,108,984 | B2 | 2/2012 | Gardner et al. |
| 8,270,137 | B2 | 9/2012 | Briere et al. |
| 8,288,277 | B2 | 10/2012 | Takahashi et al. |
| 8,432,144 | B2 | 4/2013 | Notani |
| 8,558,344 | B2 | 10/2013 | Chen |
| 9,047,890 | B1 | 6/2015 | Herget |
| 9,647,053 | B2 | 5/2017 | Sturcken et al. |
| 9,679,958 | B2 | 6/2017 | Sturcken et al. |
| 9,728,596 | B1 | 8/2017 | Chen et al. |
| 10,002,828 | B2 | 6/2018 | Sturcken et al. |
| 10,284,314 | B2 | 5/2019 | Lunttila et al. |
| 10,354,950 | B2 | 7/2019 | Sturcken et al. |
| 2002/0060621 | A1 | 5/2002 | Duffy et al. |
| 2002/0136929 | A1 | 9/2002 | Oikawa et al. |
| 2003/0005569 | A1 | 1/2003 | Hiatt et al. |
| 2003/0070282 | A1 | 4/2003 | Hiatt et al. |
| 2003/0090244 | A1 | 5/2003 | Shenai et al. |
| 2003/0160677 | A1 | 8/2003 | Fujiwara et al. |
| 2004/0009614 | A1 | 1/2004 | Ahn et al. |
| 2004/0135661 | A1 | 7/2004 | Haugs et al. |
| 2004/0166308 | A1 | 8/2004 | Raksha et al. |
| 2004/0196019 | A1 | 10/2004 | Schneider |
| 2005/0088269 | A1 | 4/2005 | Hatano |
| 2005/0156704 | A1 | 7/2005 | Gardner et al. |
| 2006/0197510 | A1 | 9/2006 | Chandrasekaran |
| 2006/0263727 | A1 | 11/2006 | Lee et al. |
| 2006/0273418 | A1 | 12/2006 | Chung et al. |
| 2007/0037414 | A1 | 2/2007 | Yamauchi et al. |
| 2007/0218273 | A1 | 9/2007 | Ikeda |
| 2007/0290362 | A1 | 12/2007 | Hsu et al. |
| 2008/0003699 | A1 | 1/2008 | Gardner et al. |
| 2008/0023791 | A1 | 1/2008 | Muthukumar et al. |
| 2008/0172861 | A1 | 7/2008 | Holmes |
| 2008/0316647 | A1 | 12/2008 | Joisten et al. |
| 2009/0007418 | A1 | 1/2009 | Edo et al. |
| 2009/0068762 | A1 | 3/2009 | Takahashi et al. |
| 2009/0128274 | A1 | 5/2009 | Park et al. |
| 2009/0175014 | A1 | 7/2009 | Zeng et al. |
| 2009/0188104 | A1 | 7/2009 | Ching et al. |
| 2009/0324982 | A1 | 12/2009 | Aramaki et al. |
| 2011/0151588 | A1 | 6/2011 | Ashdown et al. |
| 2011/0208019 | A1 | 8/2011 | Sato et al. |
| 2011/0279214 | A1 | 11/2011 | Lee et al. |
| 2012/0086416 | A1 | 4/2012 | Kudo et al. |
| 2012/0154966 | A1 | 6/2012 | Wolfus et al. |
| 2013/0027170 | A1 | 1/2013 | Chen |
| 2013/0056847 | A1 | 3/2013 | Chen et al. |
| 2013/0099334 | A1 | 4/2013 | Mohan et al. |
| 2013/0099762 | A1 | 4/2013 | Terrovitis |
| 2013/0134534 | A1 | 5/2013 | Sbiaa et al. |
| 2013/0206845 | A1 | 8/2013 | Koujima et al. |
| 2013/0234821 | A1 | 9/2013 | Shim |
| 2014/0026654 | A1 | 1/2014 | Klopping |
| 2014/0027879 | A1 | 1/2014 | Weyers et al. |
| 2014/0062646 | A1 | 3/2014 | Morrissey et al. |
| 2014/0068932 | A1 | 3/2014 | Sturcken |
| 2014/0071636 | A1 | 3/2014 | Sturcken |
| 2014/0203398 | A1 | 7/2014 | Sturcken |
| 2014/0209691 | A1 | 7/2014 | Finn et al. |
| 2014/0240074 | A1 | 8/2014 | Qui et al. |
| 2014/0252548 | A1 | 9/2014 | Yen |
| 2014/0266541 | A1 | 9/2014 | Sakamoto et al. |
| 2015/0036308 | A1 | 2/2015 | Sturcken |
| 2015/0137776 | A1 | 5/2015 | Thomas et al. |
| 2015/0171157 | A1 | 6/2015 | Sturcken et al. |
| 2015/0187488 | A1 | 7/2015 | Williams et al. |
| 2015/0243881 | A1 | 8/2015 | Sankman et al. |
| 2015/0302974 | A1 | 10/2015 | Zhao |
| 2015/0349424 | A1 | 12/2015 | Hur et al. |
| 2016/0126008 | A1 | 5/2016 | Sturcken |
| 2016/0189852 | A1 | 6/2016 | Jeon et al. |
| 2016/0196908 | A1 | 7/2016 | Ohta et al. |
| 2016/0233153 | A1 | 8/2016 | Kidwell et al. |
| 2017/0250133 | A1 | 8/2017 | Sturcken et al. |
| 2017/0256353 | A1 | 9/2017 | Park et al. |
| 2018/0061545 | A1 | 3/2018 | Murashima et al. |
| 2018/0096771 | A1 | 4/2018 | Deligianni et al. |
| 2018/0286581 | A1 | 10/2018 | Deligianni et al. |
| 2018/0308612 | A1 | 10/2018 | Park et al. |
| 2018/0295724 | A1 | 11/2018 | Sturcken et al. |
| 2019/0164681 | A1 | 5/2019 | Kidwell et al. |
| 2022/0173035 | A1 | 6/2022 | Lekas et al. |
| 2023/0027090 | A1 | 1/2023 | Sturcken et al. |

FOREIGN PATENT DOCUMENTS

| | | |
|---|---|---|
| CN | 106852099 B | 1/2020 |
| DE | 102017101966 A1 | 8/2018 |
| FR | 2817622 A1 | 6/2002 |
| FR | 2905792 A1 | 3/2008 |
| JP | S5821810 A | 2/1983 |
| JP | 01028957 A | 1/1989 |
| JP | 05082736 A | 4/1993 |
| JP | H05291063 A | 11/1993 |

(56) References Cited

FOREIGN PATENT DOCUMENTS

| JP | 60124859 | A | 7/1995 |
|---|---|---|---|
| JP | H09162354 | A | 6/1997 |
| JP | H10284314 | A | 10/1998 |
| JP | 2000068133 | A | 3/2000 |
| JP | 2002190411 | A | 7/2002 |
| JP | 2006228824 | A | 8/2006 |
| TW | 200417759 | A | 7/2004 |
| WO | 2008143635 | A1 | 11/2008 |
| WO | 2012166877 | A1 | 12/2012 |
| WO | 2021049995 | A1 | 3/2021 |
| WO | 2021140156 | A1 | 7/2021 |

OTHER PUBLICATIONS

D. W. Lee et al., "Design and Fabrication of Integrated Solenoid Inductors with Magnetic Cores", Electronic Components and Technology Conference, 2008, p. 701-705, IEEE.

N. Sturcken et al., "A 2.5D Integrated Voltage Regulator Using Coupled Magnetic-Core Inductors on Silicon Interposer Delivering 10.8A/mm", IEEE International Solid-State Circuits Conference, Feb. 22, 2012, p. 3-5, Session 23, IEEE.

N. A. Sturcken, "Integrated Voltage Regulators with Thin-Film Magnetic Power Inductors", 2013, pp. 1-166, Columbia University.

ISA, "International Search Report", PCT/US2018/036832, Aug. 28, 2018.

Office Action from Taiwan Intellectual Property Office for Taiwanese Application No. 110144587. Dated Oct. 6, 2022.

International Search Report for PCT Application No. PCT/US2021/041967, dated Apr. 19, 2022.

Office Action from Taiwan Intellectual Property Office for Taiwanese Application No. 111125612, dated Feb. 17, 2023.

ISA, "Invitation to Pay Additional Fees and, Where Applicable, Protest Fee", PCT/US2022/071251, Nov. 30, 2022.

International Search Report for PCT Application No. PCT/US2022/071251, dated Jan. 5, 2023.

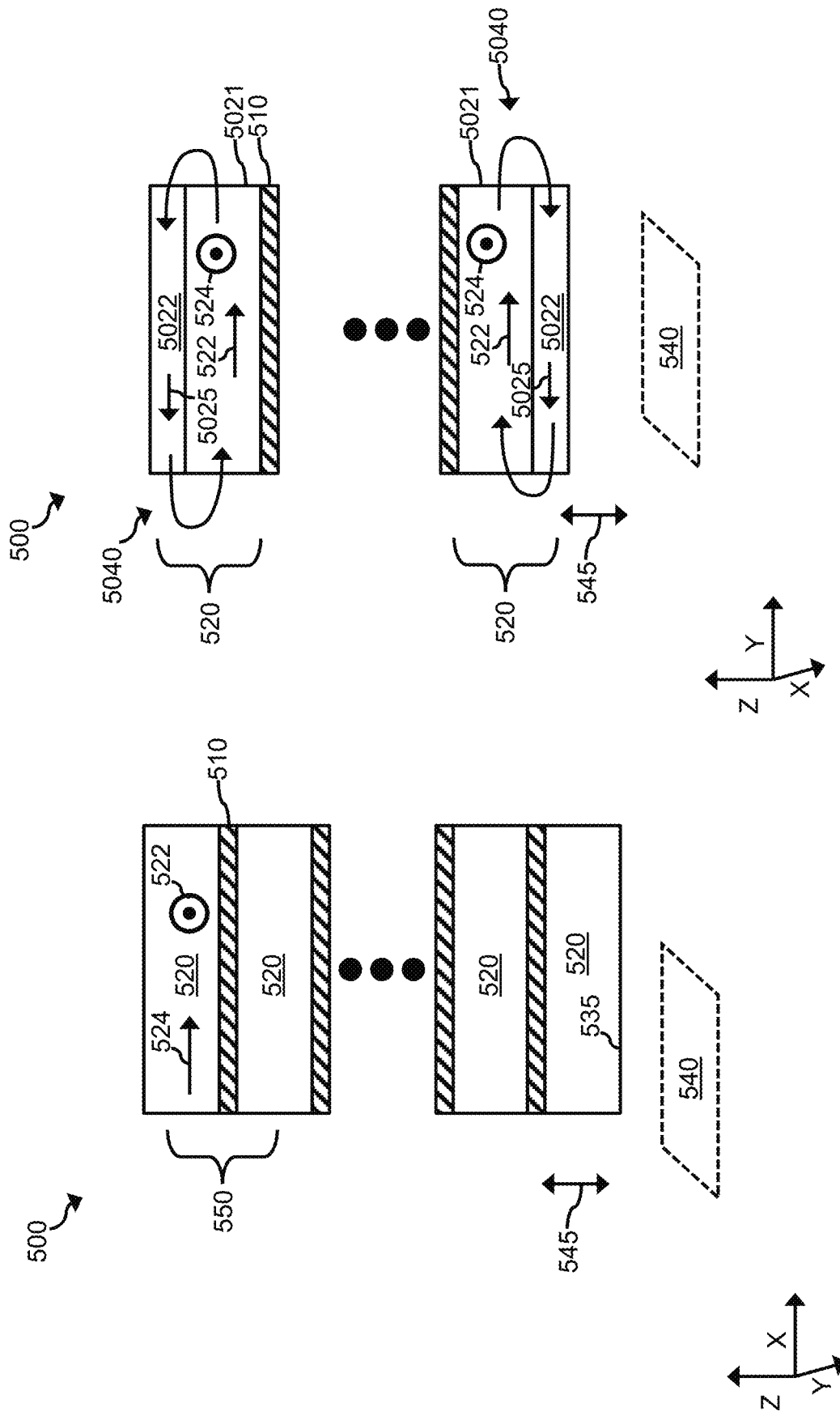

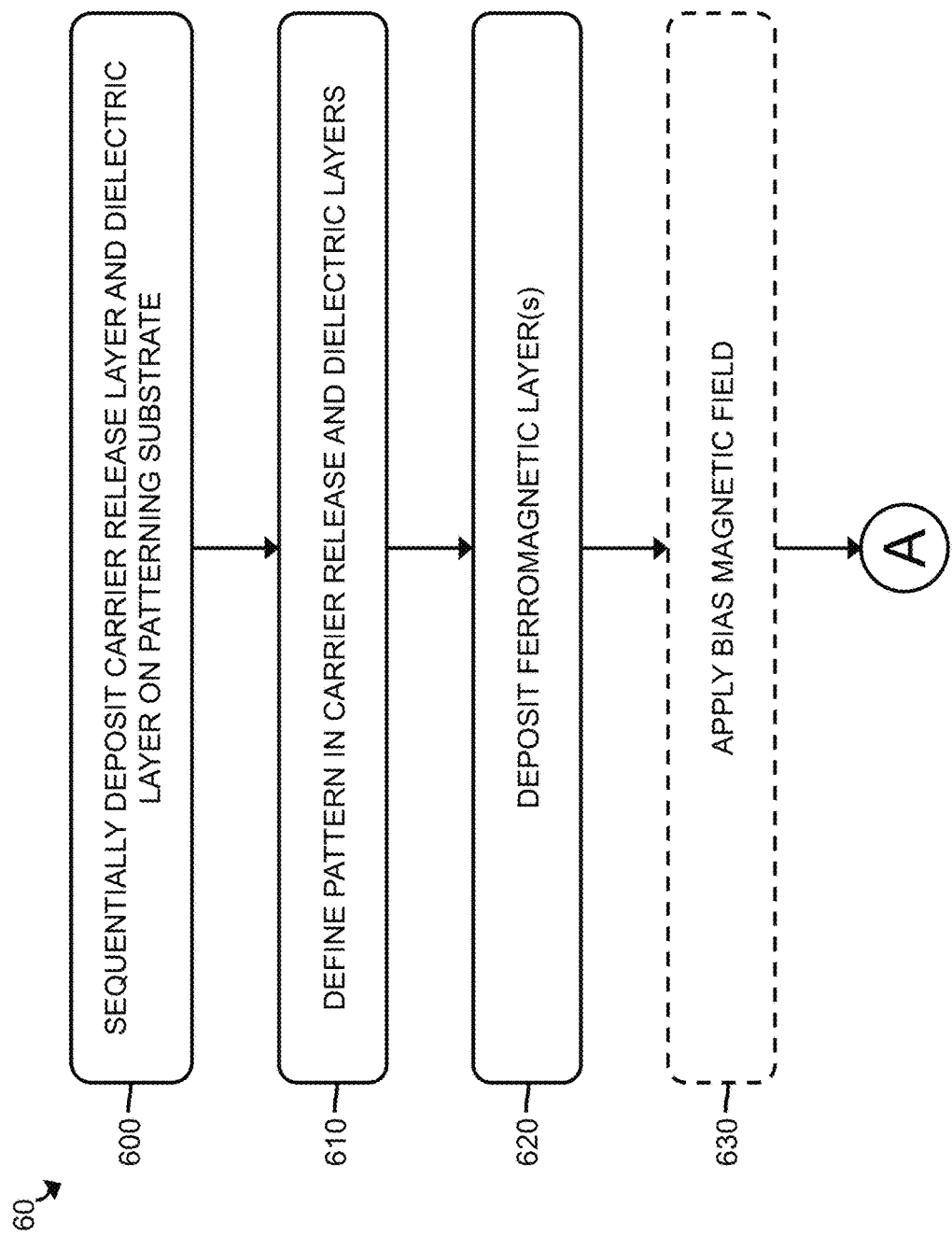

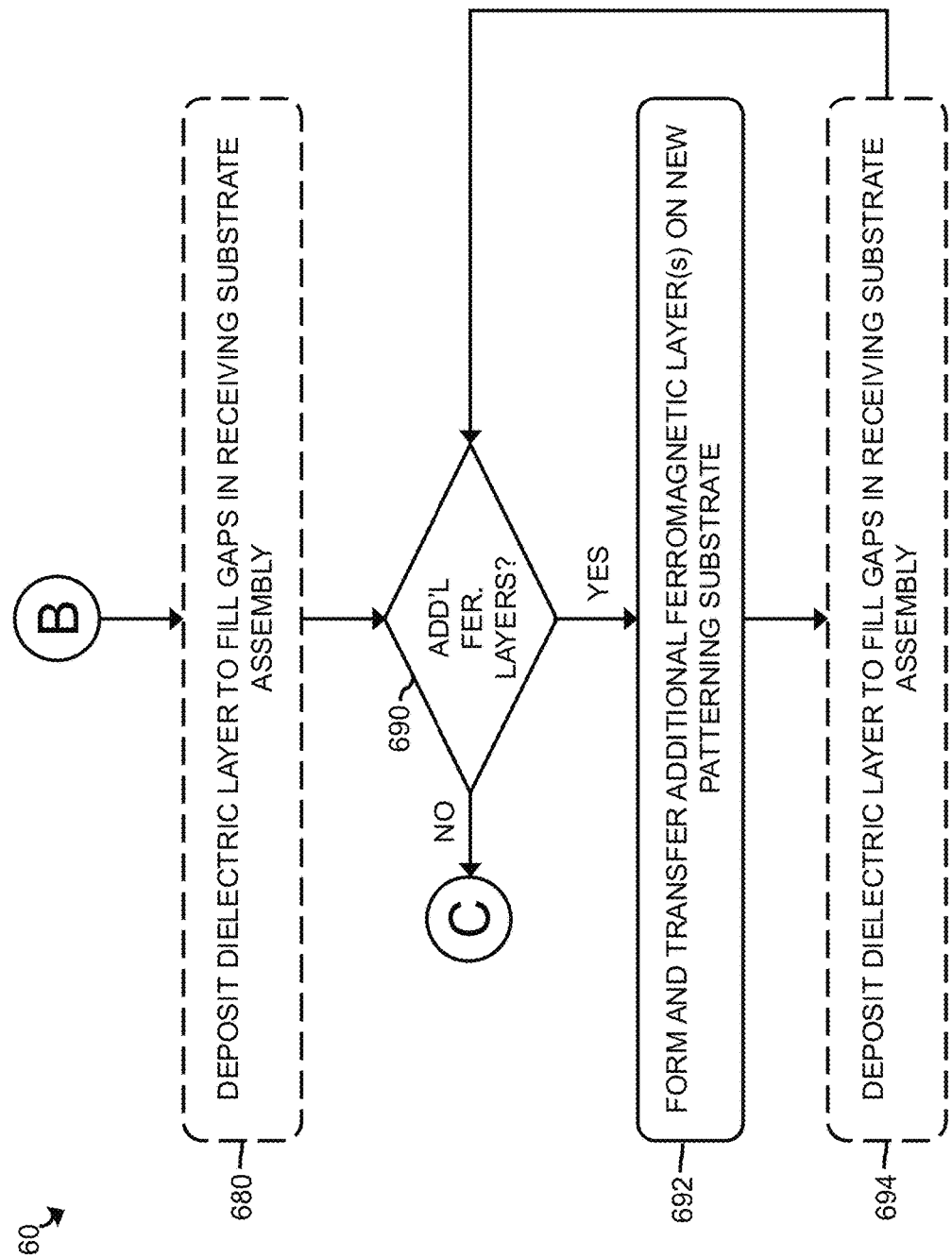

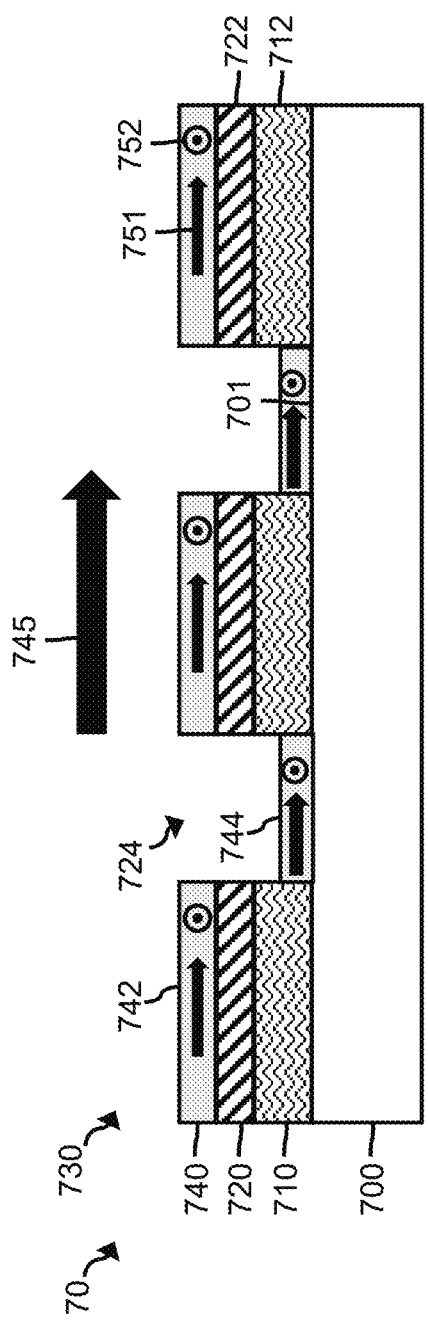
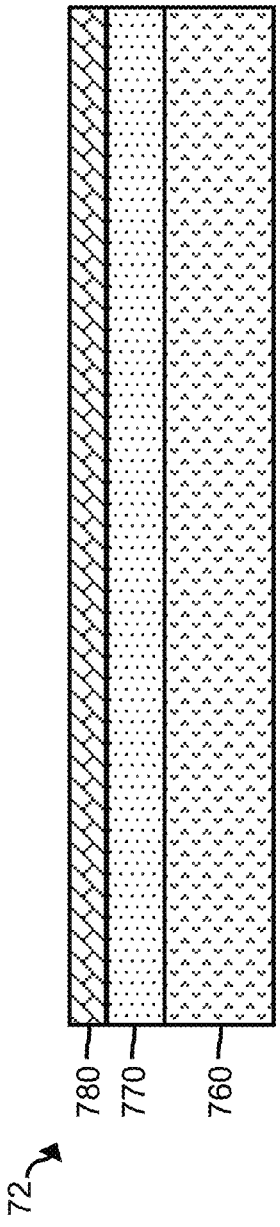
FIG. 7D
FIG. 7E

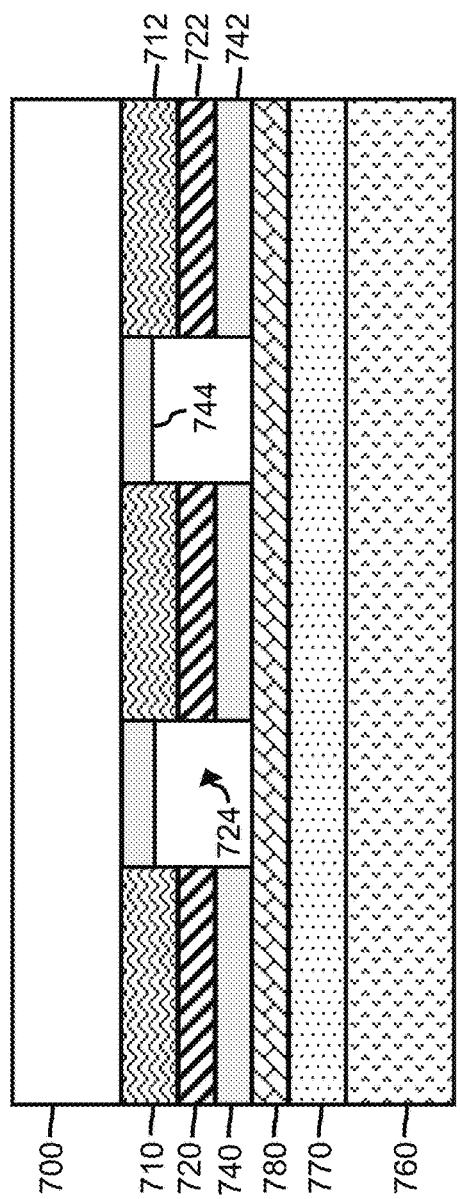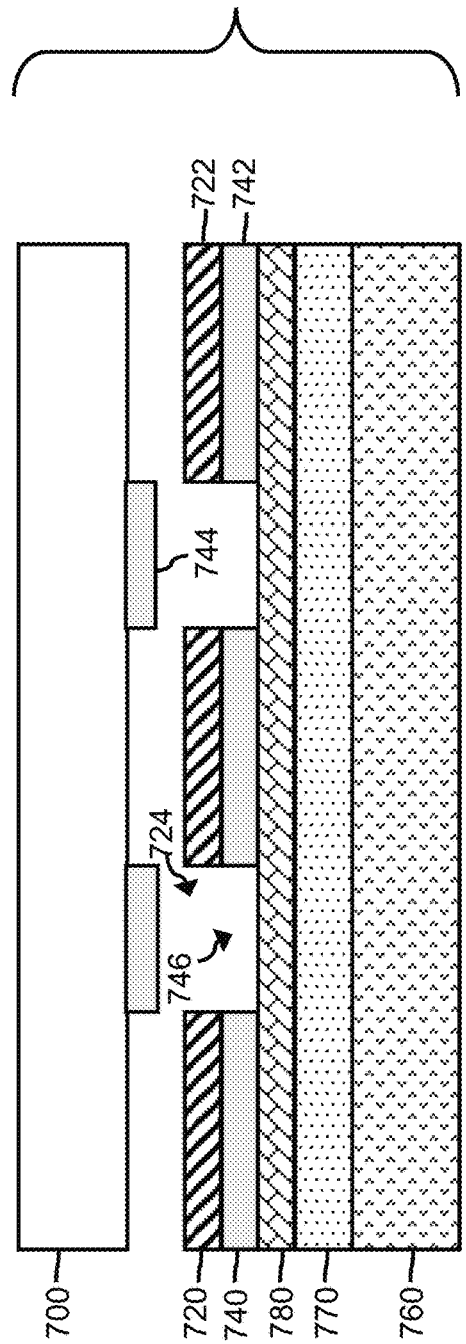
FIG. 7F
FIG. 7G

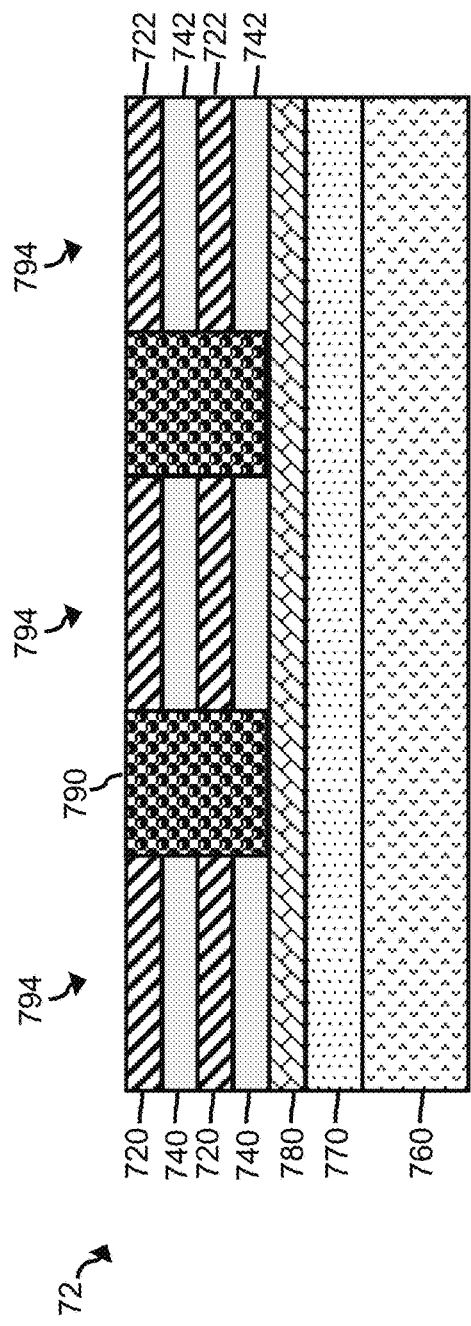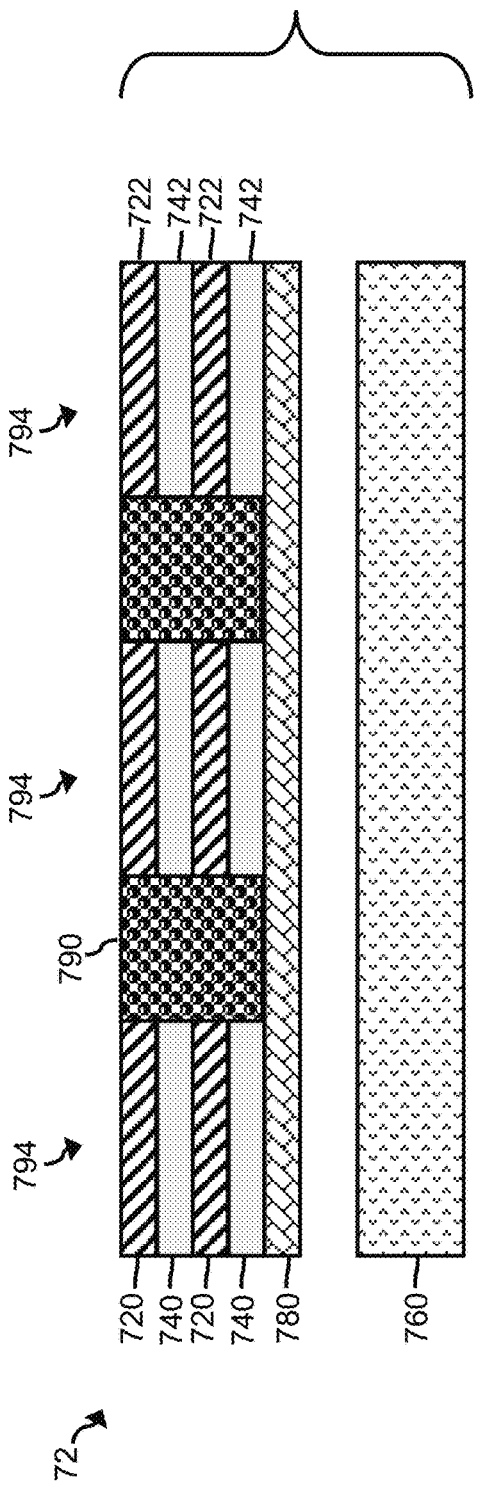

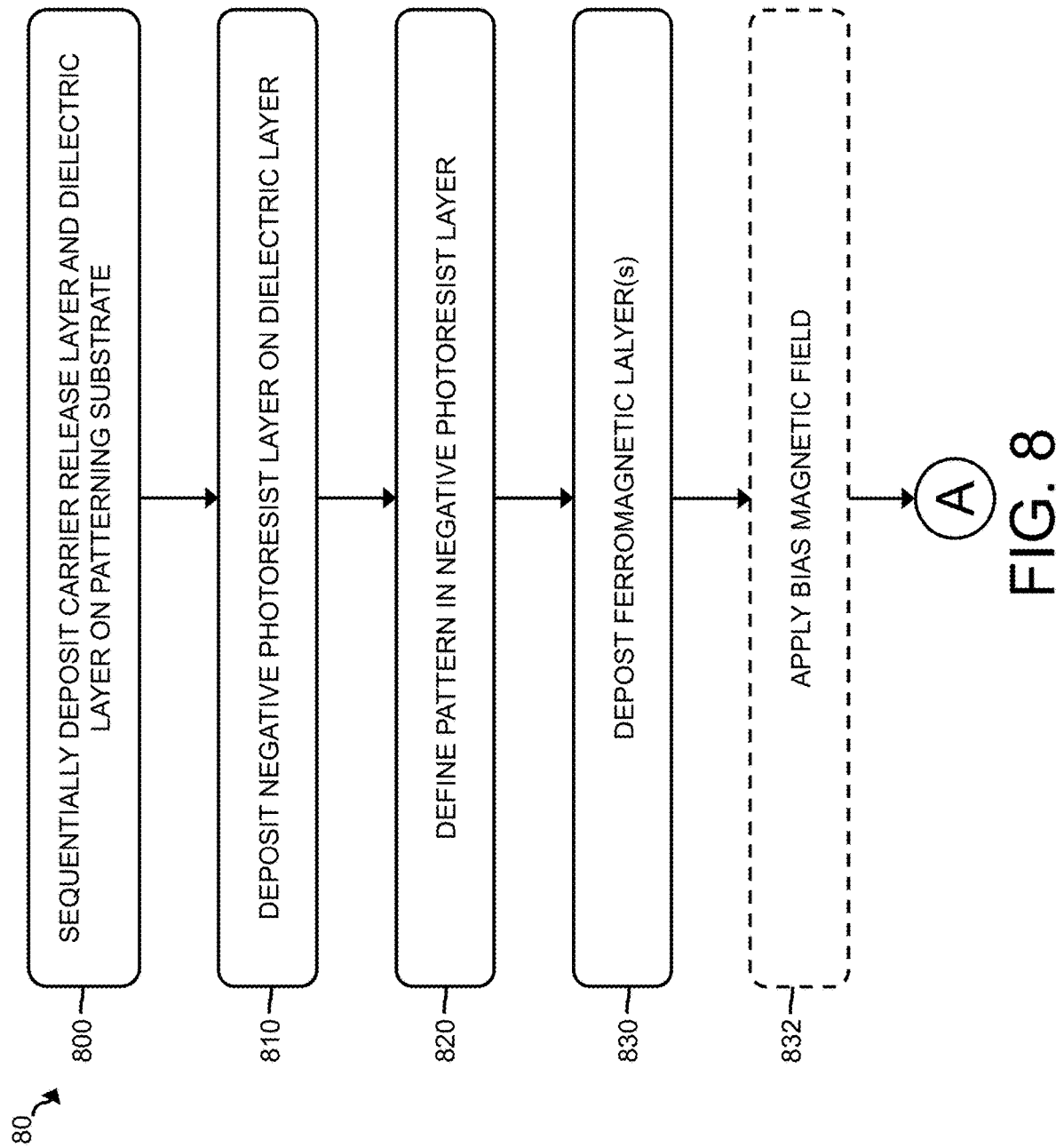

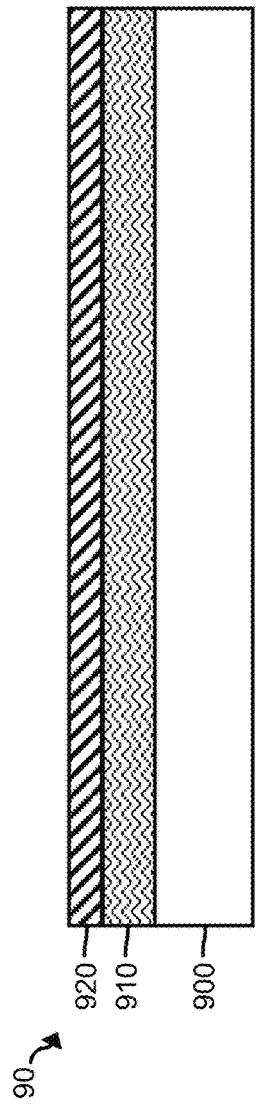
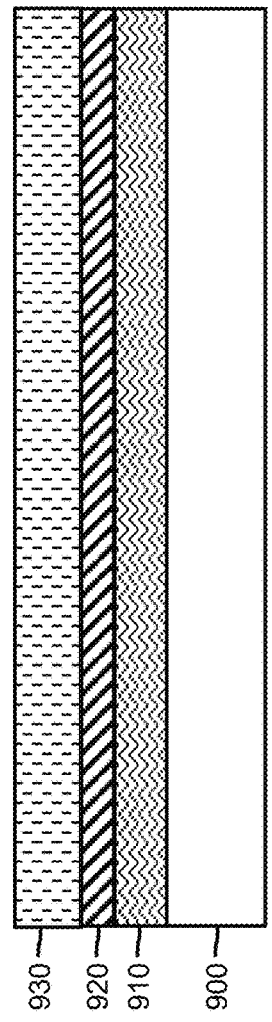
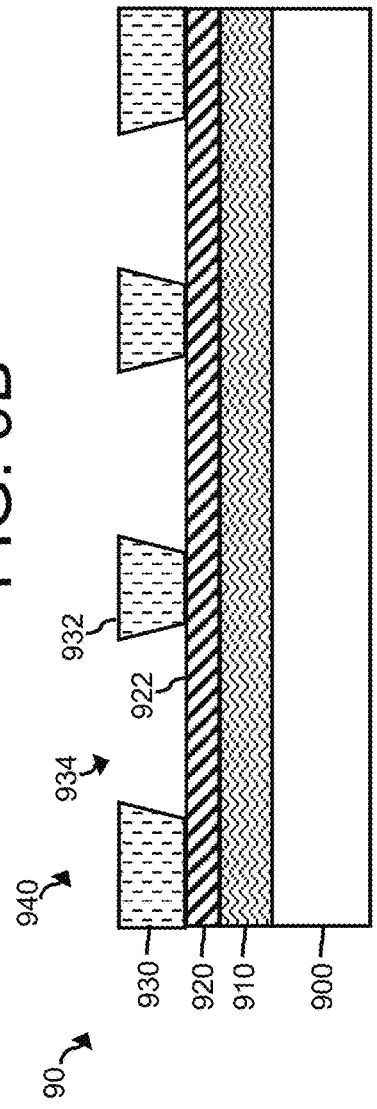

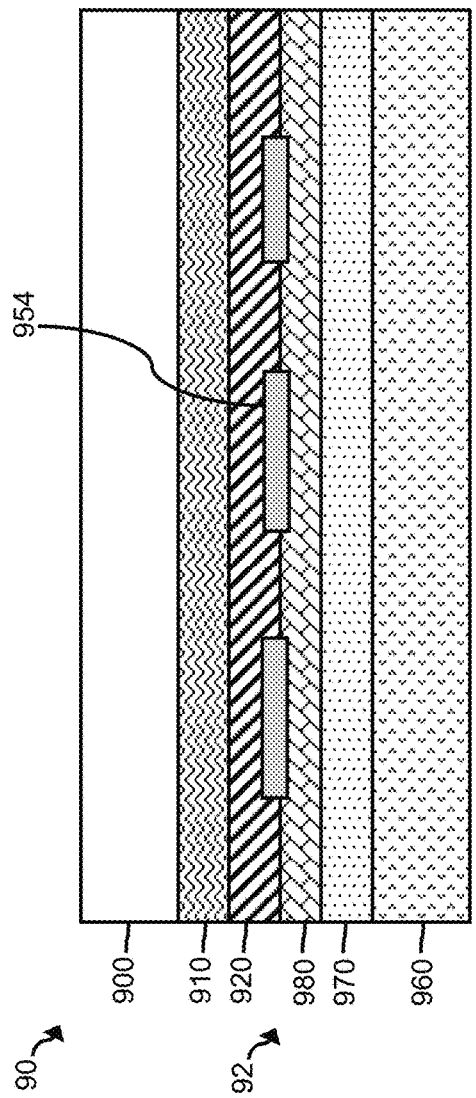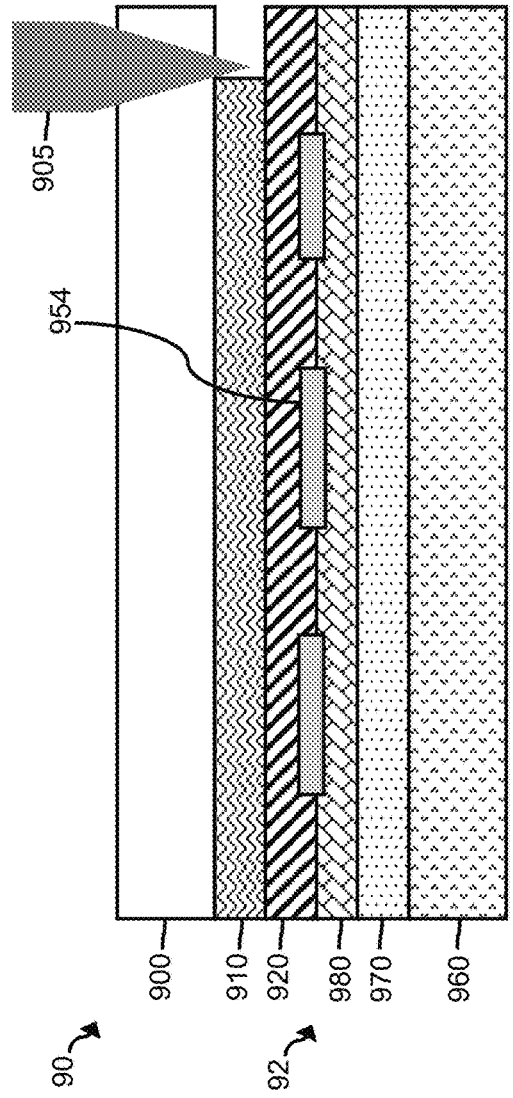

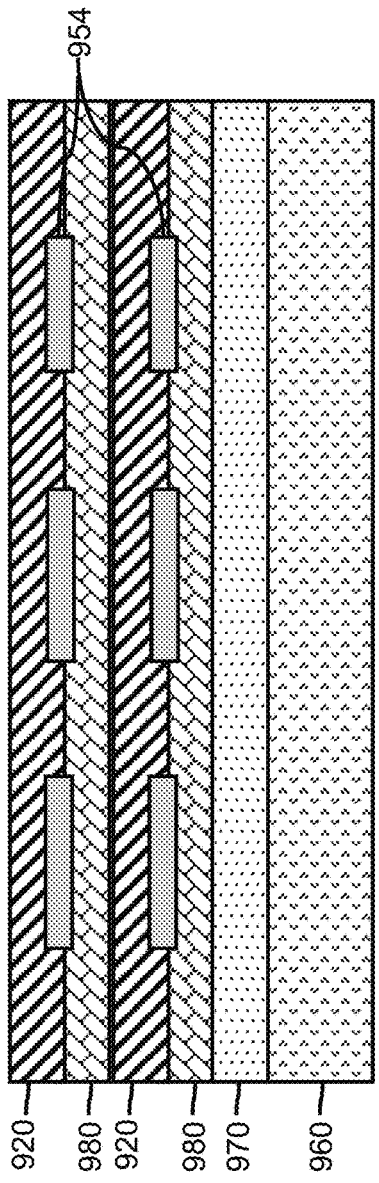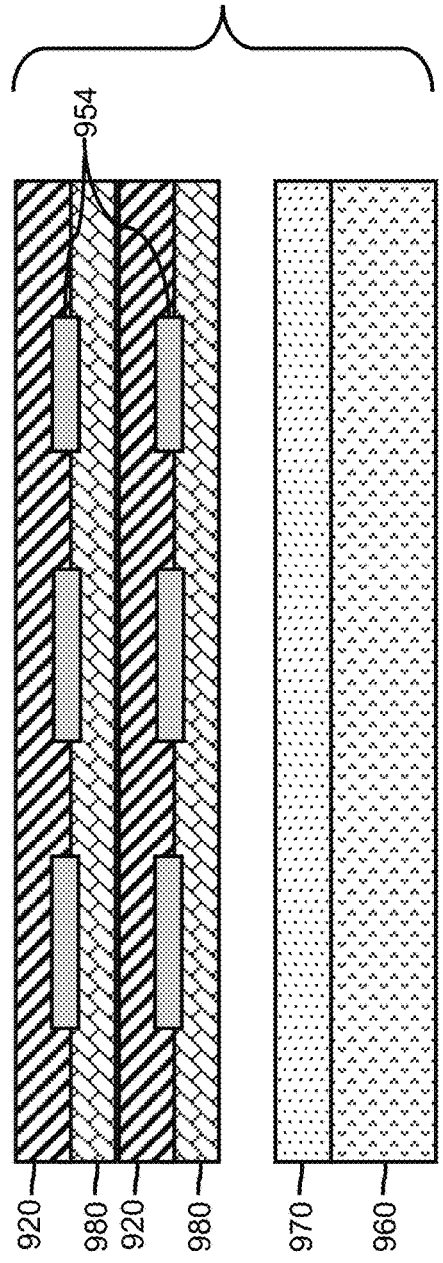

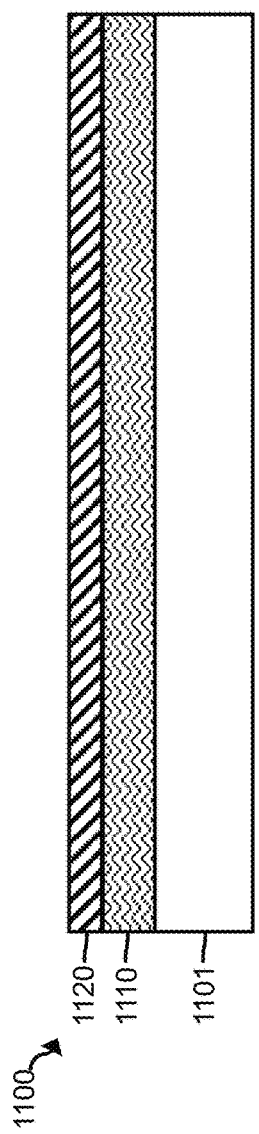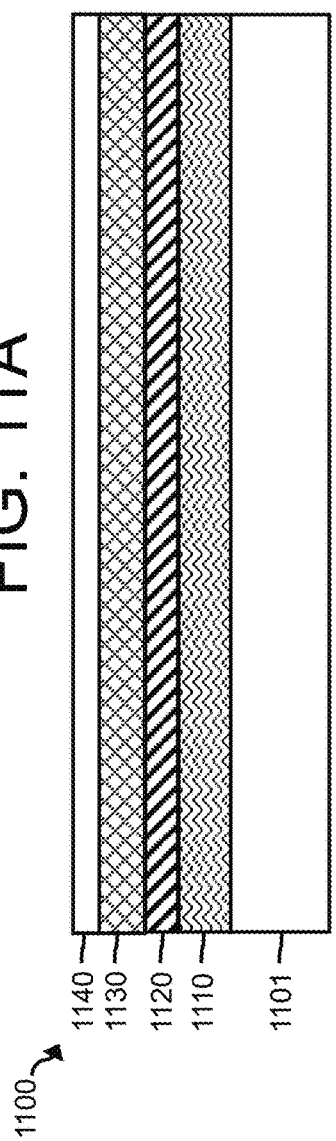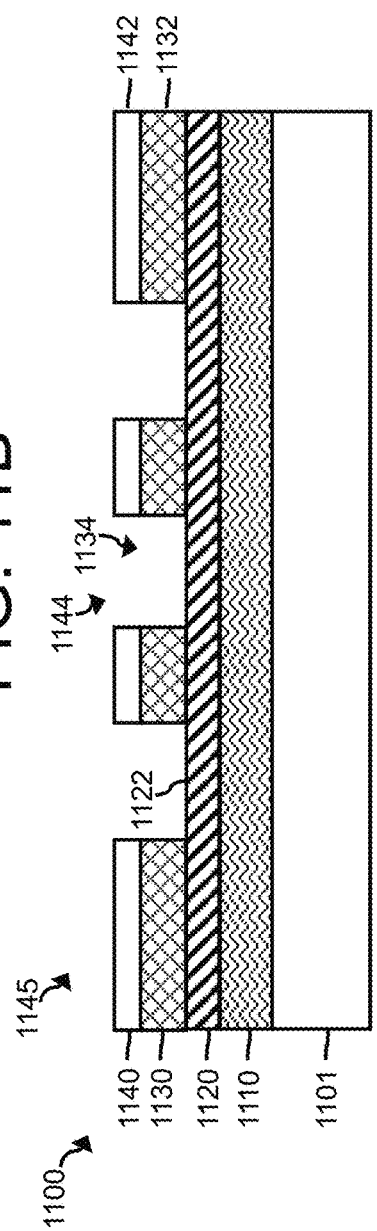

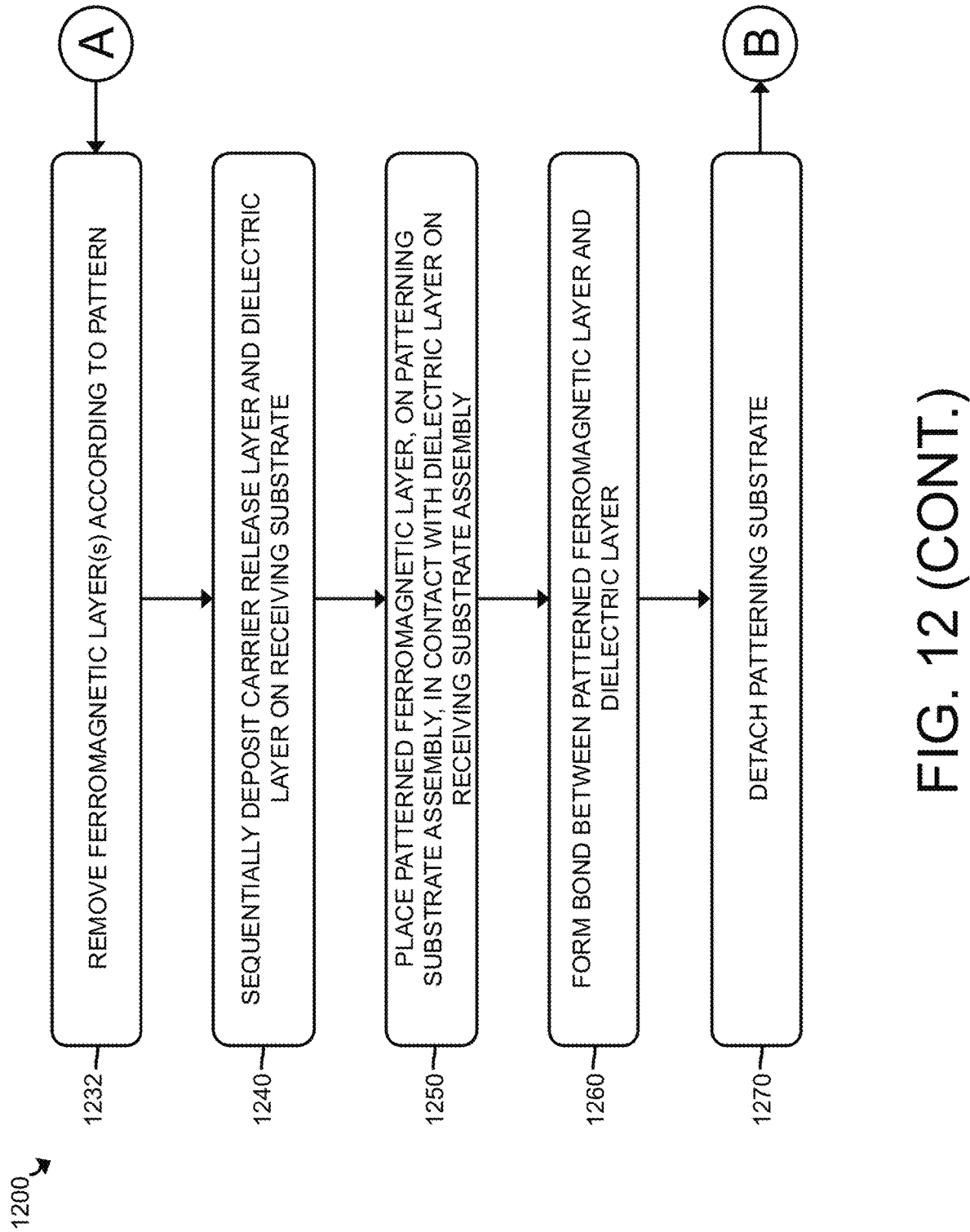

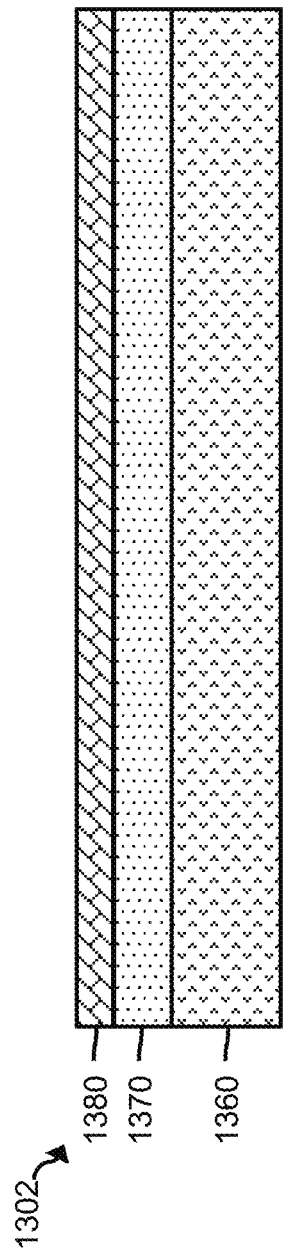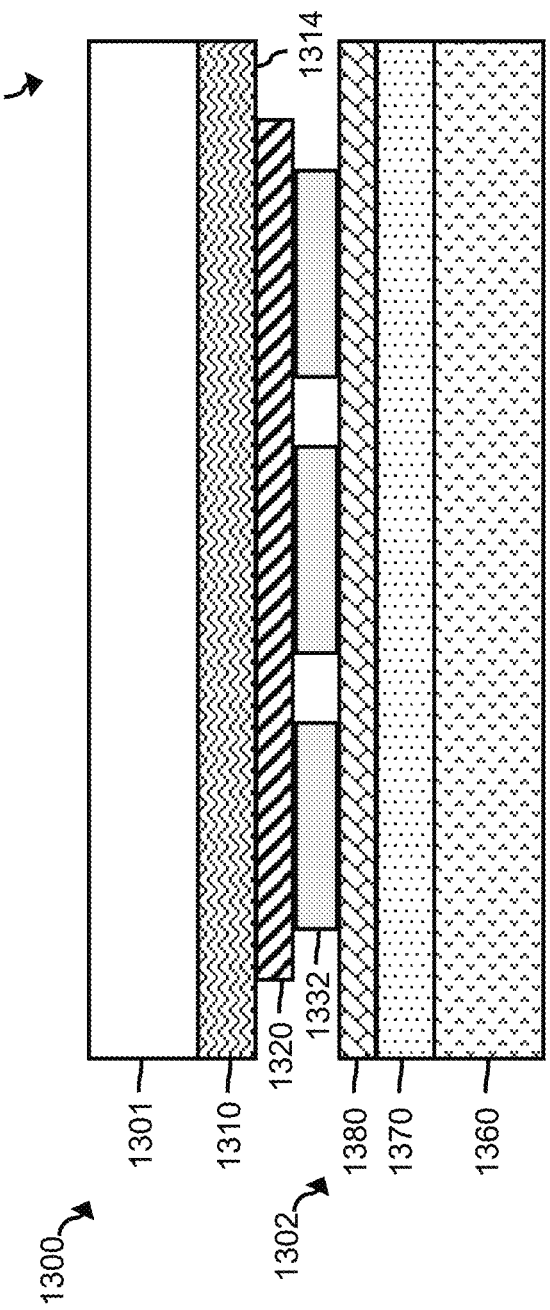

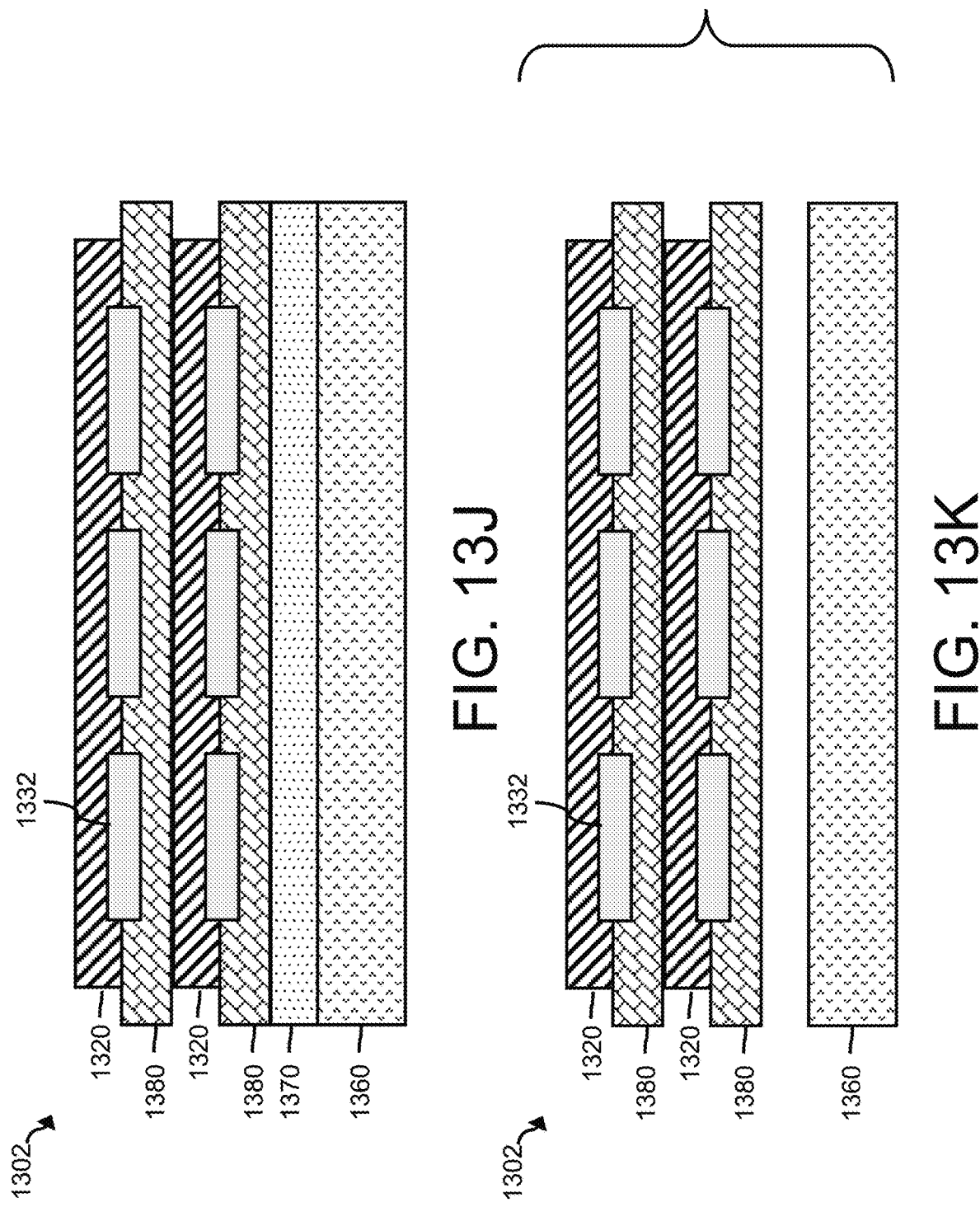

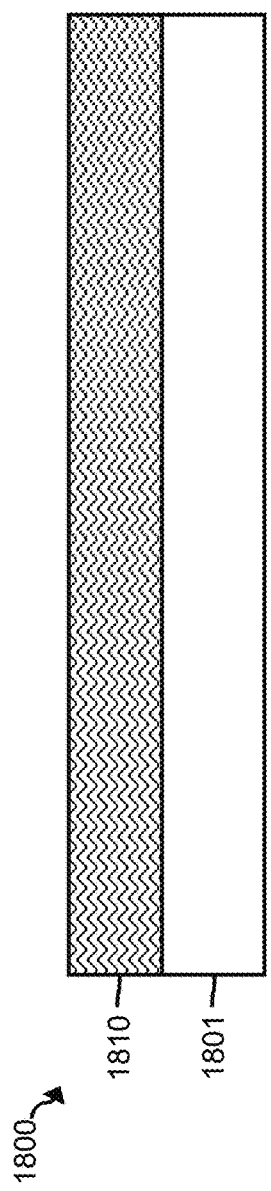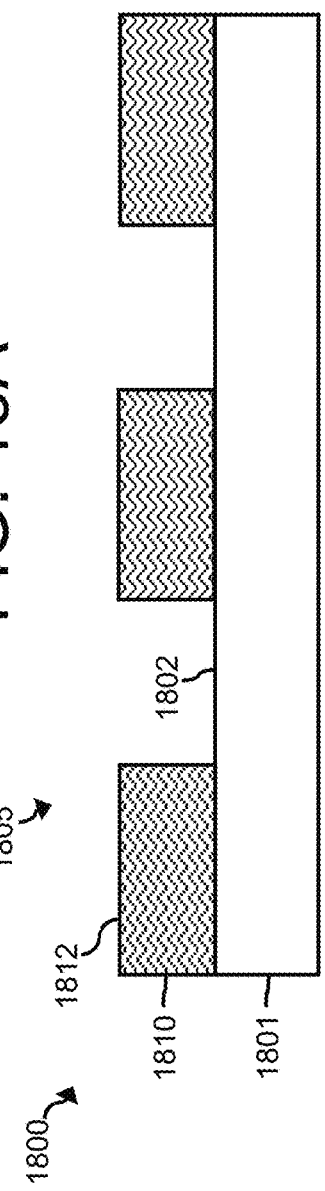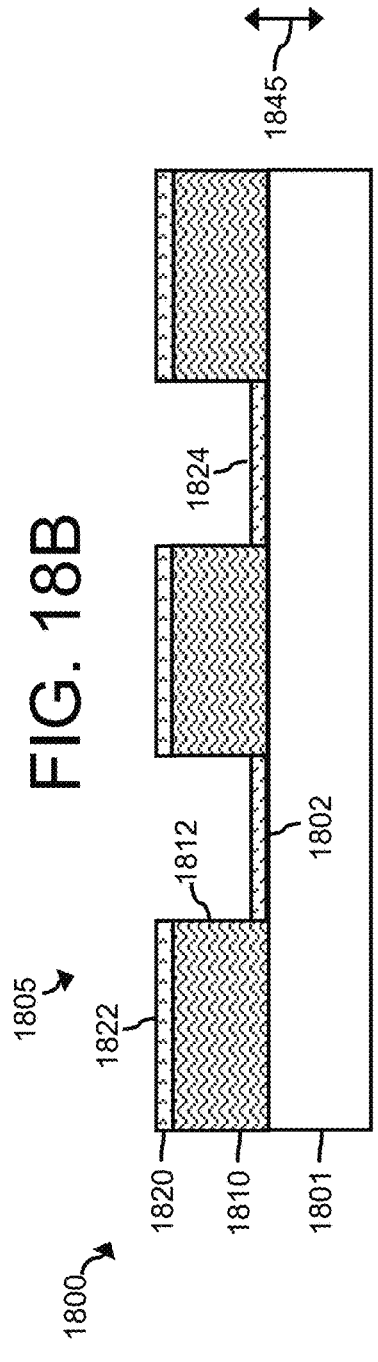

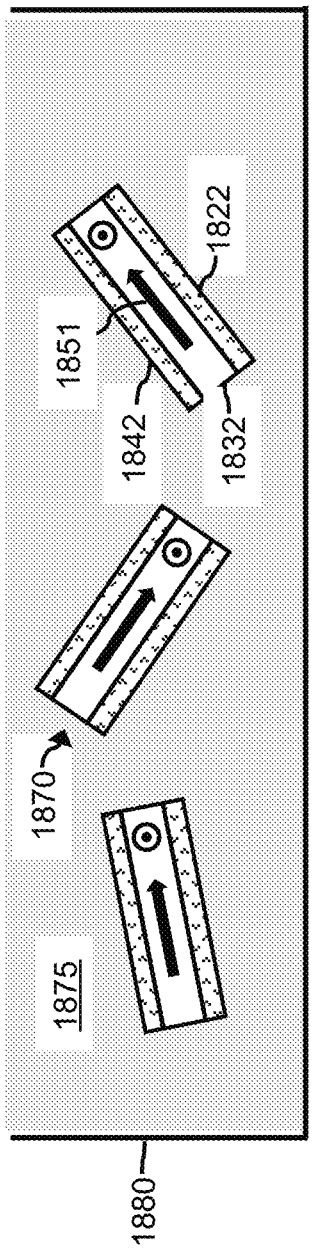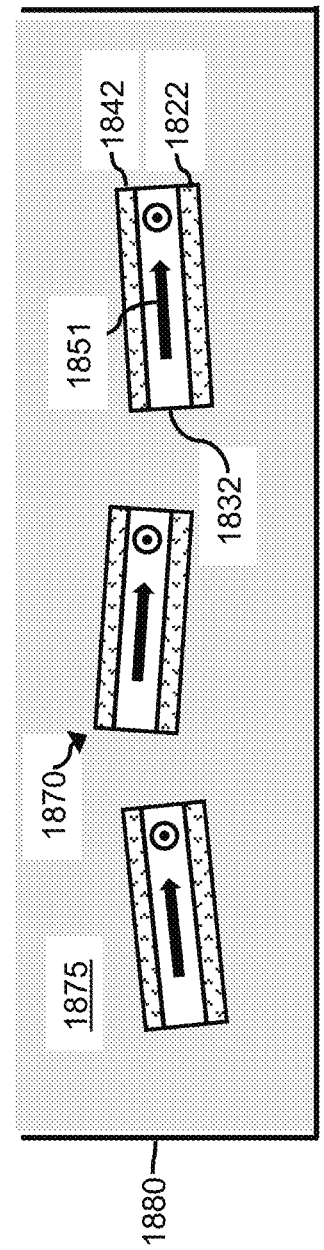

METHOD FOR MANUFACTURING FERROMAGNETIC-DIELECTRIC COMPOSITE MATERIAL

TECHNICAL FIELD

This application relates generally to microelectronics fabrication and materials for microelectronics fabrication.

BACKGROUND

The increase in computing power and spatial densities in semiconductor-based devices and energy efficiency of the same allow for ever more efficient and small microelectronic sensors, processors and other machines. These have found wide use in mobile and wireless applications and other industrial, military, medical and consumer products.

Even though computing energy efficiency is improving over time, the total amount of energy used by computers of all types is on the rise. Hence, there is a need for even greater energy efficiency.

SUMMARY

Example embodiments described herein have innovative features, no single one of which is indispensable or solely responsible for their desirable attributes. The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Without limiting the scope of the claims, some of the advantageous features will now be summarized. Other objects, advantages and novel features of the disclosure will be set forth in the following detailed description of the disclosure when considered in conjunction with the drawings, which are intended to illustrate, not limit, the invention.

An aspect of the invention is directed to a method for manufacturing a ferromagnetic-dielectric composite material, comprising: placing patterned ferromagnetic layer regions, in a patterning substrate assembly, in physical contact with a second dielectric layer, the second dielectric layer in a receiving substrate assembly, wherein: the patterning substrate assembly includes a patterning substrate, a first carrier release layer, a first dielectric layer, and the patterned ferromagnetic layer regions, the first carrier release layer disposed between the first dielectric layer and the patterning substrate, the first dielectric layer disposed between the first carrier release layer and the patterned ferromagnetic layer regions; the receiving substrate assembly includes a receiving substrate, a second carrier release layer, and the second dielectric layer, the second carrier release layer disposed between the second dielectric layer and the receiving substrate. The method further comprises forming a bond between the patterned ferromagnetic layer regions and the second dielectric layer; releasing the patterning substrate from the patterning substrate assembly to transfer the patterned ferromagnetic layer regions and the first dielectric layer from the patterning substrate assembly to the receiving substrate assembly; and releasing the receiving substrate from the receiving substrate assembly to form the ferromagnetic-dielectric composite material.

In one or more embodiments, the method further comprises activating the first carrier release layer to detach the patterned ferromagnetic layer regions from the patterning substrate assembly. In one or more embodiments, activating the first carrier release layer comprises (a) exposing the first carrier release layer to a solvent to at least partially dissolve the first carrier release layer, (b) exposing the first carrier release layer to a light source to compromise a physical integrity of the first carrier release layer, and/or (c) heating the first carrier release layer to compromise the physical integrity of the first carrier release layer. In one or more embodiments, activating the second carrier release layer comprises (a) exposing the second carrier release layer to a solvent to at least partially dissolve the second carrier release layer, (b) exposing the second carrier release layer to a light source to compromise a physical integrity of the second carrier release layer, and/or (c) heating the second carrier release layer to compromise the physical integrity of the second carrier release layer.

In one or more embodiments, the method further comprises depositing a lift-off photoresist on the patterning substrate to form the first carrier release layer. In one or more embodiments, the method further comprises depositing the first dielectric layer on the first carrier release layer; defining a first pattern in the first dielectric layer, the first pattern comprising first dielectric layer regions and holes defined between neighboring first dielectric layer regions; defining a second pattern in the first carrier release layer according to the pattern in the first dielectric layer, the second pattern in the first carrier release layer comprising first carrier release layer regions and holes defined between neighboring first carrier release layer regions, wherein the first carrier release layer regions are aligned with the first dielectric layer regions and the holes between neighboring first carrier release layer regions are aligned with the holes between neighboring first dielectric layer regions to reveal exposed patterning substrate regions; and after defining the second pattern, depositing a ferromagnetic material on the first carrier release layer regions to form first ferromagnetic layer regions on the second dielectric layer regions and second ferromagnetic layer regions on the exposed patterning substrate regions, wherein the patterned ferromagnetic layer regions comprise the first ferromagnetic layer regions such that the first ferromagnetic layer regions are placed in physical contact with the second dielectric layer in the receiving substrate assembly. In one or more embodiments, the ferromagnetic material comprises a soft ferromagnetic material and the method further comprising applying a bias magnetic field to set an easy axis of magnetization of the soft ferromagnetic material. In one or more embodiments, releasing the patterning substrate from the patterning substrate assembly transfers the first ferromagnetic layer regions and the first dielectric layer regions from the patterning substrate assembly to the receiving substrate assembly.

In one or more embodiments, the method further comprises after releasing the patterning substrate from the patterning substrate assembly, depositing a third dielectric layer on the patterning substrate assembly to fill the holes between neighboring first dielectric layer regions and respective holes between neighboring first ferromagnetic layer regions. In one or more embodiments, the method further comprises spin-coating the third dielectric layer on the patterning substrate assembly.

In one or more embodiments, the method further comprises depositing the first dielectric layer on the first carrier release layer; depositing a ferromagnetic layer on the first dielectric layer; and defining a pattern in the ferromagnetic layer, the pattern comprising the patterned ferromagnetic layer regions and holes between neighboring ferromagnetic layer regions.

In one or more embodiments, defining a pattern in the ferromagnetic layer comprises: depositing photoresist layer on the ferromagnetic layer; defining a pattern in the photoresist layer to form photoresist layer regions and holes between neighboring photoresist layer regions, the holes revealing exposed ferromagnetic layer regions; and removing the exposed ferromagnetic layer regions.

In one or more embodiments, the first carrier release layer comprises a lift-off photoresist layer, and the method further comprises removing an edge region of the first dielectric layer to reveal exposed lift-off photoresist layer regions at an edge region of the lift-off photoresist layer.

In one or more embodiments, forming the bond between the patterned ferromagnetic layer regions and the second dielectric layer comprises heating and applying pressure to the patterned ferromagnetic layer regions and the second dielectric layer. In one or more embodiments, holes are defined between neighboring patterned ferromagnetic layer regions, and the method further comprises while heating the patterned ferromagnetic layer regions and the second dielectric layer, re-flowing the first dielectric layer and/or the second dielectric layer to fill the holes.

In one or more embodiments, the method further comprises depositing the first carrier release layer on the patterning substrate; depositing the first dielectric layer on the first carrier release layer; depositing a photoresist layer on the first dielectric layer; defining a pattern in the photoresist layer to form photoresist layer regions and holes defined between neighboring photoresist layer regions, the holes revealing exposed first dielectric layer regions; depositing a ferromagnetic layer on the patterning substrate assembly, the ferromagnetic layer comprising first ferromagnetic layer regions disposed on the photoresist layer regions and second ferromagnetic layer regions disposed on the exposed first dielectric layer regions; and exposing the remaining patterned photoresist layer regions to a solvent to remove the remaining patterned photoresist layer regions, thereby removing the first ferromagnetic layer regions, wherein the patterned ferromagnetic layer regions comprise the second ferromagnetic layer regions such that the second ferromagnetic layer regions are placed in physical contact with the second dielectric layer in the receiving substrate assembly.

In one or more embodiments, forming the bond between the patterned ferromagnetic layer regions and the second dielectric layer comprises heating and applying pressure to the second ferromagnetic layer regions and the second dielectric layer, holes are defined between neighboring second ferromagnetic layer regions, and the method further comprises while heating the second ferromagnetic layer regions and the second dielectric layer, re-flowing the first dielectric layer and/or the second dielectric layer to fill the holes.

In one or more embodiments, the method further comprises depositing the first carrier release layer on the patterning substrate; depositing the first dielectric layer on the first carrier release layer; depositing a lift-off photoresist layer on the first dielectric layer; depositing a photoresist layer on the lift-off photoresist layer; defining a first pattern in the photoresist layer to form photoresist layer regions and holes defined between neighboring photoresist layer regions; defining a second pattern in the lift-off resist layer according to the first pattern, the second pattern forming lift-off resist layer regions and holes defined between neighboring lift-off resist layer regions, wherein the lift-off resist layer regions are aligned with the photoresist layer regions and the holes between neighboring lift-off resist layer regions are aligned with the between neighboring photoresist layer regions to reveal exposed first dielectric layer regions; depositing a ferromagnetic layer on the patterning substrate assembly, the ferromagnetic layer comprising first ferromagnetic layer regions disposed on the photoresist layer regions and second ferromagnetic layer regions disposed on the exposed first dielectric layer regions; and exposing the lift-off resist layer regions to a solvent to remove the lift-off resist layer regions, thereby removing the photoresist layer regions and the first ferromagnetic layer regions, wherein the patterned ferromagnetic layer regions comprise the second ferromagnetic layer regions such that the second ferromagnetic layer regions are placed in physical contact with the second dielectric layer in the receiving substrate assembly.

In one or more embodiments, the method further comprises placing the receiving substrate assembly on a support apparatus that comprises: a body having a planar center region and an edge region, the planar region configured to support a back surface of the receiving substrate; a support ring disposed on the edge region of the body; a plurality of bolts that releasably engage the edge region of the body and the support ring; a double-sided polyimide tape disposed along the support ring; a polyimide, polymer, or ceramic film layer disposed on the receiving substrate and the double-sided polyimide tape; and a dielectric layer disposed on and covering the polyimide, polymer, or ceramic film layer.

Another aspect of the invention is directed to a method for manufacturing a ferromagnetic-dielectric composite material, comprising: (a) placing first patterned ferromagnetic layer regions, in a first patterning substrate assembly in a plurality of patterning assemblies, in physical contact with a second receiving dielectric layer, the second receiving dielectric layer in a receiving substrate assembly, wherein: each patterning substrate assembly includes a respective patterning substrate, a first respective carrier release layer, a first respective dielectric layer, and respective patterned ferromagnetic layer regions, the first respective carrier release layer disposed between the first respective dielectric layer and the respective patterning substrate, the first respective dielectric layer disposed between the first respective carrier release layer and the respective patterned ferromagnetic layer regions, and the receiving substrate assembly includes a receiving substrate, a second carrier release layer, and the second receiving dielectric layer, the second carrier release layer disposed between the second receiving dielectric layer and the receiving substrate. The method further comprises (b) forming a bond between the first patterned ferromagnetic layer regions and the second receiving dielectric layer; (c) releasing the first patterning substrate from the patterning substrate assembly to transfer the first patterned ferromagnetic layer regions and a first dielectric layer from the first patterning substrate assembly to the receiving substrate assembly; (d) placing second patterned ferromagnetic layer regions, in a second patterning substrate assembly in the plurality of patterning assemblies, in physical contact with the first dielectric layer in the receiving substrate assembly; (e) forming a bond between the second patterned ferromagnetic layer regions and the first dielectric layer; (f) releasing a second patterning substrate from the second patterning substrate assembly to transfer the second patterned ferromagnetic layer regions and the second dielectric layer from the first patterning substrate assembly to the receiving substrate assembly; and (g) releasing the receiving substrate from the receiving substrate assembly to form the ferromagnetic-dielectric composite material.

In one or more embodiments, the method further comprises repeating steps (d)-(f), prior to step (g), to form a stack of the second patterned ferromagnetic layer regions.

Another aspect of the invention is directed to a method for manufacturing a ferromagnetic-dielectric composite material. The method includes depositing a carrier release layer on a substrate; defining a pattern in the carrier release layer to form patterned carrier release layer, the patterned carrier release layer defining exposed substrate regions; depositing a first insulator layer on the patterned carrier release layer and the exposed substrate regions to form first and second isolated insulator layer regions, the first isolated insulator layer regions disposed on the patterned carrier release layer, each second isolated insulator layer region disposed on a respective exposed substrate region; depositing a ferromagnetic layer on the first insulator layer to form first and second isolated ferromagnetic layer regions, each first isolated ferromagnetic layer region disposed on a respective first isolated insulator layer region, each second ferromagnetic layer region disposed on a respective second isolated insulator layer region; depositing a second insulator layer on the ferromagnetic layer to form a third and fourth isolated insulator layer regions, each third isolated insulator layer region disposed on a respective first isolated ferromagnetic layer region, each fourth isolated insulator layer region disposed on a respective second isolated ferromagnetic layer region; exposing the carrier release layer to a solvent to release a plurality of ferromagnetic film platelets, each ferromagnetic film platelet including the respective first isolated insulator layer region, the respective first isolated ferromagnetic layer region, and a respective third isolated insulator layer region; desiccating the ferromagnetic film platelets; adding a binding material to the ferromagnetic film platelets; and forming a coupon that includes the ferromagnetic film platelets.

In one or more embodiments, the ferromagnetic film platelets are desiccated before the binding material is added. In one or more embodiments, the binding material is in a liquid form when the binding material is added to the ferromagnetic film platelets. In one or more embodiments, the method further comprises applying a bias magnetic field to align an easy axis of magnetization of the respective first isolated ferromagnetic layer region of each ferromagnetic film platelet in a liquid binding material. In one or more embodiments, the method further comprises curing the liquid binding material to form a coupon that includes a solid binding material and the ferromagnetic film platelets, the easy axes of magnetization substantially aligned with each other.

In one or more embodiments, the ferromagnetic film platelets are desiccated after the binding material is added to the ferromagnetic film platelets and the solvent. In one or more embodiments, the method further comprises applying a bias magnetic field to align an easy axis of magnetization of the respective first isolated ferromagnetic layer region of each ferromagnetic film platelet in the solvent and the binding material. In one or more embodiments, desiccating the ferromagnetic film platelets includes: evaporating the solvent; and curing the binding material, wherein the desiccating occurs while the easy axes of magnetization are substantially aligned with each other.

BRIEF DESCRIPTION OF THE DRAWINGS

For a fuller understanding of the nature and advantages of the concepts disclosed herein, reference is made to the detailed description of preferred embodiments and the accompanying drawings.

FIGS. 5A and 5B are example cross-sectional views of a ferromagnetic film platelet according to alternative embodiments.

FIGS. 7A-7L are cross-sectional views of structures formed according to certain steps of the flow chart illustrated in FIG. 6.

FIGS. 9A-9L are cross-sectional views of structures formed according to certain steps of the flow chart illustrated in FIG. 8.

FIGS. 11A-11E are cross-sectional views of structures formed according to certain steps of the flow chart illustrated in FIG. 10.

FIGS. 13A-13M are cross-sectional views of structures formed according to certain steps of the flow chart illustrated in FIG. 12.

FIGS. 18A-18J are cross-sectional views of structures formed according to certain steps of the flow chart illustrated in FIG. 17.

DETAILED DESCRIPTION

A ferromagnetic-dielectric composite material is formed using a patterning substrate assembly and a receiving substrate assembly. The patterning substrate assembly includes a patterning substrate onto which one or more ferromagnetic layer(s) have been deposited and patterned. A releasable layer is disposed between the patterned ferromagnetic layer(s) and the patterning substrate. The receiving substrate assembly includes a receiving substrate, a releasable layer disposed on the receiving substrate, and a dielectric layer disposed on the releasable layer.

The patterned ferromagnetic layer(s) in the patterning substrate assembly is/are placed into contact with the dielectric layer in the receiving substrate assembly. Pressure and/or heat are applied to the patterning and receiving substrate assemblies to form a bond between the dielectric layer and the patterned ferromagnetic layer that is in contact with the dielectric layer. After the bond is formed, the releasable layer in the patterning substrate assembly is activated to detach the patterning substrate, which transfers the patterned ferromagnetic layer(s) from the patterning substrate assembly to the receiving substrate assembly. Additional ferromagnetic layer(s) can be formed and/or transferred to the patterning substrate assembly. A dielectric layer can be deposited on the transferred ferromagnetic layer(s) to fill in the holes between the transferred ferromagnetic layer portions/regions. When all ferromagnetic layer(s) are transferred to the patterning substrate assembly, the releasable layer in the patterning substrate assembly is activated to detach the receiving substrate, to form the ferromagnetic-dielectric composite material.

The releasable layer in the patterning substrate assembly and/or the releasable layer in the receiving substrate assembly can comprise or consist of a carrier release layer, a lift-off photoresist layer, or a negative photoresist layer. The releasable layer can be activated through the application of heat, pressure, and/or force, and/or exposure to a solvent and/or light energy.

Figure 1:
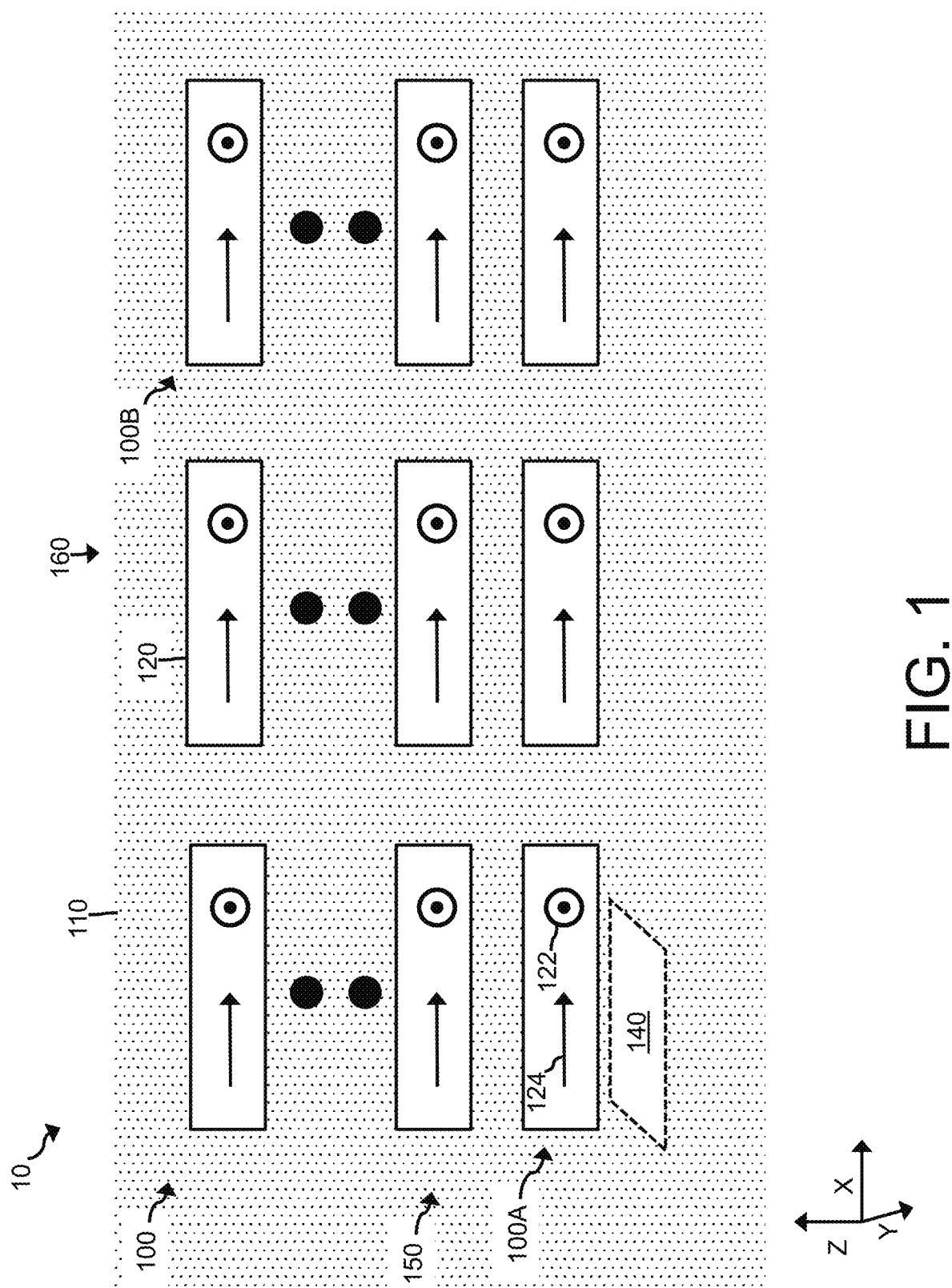
FIG. 1 is an example cross-sectional view of a ferromagnetic-dielectric composite material according to an embodiment.

FIG. 1 is an example cross-sectional view of a ferromagnetic-dielectric composite material 10 according to an embodiment. The material 10 includes a plurality of ferromagnetic film platelets 100 and a dielectric 110. The arrangement and/or alignment of the platelets 100 with respect to each other can be customized during the manufacturing of the material 10. The number of platelets 100 can also be customized during the manufacturing of the material 10.

Each platelet 100 includes one or more ferromagnetic layers 120. When the platelet 100 includes multiple ferromagnetic layers 120, the platelet 100 can include a laminate structure. A non-ferromagnetic layer, such as an insulator layer, can be disposed between some or each ferromagnetic layers 120 in the laminate structure.

The ferromagnetic layer(s) 120 can include cobalt, nickel, and/or iron, and/or a compound or alloy comprising cobalt, nickel, and/or iron. In one example, the ferromagnetic layer(s) 120 comprises a soft ferromagnetic material or layer, such as $Co_xZr_yTa_{1-x-y}$ (CZT) with x and y being about 0.915 and 0.04, respectively. In another example, the soft ferromagnetic material or layer can comprise CoZrTa-B (or CoZrTaB), CoNiFe, NiFe, CoFe, and/or CoFeB, or alloys that include any of the foregoing compounds. The soft ferromagnetic material or layer can have a magnetic coercivity of less than or equal to about 1 Oe.

Additionally or alternatively, the ferromagnetic layer(s) 120 can comprise a hard ferromagnetic material or layer, such as AlNiCo, NdFeB, SmCo, ferrite alloys of $Fe_xO_y$ that include one or more metals such as Ni, Co, Sr, and/or Ba (e.g., cobalt ferrite ($CoFe_2O_4$), and/or nickel ferrite ($NiFe_2O_4$)), and/or alloys that include any of the foregoing materials. The hard ferromagnetic material can have a remnant magnetization of at least about 0.1 T and/or a magnetic coercivity of at least about 100 Oe.

When the ferromagnetic layer(s) 120 include a soft ferromagnetic layer and a hard ferromagnetic layer, the hard and soft ferromagnetic layers can be magnetically coupled. For example, the hard ferromagnetic layer can form a permanent magnetic field that can bias adjacent/neighboring soft ferromagnetic layer(s), which in-turn can enhance the properties of the biased soft ferromagnetic layer(s).

The ferromagnetic layer(s) 120 can be magnetically anisotropic such that its easy axis of magnetization 122 is parallel to the Y axis (e.g., a first axis) and its hard axis of magnetization 124 is parallel to the X axis (e.g., a second axis that is orthogonal to the first axis). Alternatively, the easy axis of magnetization 122 can be parallel to the X axis and the hard axis of magnetization 124 can be parallel to the Y axis. The easy and hard axes 122, 124 can be permanently or semi-permanently set. The easy and hard axes 122, 124 are orthogonal to each other within the x-y plane. In addition, the easy and hard axes 122, 124 are parallel to a plane 140 that passes through and is parallel to a bottom (or top) side of the respective ferromagnetic layer 120. The plane 140 is also orthogonal to the Z axis. The easy and/or hard axes 122, 124 of each platelet 100 can be aligned or substantially aligned (e.g., within about 5°) with the respective easy and/or hard axes 122, 124 of the other platelets 100. For example, the easy and/or hard axes of magnetization 122, 124 in a first platelet 100A are aligned or substantially aligned (e.g., within about 5°) with the easy and/or hard axes of magnetization 122, 124 in the other platelets 100, such as the easy and/or hard axes of magnetization 122, 124 in a second platelet 100B.

The ferromagnetic layer(s) 120 have a thickness that can be measured along or parallel to the Z axis, which is orthogonal to the plane 140. When a platelet 100 has a different orientation with respect to a coordinate system, the thickness of the ferromagnetic layer(s) 120 can be measured with respect to another axis that is orthogonal to the plane 140. The thickness of the ferromagnetic layer 120 and/or platelet 100 can be in a range of about 100 nm to about 10 µm, including about 500 nm, about 1 µm, about 3 µm, about 5 µm, about 7 µm, about 9 µm, and any thickness or thickness range between any two of the foregoing thicknesses. The thickness of ferromagnetic layer 120 and/or platelet 100 can be measured along or parallel to the Z axis or another axis that is orthogonal to the plane 140. As used herein, "about" means plus or minus 10% of the relevant value.

The length and width of each platelet 100 can be measured along or parallel to the X axis and the Y axis, respectively. When a platelet 100 has a different orientation with respect to a coordinate system, the length and width can be measured with respect to first and second axes that are parallel to the plane 140 where the first and second axes are orthogonal to each other and to the axis used to measure the thickness of the corresponding platelet 100. Each platelet 100 can have a length in a range of about 1 µm to about 200 µm, including about 50 µm, about 100 µm, about 150 µm, and any length or length range between any two of the foregoing lengths. In addition, each platelet 100 can have a width in a range of about 1 µm to about 200 µm, including about 50 µm, about 100 µm, about 150 µm, and any width or width range between any two of the foregoing widths. The length and width of a platelet 100 can be the same or different. The length and width of the ferromagnetic layer 120 in a given platelet 100 are the same as the length and width, respectively, of that platelet 100. The ratio of the thickness of the magnetic platelet 100 to the longer of width or length, which can be referred to as a cross-sectional aspect ratio, is preferably 1:10 or greater (e.g., 1:20, 1:100, or another ratio). This aspect of the invention attenuates eddy currents, which would otherwise form in the magnetic platelet in the presence of an AC magnetic field. Eddy currents in the platelet would have larger amplitude (and thus larger energy loss) if the platelet were to have a cross-sectional aspect ratio closer to 1:1.

In a preferred embodiment, the platelets 100 are identical or substantially identical to each other. For example, the platelets 100 can comprise the same film layers (e.g., ferromagnetic layer(s) 120), materials, and dimensions. In another embodiment, the platelets 100 can have different film layers, materials, and/or dimensions. In one example, the platelets 100 include a first group of platelets having a first thickness and a second group of platelets having a second thickness where the first and second thicknesses are different. Thus, one group of platelets has a relatively large thickness and the other group has a relatively small thickness. In another example, the platelets 100 include a first group of platelets having a first length and/or width and a second group of platelets having a second length and/or width where the first and second lengths and/or widths are different. Thus, one group of platelets has a relatively large length and/or width and the other group has a relatively small length and/or width.

Figure 2:
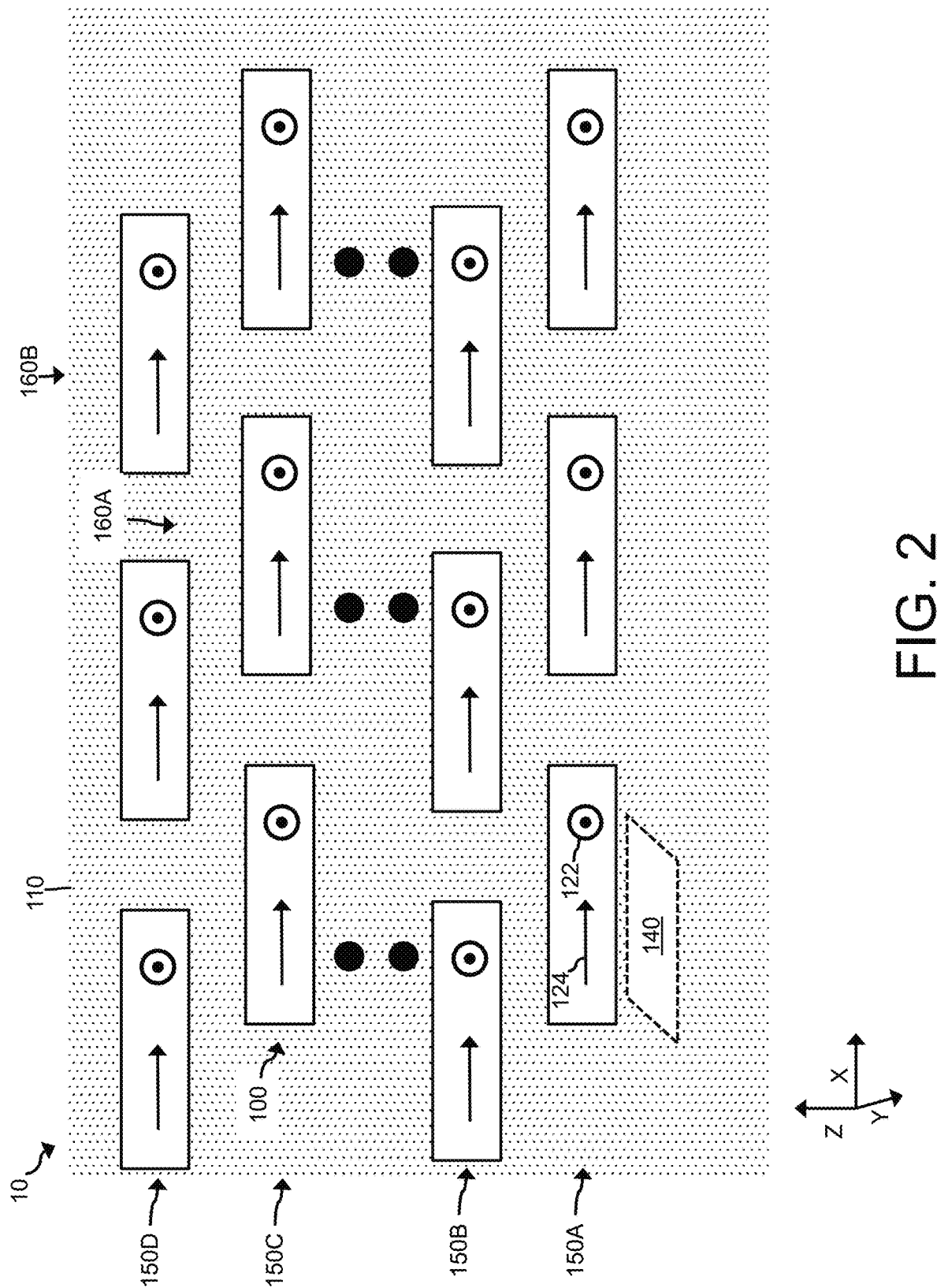
FIG. 2 is an example cross-sectional view of a ferromagnetic-dielectric composite material according to another embodiment.

As illustrated in FIG. 1, the platelets 100 are arranged in rows 150 and columns 160. Alternatively, the platelets 100 in neighboring rows 150A, 150B can be positionally offset from each other to increase the number of platelets 100 that can be included in the material 10, as illustrated in FIG. 2. For example, the platelets 100 in a first group of rows 150A, 150C can be aligned in a first group of columns, such as column 160A, and the platelets 100 in a second group of rows 150B, 150D can be aligned in a second group of columns, such as column 160B.

Figure 3:
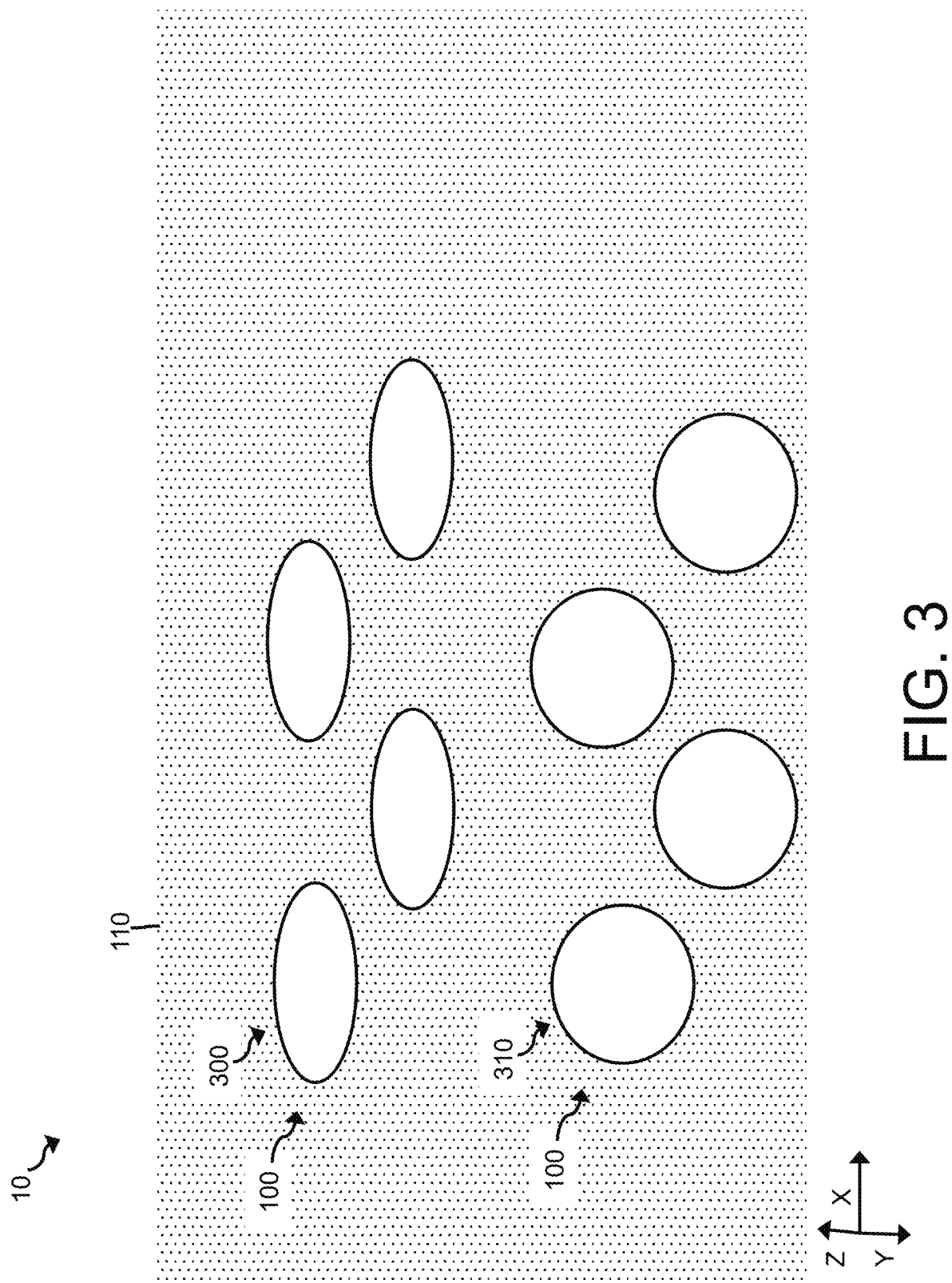
FIG. 3 is a top view of the ferromagnetic polymer composite material illustrated in FIG. 2.

In some embodiments, the platelets 100 can have a top-view shape as an ellipse 300 and/or a disk 310, for example as illustrated in FIG. 3 which is a top view of ferromagnetic polymer composite material 10 according to the embodiment illustrated in FIG. 2. The platelets 100 with the cross-sectional shape of ellipse 300 can have a three-dimensional shape of an elliptical cylinder. The platelets with the cross-sectional shape of a disk 310 can have a three-dimensional shape of a cylinder (e.g., a circular cylinder). The platelets 100 preferably have the same cross-sectional shape and/or three-dimensional shape which can allow for efficient packing of the platelets 100 in the dielectric 110. The ferromagnetic polymer composite material 10 can comprise a range of about 40% to about 99% by volume of the platelets 100 and a range of about 1% to about 60% by volume of the dielectric 110. In a preferred embodiment, the ferromagnetic polymer composite material 10 comprises about 75% to about 95% by volume of the platelets 100 and about 5% to about 25% by volume of the dielectric 110.

The platelets 100 can have a high relative magnetic permeability and/or a low magnetic coercivity. For example, the platelets 100 can have a relative magnetic permeability of about 50 to about 2,000 and/or a coercivity of less than or equal to about 1 Oe (e.g., about 0 to about 1 Oe) along the hard axis of magnetization 124.

The dielectric 110 can comprise an epoxy, a synthetic resin, acrylonitrile butadiene styrene (ABS), nitrocellulose, polyimide, polybenzoxazole (PBO), benzocyclobutene, divinylsiloxane-bis-benzocyclobutene, polytetrafluoroethylene (PTFE), polysiloxane, polydimthylsiloxane (PDMS), polymethyl-methacylate (PMMA), parylene, an aromatic polymer, and/or a photo-imageable polymer (e.g., a photo-resist). In some embodiments, the dielectric 110 can comprise a spin-on dielectric or a spin-on photoresist, which can be cured after or during deposition. In an example, the dielectric 110 can comprise a bisphenol A novolac epoxy, such as SU-8, which can function as a photoresist.

The material 10 can have a high relative magnetic permeability and/or a low magnetic coercivity. The material 10 can have a relative magnetic permeability that is approximately equal to the volume percentage of platelets 100 in the material 10 multiplied by the relative magnetic permeability of the platelets 100. For example, when the material 10 comprises 75% platelets by volume, the relative magnetic permeability of the material 10 is approximately equal to 75% multiplied by the relative magnetic permeability of the platelets 100. The magnetic coercivity of the material 10 can be approximately equal to the magnetic coercivity of the platelets 100.

Figure 4:
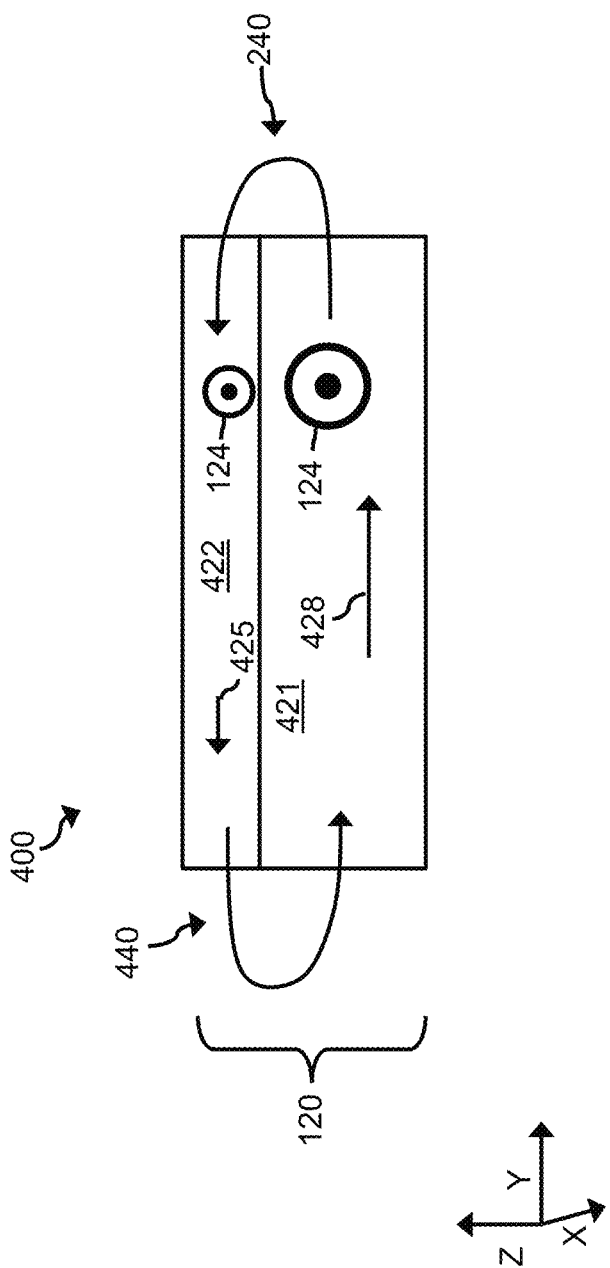
FIG. 4 is an example cross-sectional view of a ferromagnetic film platelet according to an alternative embodiment.

FIG. 4 is an example cross-sectional view of a ferromagnetic film platelet 400 according to an alternative embodiment. For illustration purposes, the cross section in FIG. 4 is orthogonal to the cross section illustrated in FIGS. 1 and 2. In this embodiment, the ferromagnetic layer(s) 120 include a soft ferromagnetic layer 421 and a hard ferromagnetic layer 422 that are magnetically coupled to each other. A spacer or insulator layer can optionally be disposed between the soft and hard ferromagnetic layers 421, 422. The spacer or insulator layer can comprise the same material or a different material than the dielectric 110. The hard ferromagnetic layer 422 can have a magnetic coercivity of at least about 100 Oe and/or a remnant magnetization of at least about 0.1 T. The soft ferromagnetic layer 421 can have a magnetic coercivity of less than or equal to about 1 Oe.

The hard ferromagnetic layer 422 is magnetically anisotropic such that its easy axis of magnetization 425 is parallel to the Y axis. In addition, the soft ferromagnetic layer 421 is magnetically anisotropic such that its easy axis of magnetization 428 is parallel to the Y axis. As such, the easy axis of magnetization 425 of the hard ferromagnetic layer 422 is parallel to (or substantially parallel to) the easy axis of magnetization 428 of the soft ferromagnetic layer 421.

The hard ferromagnetic layer 422 is magnetized to produce a bias magnetic field. The in-plane bias magnetic field flux 440, from the bias magnetic field, through the hard ferromagnetic layer 422 is in a first direction (e.g., from right to left as indicated by the arrows in FIG. 4) that is parallel to the easy axis of magnetization 425 of the hard ferromagnetic layer 422. The bias magnetic field flux 440 through the hard ferromagnetic layer 422 forms a closed bias magnetic field loop by passing through the neighboring soft ferromagnetic layer 421. The bias magnetic flux 440 through the soft ferromagnetic layer 421 is in a second direction (e.g., from left to right) that is opposite (e.g., antiparallel) to the first direction. The second direction is parallel to (or substantially parallel to) the easy axis of magnetization 428 of the soft ferromagnetic layer 421.

The cross-sectional thickness of the soft and hard ferromagnetic layers 421, 422 can be related to their saturation magnetizations. For example, the ratio of the cross-sectional thickness of the soft ferromagnetic layer 421 to the cross-sectional thickness of the hard ferromagnetic layer 422 can be equal to or about equal to $$\frac{M_{S\_soft}}{M_{S\_hard}}$$

where $M_{S\_soft}$ is the saturation magnetization of the soft ferromagnetic layer 421 and $M_{S\_hard}$ is the saturation magnetization of each hard ferromagnetic layer 422. Thus, all or substantially all of the bias magnetic field flux 440 can form a closed bias magnetic field loop, as discussed above. In some embodiments, the ratio of the cross-sectional thickness of the soft ferromagnetic layer 421 to the cross-sectional thickness of the hard ferromagnetic layer 422 is greater than or equal to about 10 (e.g., about 10 to about 1,000, about 10 to about 500, or about 10 to about 100). The cross-sectional thickness of the soft and hard ferromagnetic layer 421, 422 can be measured with respect to the Z axis in FIG. 4.

The material 10 can include platelets 400 instead of or in addition to platelets 100. The cross-sectional and three-dimensional shapes of platelet 400 can be the same as cross-sectional and three-dimensional shapes of platelet 100.

FIG. 5A is an example cross-sectional view of a ferromagnetic film platelet 500 according to an alternative embodiment. The platelet 500 can be used in place of or in addition to the platelet 100 and/or platelet 400 in the material 10. The platelet 500 includes a plurality of non-ferromagnetic layers 510, and a plurality of ferromagnetic layers 520.

Each ferromagnetic layer 520 can be the same as ferromagnetic layer 120. The ferromagnetic layers 520 can have the same thicknesses, different thicknesses, or a combination thereof. The thickness of each ferromagnetic layer can be measured along or with respect to an axis 545 that is orthogonal to a plane 540 that passes through and is parallel to the bottom surface 535 of platelet 500. The axis 545 can be the same as the Z axis or can be parallel to the Z axis. Each ferromagnetic layer 520 can have the same thickness as ferromagnetic layer 120.

The platelet 500 can have a cross-sectional aspect ratio that is the same as the cross-sectional aspect ratio of platelet 100.

One, some, or all ferromagnetic layers 520 can be magnetically anisotropic such that its/their easy axis of magnetization 522 is parallel to the Y axis and its/their hard axis of magnetization 524 is parallel to the X axis. Alternatively, the easy axis of magnetization 522 can be parallel to the X axis and the hard axis of magnetization 524 can be parallel to the Y axis. The easy and hard axes 522, 524 can be permanently or semi-permanently set. The easy and hard axes 522, 524 are orthogonal to each other within the X-Y plane. In addition, the easy and hard axes 522, 524 are parallel to plane 540. The easy and hard axes 522, 524 of each ferromagnetic layer 520 can be aligned or substantially aligned (e.g., within 5°) with the respective easy and hard axes 522, 524 of the other ferromagnetic layers 520.

Each non-ferromagnetic layer 510 is disposed between a neighboring pair 550 of ferromagnetic layers 520. Each non-ferromagnetic layer 510 can function as an electrical insulator layer and/or a diffusion barrier (e.g., with respect to the neighboring ferromagnetic layers). Each non-ferromagnetic layer 510 can comprise the same material or a different material than dielectric 110. In some embodiments, each ferromagnetic layer 510 can comprise aluminum, chromium, cobalt, silicon, tantalum, titanium, silicon, and/or zirconium. In some embodiments, each non-ferromagnetic layer 510 can comprise an alloy or compound that includes aluminum, chromium, cobalt, silicon, tantalum, titanium, silicon, and/or zirconium. For example, each non-ferromagnetic layer 510 can comprise a compound that includes (a) oxygen and/or nitrogen and (b) aluminum, chromium, cobalt, silicon, tantalum, titanium, silicon, and/or zirconium. Specific examples of diffusion barriers can comprise tantalum, chromium, and/or aluminum. The non-ferromagnetic layers 510 can comprise the same or different materials.

The non-ferromagnetic layers 510 can have the same thicknesses, different thicknesses, or a combination thereof. Each non-ferromagnetic layer 510 can have a thickness of about 2 nm to about 200 nm, including about 10 nm, about 25 nm, about 50 nm, about 75 nm, about 100 nm, about 125 nm, about 150 nm, about 175 nm, and any thickness or thickness range between any two of the foregoing thicknesses. The thickness of each non-ferromagnetic layer 510 can be measured along or with respect to axis 545.

In some embodiments, one, some, or all of the non-ferromagnetic layers 510 can be formed by heating the respective ferromagnetic layer(s) 520 in an oxygen environment to form a native oxide layer (e.g., a native oxide of the ferromagnetic layer(s) 520.

The cross-sectional and three-dimensional shapes of platelet 500 can be the same as cross-sectional and three-dimensional shapes of platelet 100. In addition, the overall or total thickness of platelet 500 can be in a range of about 200 nm to about 15 µm. The thickness of each platelet 500 can be measured along axis 545.

The length and width of platelet 500 can be measured along or parallel to the X axis and the Y axis, respectively. The length and width of platelet 500 can also be measured with respect to first and second axes that are parallel to the plane 540 where the first and second axes are orthogonal to each other and to axis 545. The length and width of platelet 500 can be the same as the length and width, respectively, of platelet 100. The lengths and widths of the non-ferromagnetic layers 510 and ferromagnetic layers 520 are the same as the length and width, respectively, of platelet 500.

The platelet 500 can have a high magnetic permeability and/or a low magnetic coercivity. The relative magnetic permeability and/or the magnetic coercivity of platelet 500 can be the same as the relative magnetic permeability and/or the magnetic coercivity of platelet 100, respectively.

Ferromagnetic layers 520 can be soft magnetic layers or hard magnetic layers, and a platelet 500 can include both soft and hard ferromagnetic layers. The hard ferromagnetic layer(s) form a permanent magnetic field that can bias adjacent/neighboring soft ferromagnetic layer(s), which in-turn can enhance the properties of the biased soft ferromagnetic layer(s). In addition, the hard ferromagnetic layer(s) increase the remanence magnetization of the platelet, which improves the ability to align the platelet to an external magnetic field.

FIG. 5B is an example cross-sectional view of a ferromagnetic film platelet 500 according to an alternative embodiment. For illustration purposes, the cross section in FIG. 5B is orthogonal to the cross section illustrated in FIG. 5A. In this embodiment, each ferromagnetic layer 520 includes a soft ferromagnetic layer 5021 and a hard ferromagnetic layer 5022 that are magnetically coupled to each other. A spacer or insulator layer can optionally be disposed between the soft and hard ferromagnetic layers 5021, 5022 in each ferromagnetic layer 520. The spacer or insulator layer can comprise the same material as the dielectric 110. A non-ferromagnetic layer 510 is disposed between adjacent ferromagnetic layers 520. The hard ferromagnetic layer 5022 is magnetically anisotropic such that its easy axis of magnetization 5025 is parallel to the Y axis. In addition, the soft ferromagnetic layer 5021 is magnetically anisotropic such that its easy axis of magnetization 522 is parallel to the Y axis. As such, the easy axis of magnetization 5025 of the hard ferromagnetic layer 5022 is parallel to the easy axis of magnetization 522 of the soft ferromagnetic layer 5021.

The hard ferromagnetic layer 5022 is magnetized to produce a bias magnetic field. The in-plane bias magnetic field flux 5040, from the bias magnetic field, through the hard ferromagnetic layer 5022 is in a first direction (e.g., from right to left as indicated by the arrows in FIG. 5B) that is parallel to the easy axis of magnetization 5025 of the hard ferromagnetic layer 5022. The bias magnetic field flux 5040 through the hard ferromagnetic layer 5022 forms a closed bias magnetic field loop by passing through the neighboring soft ferromagnetic layer 5021. The bias magnetic flux 5040 through the soft ferromagnetic layer 5021 is in a second direction (e.g., from left to right) that is opposite (e.g., antiparallel) to the first direction. The second direction is parallel to the easy axis of magnetization 522 of the soft ferromagnetic layer 5021.

The cross-sectional thickness of the soft and hard ferromagnetic layers 5021, 5022 can be related to their saturation magnetizations. For example, the ratio of the cross-sectional thickness of the soft ferromagnetic layer 5021 to the cross-sectional thickness of the hard ferromagnetic layer 5022 can be equal to or about equal to $M_{S\_soft}/M_{S\_hard}$ where $M_{S\_soft}$ is the saturation magnetization of the soft ferromagnetic layer 5021 and $M_{S\_hard}$ is the saturation magnetization of each hard ferromagnetic layer 5022. Thus, all or substantially all of the bias magnetic field flux 5040 can form a closed bias magnetic field loop, as discussed above. In some embodiments, the ratio of the cross-sectional thickness of the soft ferromagnetic layer 5021 to the cross-sectional thickness of the hard ferromagnetic layer 5022 is greater than or equal to (e.g., 10 to 1,000, 10 to 500, or 10 to 100). The cross-sectional thickness of the soft and hard ferromagnetic layers 5021, 5022 can be measured with respect to the axis 545.

The soft and/or hard ferromagnetic layers 5021, 5022 can be the same as soft and/or hard ferromagnetic layers 421, 422, respectively.

Figure 6:
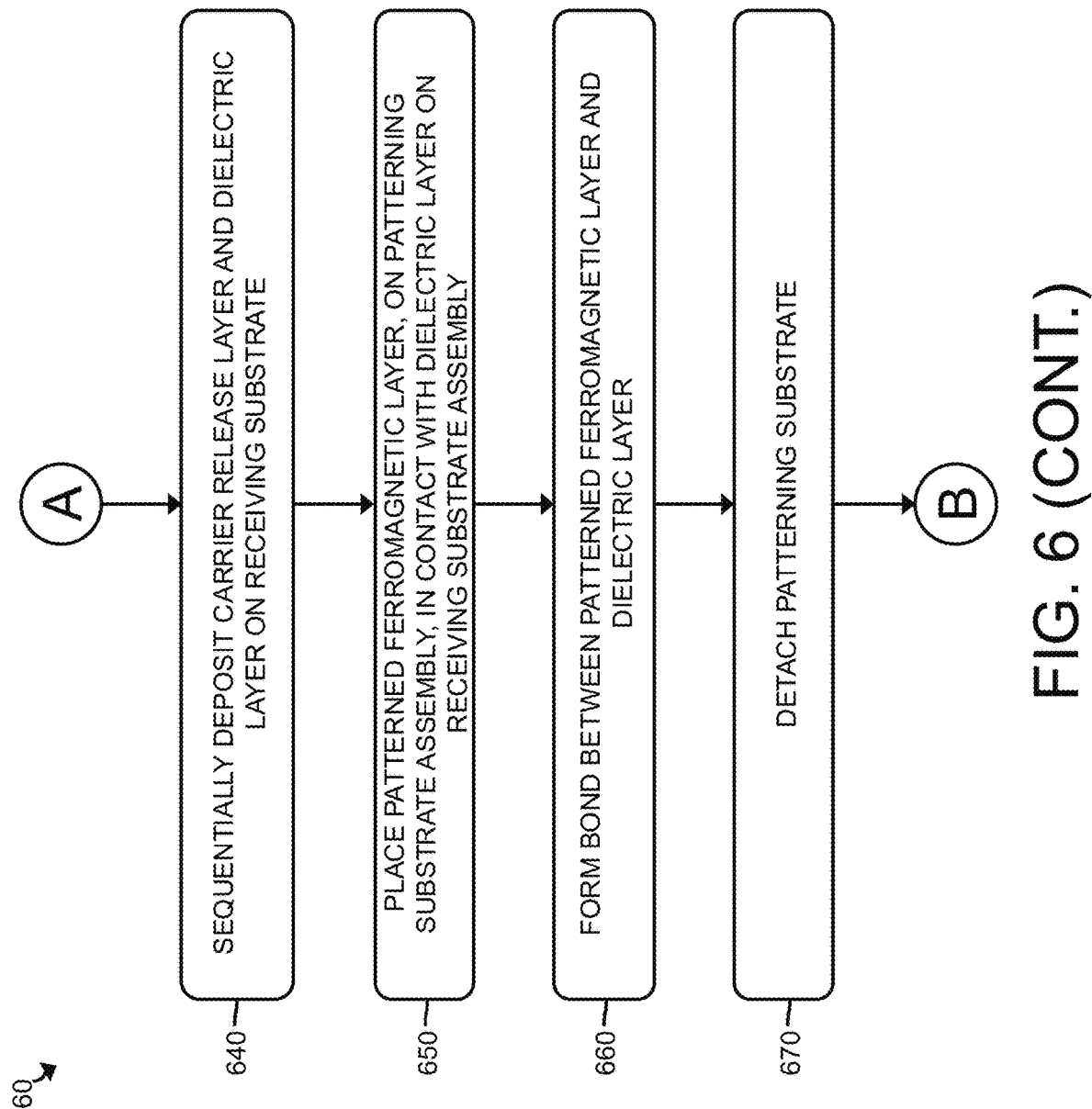
FIG. 6 is a flow chart of a method for manufacturing a ferromagnetic-dielectric composite material according to an embodiment.
Figure 6:
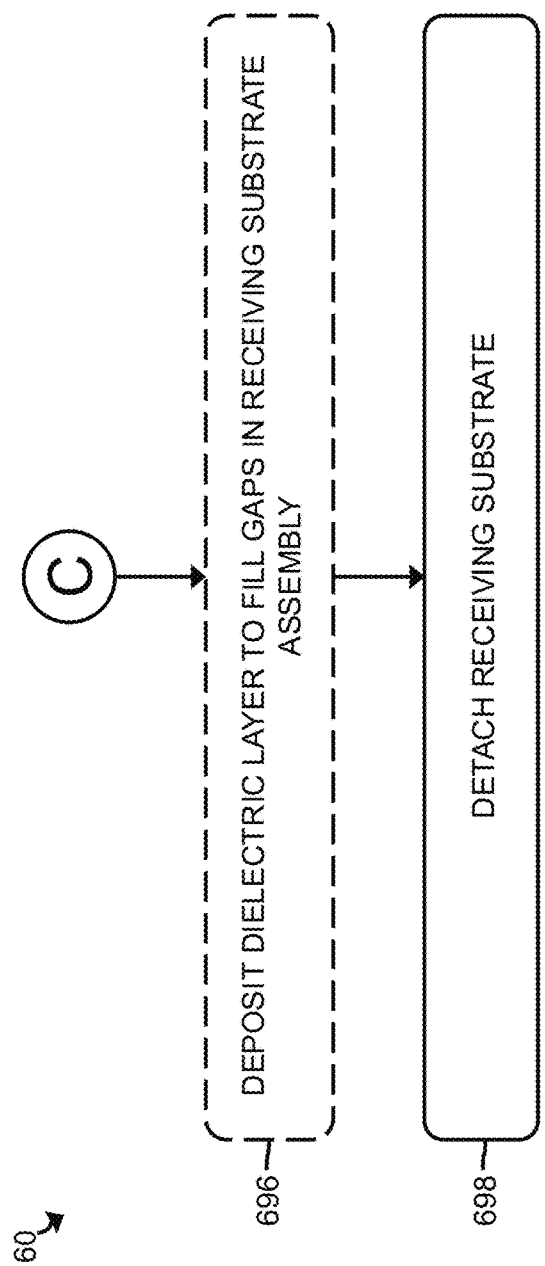

FIG. 6 is a flow chart of a method 60 for manufacturing a ferromagnetic-dielectric composite material according to an embodiment. Method 60 can be used to manufacture material 10.

In step 600, a carrier release layer and an insulator or dielectric layer (in general, dielectric layer) are sequentially deposited on a patterning substrate (e.g., a first substrate). The carrier release layer is deposited on the patterning substrate and the dielectric layer is deposited on the carrier release layer. In some embodiments, the dielectric layer is optional.

Figure 7A:
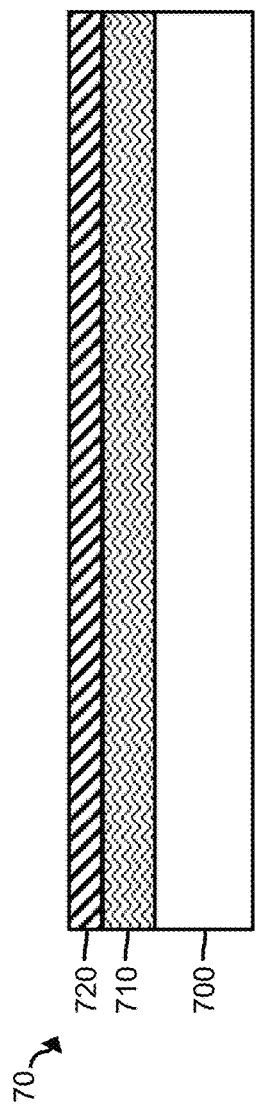

An example cross-sectional view of a patterning substrate assembly 70 that includes a patterning substrate 700, a carrier release layer 710, and a dielectric layer 720 formed according to step 600 is illustrated in FIG. 7A.

The patterning substrate 700 can comprise silicon, quartz, glass (e.g., silicon dioxide), or a ceramic. The patterning substrate 700 can be optically transparent to one or more wavelengths of light.

The carrier release layer 710 comprises a material that can form a temporary bond to the receiving substrate 700. The material can include laminations to provide films having different properties. The carrier release layer 710 can be activated to release the temporary bond by exposing the carrier release layer 710 to a solvent, exposing the carrier release layer 710 to light, heating the carrier release layer 710, and/or applying pressure or force to the carrier release layer 710. An example of a carrier release film that can be released by exposure to light is 3M™ OneFilm WSS Semiconductor Temporary Bonding Film Series, which can be released by ultraviolet and/or infrared light (e.g., laser). When the carrier release film is released by exposure to certain wavelengths of light, the patterning substrate 700 can be optically transparent to some or all of those wavelengths of light. An example of a carrier release film that can be released by applying a force is a double-sided polyimide tape. An example of a carrier release film that can be released by exposure to a solvent is a lift-off resist.

The dielectric layer 720 can comprise or consist of an electrically-insulating polymer such as PMMA, polyimide, and/or a photoresist such as SU-8. In some embodiments, the dielectric layer 720 is optional.

In step 610, a pattern is defined in the carrier release layer and the dielectric layer. For example, the dielectric layer can be patterned through photolithography and the patterned dielectric layer can be used to remove (e.g., etch) the underlying carrier release layer. The patterning substrate assembly can be heated to a range of about 100° C. to about 300° C. for about 5 minutes to about 50 minutes during this step.

Figure 7B:
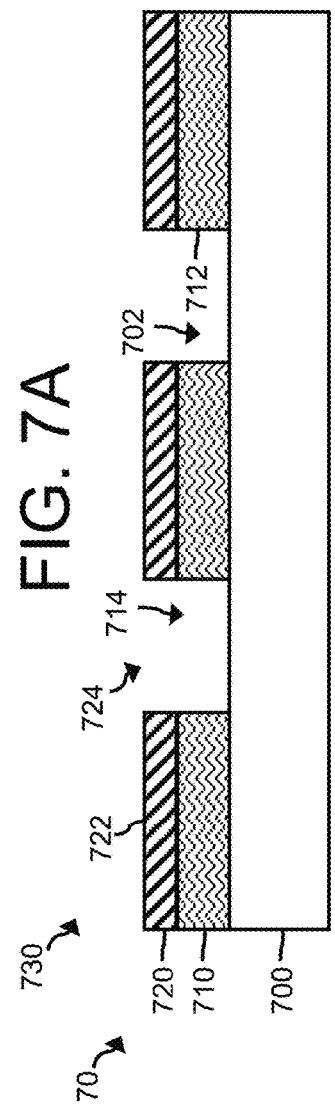

FIG. 7B is an example cross-sectional view of the patterning substrate assembly 70 having a pattern 730 formed according to step 610. The pattern 730 is first defined in the dielectric layer 720 to form isolated dielectric layer regions 722 and voids 724 between adjacent or neighboring isolated dielectric layer regions 722. The pattern 730 is then applied to the carrier release layer 710 by removing (e.g., etching) the exposed carrier release layer 710 beneath the voids 724. The pattern 730 applied to the carrier release layer 710 forms isolated carrier release layer regions 712 and voids 714 between adjacent or neighboring isolated carrier release layer regions 712. As such, the voids 714 are aligned with the voids 724 and the isolated carrier release layer regions 712 are aligned with the isolated dielectric layer regions 722. The aligned voids 714, 724 define exposed patterning substrate regions 702.

In step 620, one or more ferromagnetic layer(s) is/are deposited on the patterning substrate assembly formed in step 610. When more than one ferromagnetic layer is deposited, a non-ferromagnetic layer, such as an insulator layer, can be deposited between some or all neighboring ferromagnetic layers.

Figure 7C:
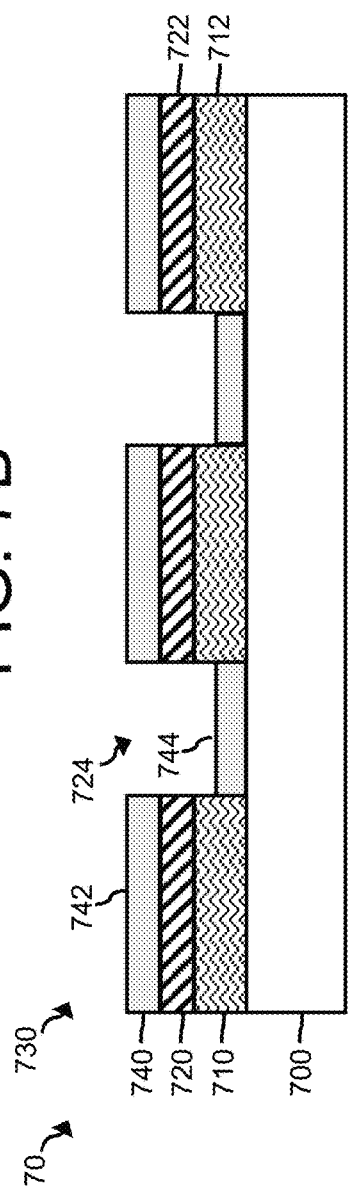

FIG. 7C is an example cross-sectional view of the patterning substrate assembly 70 having an example ferromagnetic layer 740 deposited thereon. The ferromagnetic layer 740 is deposited and formed on the isolated dielectric layer regions 722 and the exposed patterning substrate regions 702. The portions of the ferromagnetic layer 740 deposited on the isolated dielectric layer regions 722 form first isolated ferromagnetic layer regions 742. The portions of the ferromagnetic layer 740 deposited on the exposed patterning substrate regions 702 form second isolated ferromagnetic layer regions 744. The first and second isolated ferromagnetic layer regions 742, 744 are formed and/or defined according to the pattern 730.

In optional step 630, a bias magnetic field is applied during or after the ferromagnetic deposition step 620. The bias magnetic field can permanently or semi-permanently set the easy axis of magnetization of the ferromagnetic layer in a direction parallel to the bias magnetic field. Permanently or semi-permanently setting the direction of the easy axis of magnetization can permanently or semi-permanently set the direction of the hard axis of magnetization in a direction orthogonal to the easy axis of magnetization in the major plane of the ferromagnetic layer. When the bias magnetic field is applied after the ferromagnetic deposition step 620, the bias magnetic field can be applied while heating or annealing the patterning substrate assembly 70 in the form of a magnetic anneal at a temperature of about 200° C. to about 340° C. with a magnetic field of about 0.1 Tesla to about 1.5 Tesla and a duration of about 10 to about 200 minutes. The structure can be heated or annealed in an oven or can be placed near a heat source. The bias magnetic field can be a DC magnetic field. The magnetic field applied during deposition of the ferromagnetic layer(s) can have the same magnitude and duration as the magnetic field applied during the magnetic anneal.

FIG. 7D is an example cross-sectional view of the patterning substrate assembly 70 including the ferromagnetic layer 740 while applying an optional bias magnetic field 745. The easy axis of magnetization 751 of the ferromagnetic layer 740 is permanently or semi-permanently aligned with the axis of the bias magnetic field 745. Aligning the easy axis of magnetization 751 with the axis of the bias magnetic field induces the hard axis of magnetization 752 of the ferromagnetic layer 740 to be aligned in a direction orthogonal to the easy axis of magnetization 751 within the major plane of the ferromagnetic layer 740. For example, the major plane of the ferromagnetic layer 740 is parallel to the top surface 701 of the patterning substrate 700.

In step 640 (via placeholder A), a carrier release layer and a dielectric layer are sequentially deposited on a receiving substrate (e.g., a second substrate). The carrier release layer is deposited on the receiving substrate and the dielectric layer is deposited on the carrier release layer. The carrier release layer and/or the dielectric layer deposited in step 630 can be the same or different than the carrier release layer and/or the dielectric layer, respectively, deposited in step 600.

An example cross-sectional view of a receiving substrate assembly 72 that includes a receiving substrate 760, a carrier release layer 770, and a dielectric layer 780 formed according to step 640 is illustrated in FIG. 7E. The receiving substrate 760, the carrier release layer 770, and the dielectric layer 780 can be the same as or different than the patterning substrate 700, the carrier release layer 710, and the dielectric layer 720, respectively.

In step 650, the patterned ferromagnetic layer on the patterning substrate assembly is placed in contact (e.g., direct physical contact) with the exposed dielectric layer on the receiving substrate assembly.

FIG. 7F is an example cross-sectional view of the structure formed in step 650. The patterning substrate assembly 70 in FIG. 7F has been flipped upside down compared to the patterning substrate assembly 70 in FIGS. 7A-7D. After the patterning substrate assembly 70 is rotated vertically by 180 degrees, the patterning substrate assembly 70 and the receiving substrate assembly 72 are moved towards each other so that the first isolated ferromagnetic layer regions 742 in the patterning substrate assembly 70 are in contact (e.g., direct physical contact) with the dielectric layer 780 in the receiving substrate assembly 72.

In step 660, a bond is formed between the patterned ferromagnetic layer on the patterning substrate assembly and the dielectric layer on the receiving substrate assembly. The bond can be formed by applying pressure to the patterning and receiving substrate assemblies 70, 72 and/or by heating the patterning and receiving substrate assemblies 70, 72. For example, pressure in the range of about 0.1 MPa to about 30 MPa, including about 1 MPa, about 10 MPa, about 15 MPa, about 20 MPa, about 25 MPa, or another pressure between any two of the foregoing pressures can be applied to the patterning and receiving substrate assemblies 70, 72. In another embodiment, a different pressure can be applied. The pressure can be applied for about 1 minute to about 90 minutes, including about 2 minutes, about 5 minutes, about 15 minutes, about 30 minutes, about 40 minutes, about 50 minutes, about 60 minutes, about 70 minutes, about 80 minutes, or another time or time range between any two of the foregoing times. The patterning and receiving substrate assemblies 70, 72 can be heated during, after, or before the pressure is applied. In an embodiment, the patterning and receiving substrate assemblies 70, 72 can be heated to a range of about 100° C. to about 300° C., including about 150° C., about 200° C., about 250° C., or another temperature or temperature range between any two of the foregoing times. An optional vacuum (e.g., less than or equal to about 10 µTorr) can be applied during step 660 to remove or reduce the number of voids at the bonding interface.

In some embodiments, dielectric layers 720 and/or 780 can be replaced with a native oxide of the ferromagnetic layer 740. The native oxide can be formed by heating the ferromagnetic layer 740 in an oxygen-rich environment while the ferromagnetic layer 740 is on the patterning substrate assembly 70 or on the receiving substrate assembly 72.

In step 670, the patterning substrate is detached from the patterning substrate assembly. The patterning substrate is detached by activating the carrier release layer in the patterning substrate assembly, such as by exposing the carrier release layer to a solvent, exposing the carrier release layer to light, heating the carrier release layer, and/or applying pressure or force to the carrier release layer. Activating the carrier release layer can cause its physical integrity to decrease, which can reduce the bond or adhesion between the carrier release layer and the patterning substrate and/or between the carrier release layer and the dielectric layer.

FIG. 7G is an example cross-sectional view of the structure formed in step 670. In this example cross-sectional view, the carrier release layer 710 has been removed by exposing the carrier release layer 710 to a solvent. As a result, the remainder of the patterning substrate assembly 70 (i.e., the patterning substrate 700, the second isolated ferromagnetic layer regions 744, and any remaining portions of the carrier release layer 710) is detached from the receiving substrate assembly 72. When the patterning substrate assembly 70 is detached from the receiving substrate assembly 72, the dielectric layer 720 and the ferromagnetic layer(s) 740 are transferred from the patterning substrate assembly 70 to the receiving substrate assembly 72.

Figure 7H:
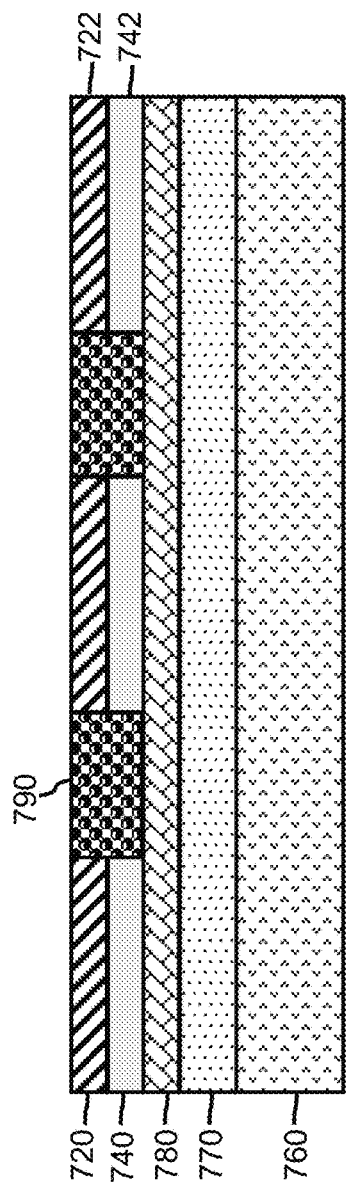

In optional step 680 (via placeholder B), a dielectric layer is deposited on the receiving substrate assembly after the patterning substrate is detached from the receiving substrate assembly. The dielectric layer 790 can fill in the gaps, holes, or voids 724 between neighboring isolated dielectric layer regions 722 and the gaps, holes, or voids 746 between neighboring first isolated ferromagnetic layer regions 742, as illustrated in FIG. 7H. The dielectric layer 790 can be the same or different than the dielectric layer 720 and/or the dielectric layer 780. In one example, the dielectric layer 790 can be deposited by spin-on application, which can also planarize the dielectric layer 790. The spin-on dielectric can be cured after or during deposition. Alternatively, the dielectric layer 790 can be planarized in a separate processing step. The dielectric layer 790 can optionally be deposited on the dielectric layer 720. The dielectric layer 790 can improve the mechanical strength and/or stability of the receiving substrate assembly 72 and/or can improve adhesion or bonding to an additional ferromagnetic layer.

In another embodiment, the dielectric layer 790 can reflow during step 660 to fill the holes 746.

If additional ferromagnetic layer(s) are to be formed on or transferred to the receiving substrate assembly (i.e., step 690=yes), the method 60 proceeds to step 692. In step 692, one or more additional ferromagnetic layer(s) are formed on a new patterning substrate (e.g., in a new patterning substrate assembly) in the same manner as in steps 600-630. The ferromagnetic layer(s) formed on the new patterning substrate assembly are then bonded and transferred to the receiving substrate assembly in the same manner as in steps 650-670. Alternatively, the new patterning substrate can be prefabricated in which case step 692 only includes bonding and transferring the additional ferromagnetic layer(s) to the receiving substrate assembly, which can be performed in the same manner as steps 650-670. In some embodiments, a total of 2 to 100 ferromagnetic layer(s) or another number of ferromagnetic layer(s) can be formed or transferred to the receiving substrate assembly.

In some embodiments, the first isolated ferromagnetic layer regions 742 in the new patterning substrate assembly can be placed directly over the first isolated ferromagnetic layer regions 742 in the receiving substrate assembly or they can be offset with respect to each other, which can increase the packing density of ferromagnetic layers on the receiving substrate assembly. One or more alignment structures can be formed on the receiving substrate assembly and/or on the patterning substrate assembly, which can be used by optics systems to align or offset the first isolated ferromagnetic layer regions 742 with respect to each other.

Figure 7I:
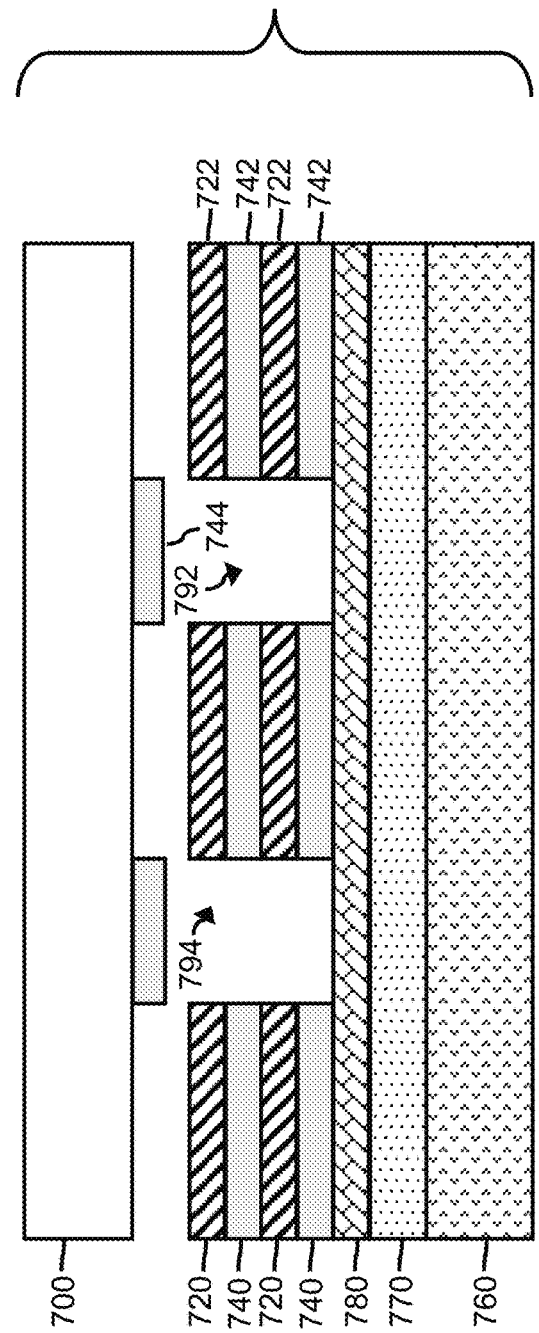

FIG. 7I is an example cross-sectional view of the structure formed in step 692 where the optional dielectric layer 790 was not deposited in optional step 680.

In optional step 694, a dielectric layer is deposited on the receiving substrate assembly after the new patterning substrate is detached from the receiving substrate assembly to fill the gaps in the receiving substrate assembly. Optional step 694 can be performed in the same manner as optional step 680.

After optional step 694, the method returns to step 690. This process can proceed in a loop with steps 692 and 694 repeated until the desired number of ferromagnetic layer(s) are formed on the receiving substrate assembly.

If no additional ferromagnetic layer(s) are to be formed on the receiving substrate assembly (i.e., step 690=no), the method 60 proceeds to optional step 696 (via placeholder C). In optional step 696, a dielectric layer is deposited on the receiving substrate assembly to fill any voids, holes, or gaps in the receiving substrate assembly. FIG. 7J is an example cross-sectional view of the structure formed in step 696 where the dielectric layer 790 fill the gaps, holes, or voids 792 between neighboring isolated structures 794 (FIG. 7I) of dielectric and ferromagnetic layers.

In step 698, the receiving substrate is detached from the receiving substrate assembly. The receiving substrate is detached by activating the carrier release layer in the receiving substrate assembly, such as by exposing the carrier release layer to a solvent, exposing the carrier release layer to light, heating the carrier release layer, and/or applying pressure or force to the carrier release layer. Activating the carrier release layer can cause its physical integrity to decrease, which can reduce the bond or adhesion between the carrier release layer and the receiving substrate and/or between the carrier release layer and the neighboring dielectric layer.

Figure 7L:
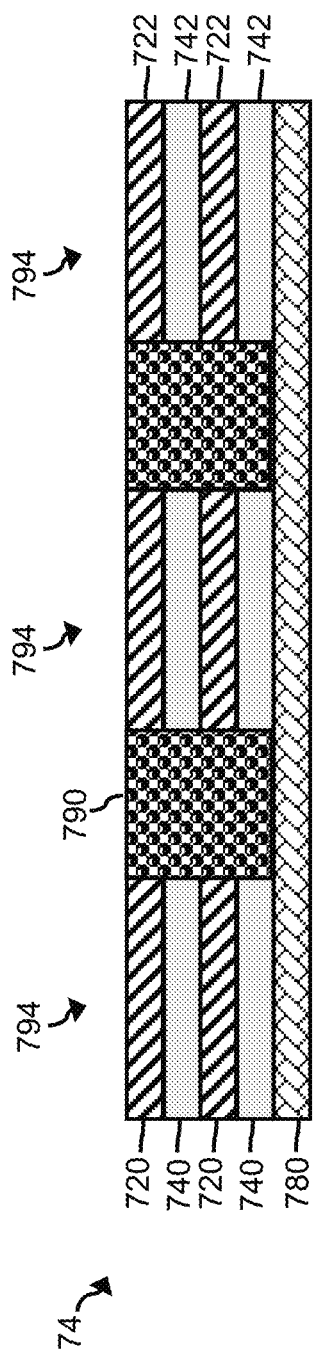

FIG. 7K is an example cross-sectional view of the structure formed in step 698 where the receiving substrate assembly 72 had the same structure as in FIG. 7J prior to detaching the receiving substrate 760 from the receiving substrate assembly 72. After the receiving substrate 760 is detached and removed, a ferromagnetic-dielectric composite material 74 is formed, as illustrated in FIG. 7L. The ferromagnetic-dielectric composite material 74 includes dielectric layers and/or dielectric regions 780, 720, 722, and 794, and first isolated ferromagnetic layer regions 742. Depending on how the ferromagnetic-dielectric composite material 74 is formed, the ferromagnetic-dielectric composite material 74 can include additional or fewer rows of first isolated ferromagnetic layer regions 742. The easy axes of magnetization 751 can be aligned in the first isolated ferromagnetic layer regions 742. In addition, the hard axes of magnetization 752 can be aligned in the first isolated ferromagnetic layer regions 742. The ferromagnetic-dielectric composite material 74 can be the same as ferromagnetic-dielectric composite material 10.

In an alternative embodiment, only a carrier release layer is deposited in step 600 and a dielectric layer (e.g., dielectric layer 720) is not deposited in step 600. In some embodiments, multiple first isolated ferromagnetic layer regions 742 can be deposited on the patterning substrate assembly with a non-ferromagnetic layer (e.g., non-ferromagnetic layer 510) disposed between neighboring first isolated ferromagnetic layer regions 742. The first isolated ferromagnetic layer regions 742 are released from the patterning substrate assembly (i.e., without being transferred to the receiving substrate assembly) by exposing the carrier release layer 710 to a solvent. The combined solvent and loose platelets (e.g., first isolated ferromagnetic layer regions 742) are dispensed into a mold and the solvent is then removed (e.g., by evaporation). During this solvent removal process, a biasing magnetic field is applied to the mold to align the platelets and set the easy axis of the composite. Prior to the solvent removal a thermoplastic binding agent such as divinylsiloxane-bis-benzocyclobutene (DVS-bis-BCB, or BCB), such as bis-benzocyclobutene (BCB), or PMMA, or an epoxy may be added to the solvent to disperse it throughout the coupon, or these same bonding materials may be added to the platelets following desiccation to bond them into a coupon. Following desiccation and the addition of a bonding agent, the coupon can be compressed to a controlled thickness through the application of a temperature between about 90° C. and about 400° C. (including any value or range between these temperatures), and a pressure between about 1 MPa and about 1 GPa (including any value or range between these pressures), depending on the glass temperature of the binding agent and the desired final sample thickness.

Figure 8:
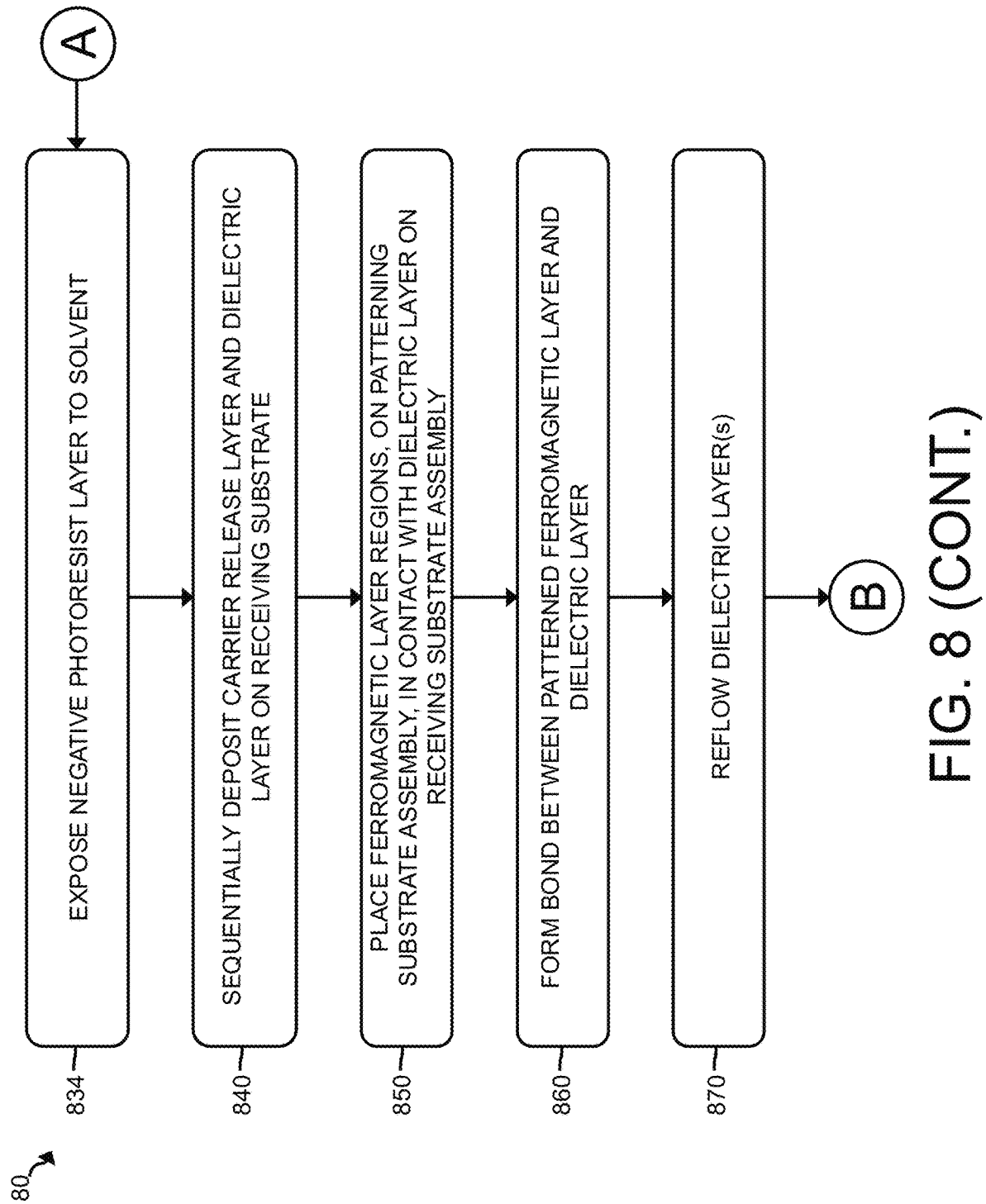
FIG. 8 is a flow chart of a method for manufacturing a ferromagnetic-dielectric composite material according to another embodiment.
Figure 8:
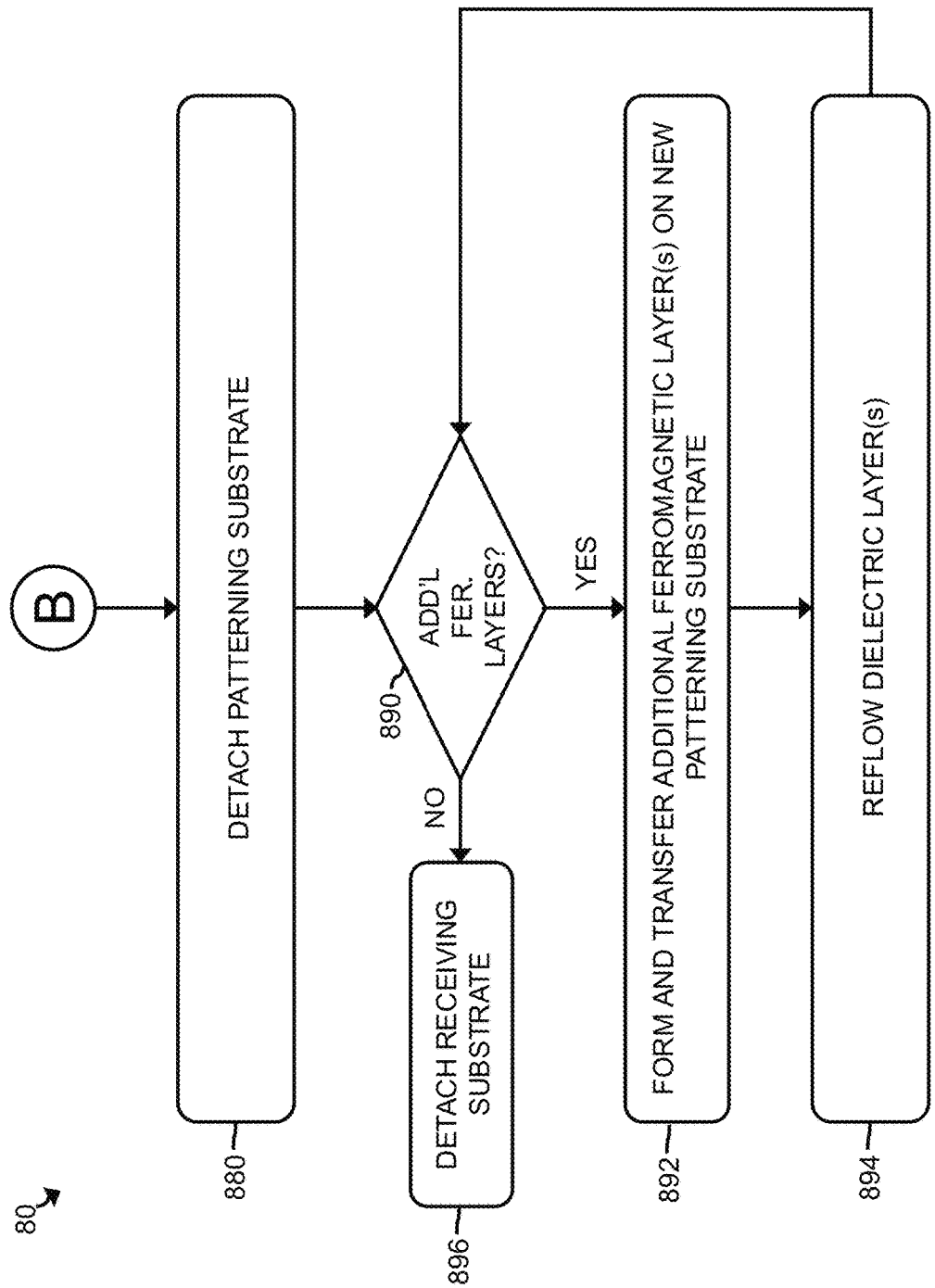

FIG. 8 is a flow chart of a method 80 for manufacturing a ferromagnetic-dielectric composite material according to another embodiment. Method 80 can be used to manufacture material 10.

In step 800, a carrier release layer and a dielectric layer are sequentially deposited on a patterning substrate. The carrier release layer is deposited on the patterning substrate and the dielectric layer is deposited on the carrier release layer. Step 800 can be the same as step 600.

An example cross-sectional view of a patterning substrate assembly 90 that includes a patterning substrate 900, a carrier release layer 910, and a dielectric layer 920 formed according to step 600 is illustrated in FIG. 9A. The patterning substrate 900, the carrier release layer 910, and the dielectric layer 920 can be the same as the patterning substrate 700, the carrier release layer 710, and/or the dielectric layer 720, respectively.

In step 810, a photoresist layer is deposited on the dielectric layer. An example cross-sectional view of the patterning substrate assembly 90 including the patterned photoresist layer 930 is illustrated in FIG. 9B. The photoresist layer can include a negative photoresist or a positive photoresist.

In step 820, a negative pattern is defined in the photoresist layer. The pattern can be defined through photolithography and development of the photoresist layer.

FIG. 9C is an example cross-sectional view of the patterning substrate assembly 90 formed in step 820. The photoresist layer 930 is formed into a pattern 940 of isolated photoresist layer regions 932 that have not been exposed to light during photolithography. Gaps or holes 934 are formed between adjacent or neighboring isolated photoresist layer regions 932. The gaps or holes 934 reveal exposed dielectric layer regions 922.

In step 830, one or more ferromagnetic layer(s) is/are deposited onto the patterned photoresist layer. When more than one ferromagnetic layer is deposited, a non-ferromagnetic layer, such as an insulator layer, can be deposited between some or all neighboring ferromagnetic layers. Step 830 can be the same as step 620.

Figure 9D:
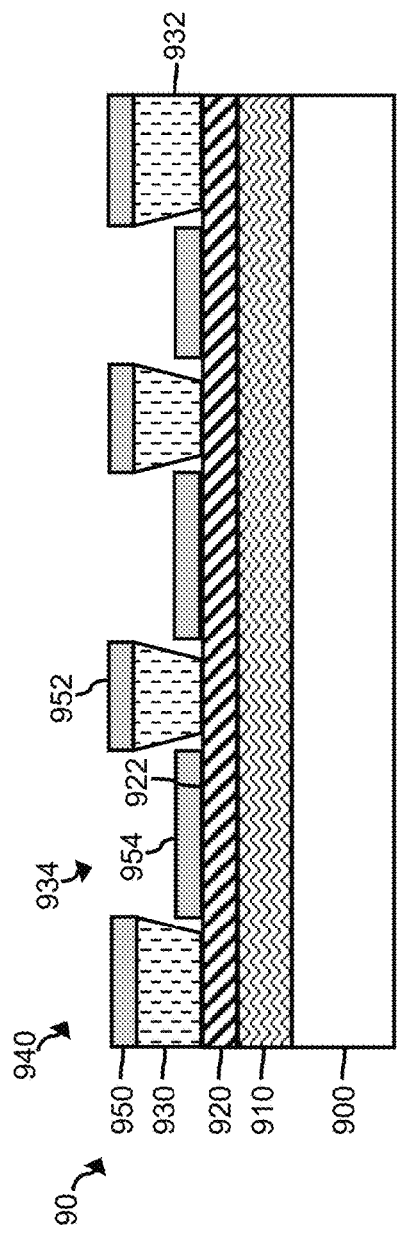

FIG. 9D is an example cross-sectional view of the patterning substrate assembly 90, including the ferromagnetic layer(s) 950, formed in step 830. The ferromagnetic layer(s) 950 include ferromagnetic layer(s) regions 952 that are deposited on the isolated photoresist layer regions 932 and ferromagnetic layer(s) regions 954 that are deposited on the exposed dielectric layer regions 922 in the gaps or holes 934. As such, the ferromagnetic layer(s) 950 conform to the pattern 940.

In optional step 832, a bias magnetic field is applied during or after the ferromagnetic deposition step 830 to set the easy axis or magnetization in a direction parallel to the bias magnetic field, which can set the hard axis of magnetization in a direction orthogonal to the bias magnetic field in the major plane of the ferromagnetic layer. Step 832 can be the same as step 630. A cross-sectional illustration of this step would appear the same or similar to as structure 70 in FIG. 7D.

Figure 9E:
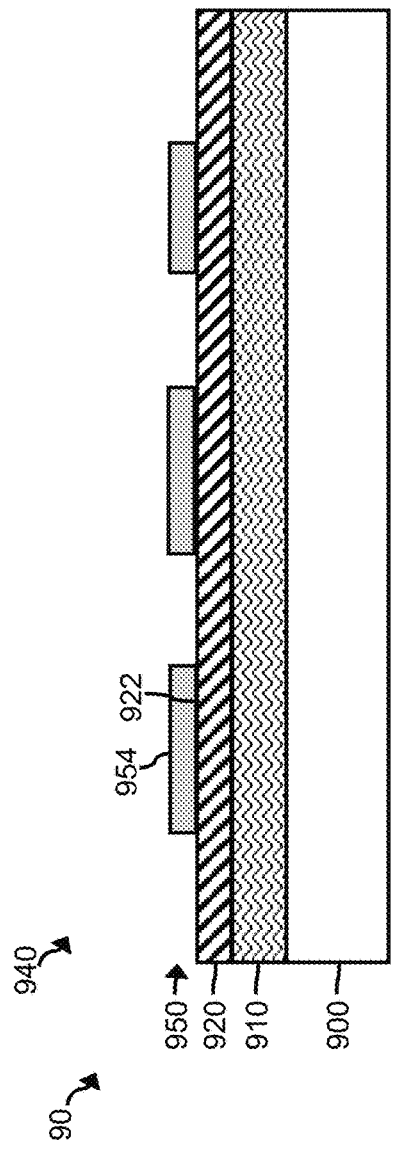

In step 834 (via placeholder A), the remaining photoresist layer is exposed to a solvent to remove the remaining photoresist layer. Exposing the remaining photoresist layer to the solvent causes the ferromagnetic layer(s) 952 deposited on the isolated negative photoresist layer regions 932 to be removed from the patterning substrate assembly 90, as illustrated in FIG. 9E. The ferromagnetic layer(s) regions 954 remain on the exposed dielectric layer regions 922 in step 834.

In step 840, a carrier release layer and a dielectric layer are sequentially deposited on a receiving substrate (e.g., a second substrate). Step 840 can be the same as step 640.

Figure 9F:
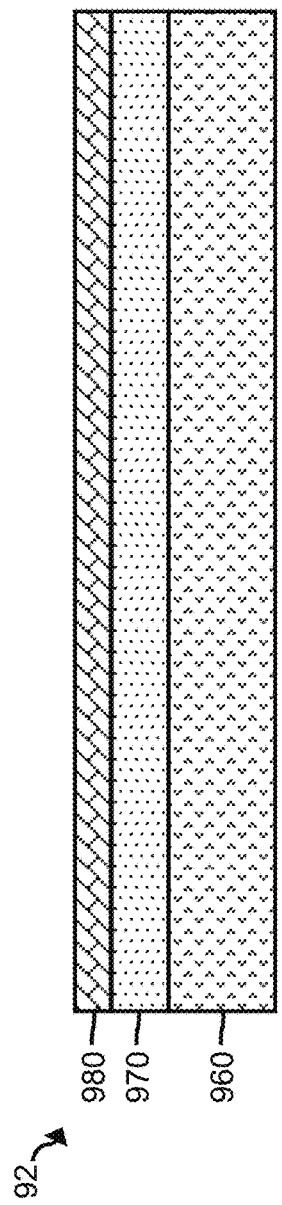

An example cross-sectional view of a receiving substrate assembly 92 that includes a receiving substrate 960, a carrier release layer 970, and a dielectric layer 980 formed according to step 840 is illustrated in FIG. 9F. The receiving substrate 960, the carrier release layer 970, and the dielectric layer 980 can be the same as or different than the patterning substrate 900, the carrier release layer 910, and the dielectric layer 920, respectively. In addition, the receiving substrate 960, the carrier release layer 970, and the dielectric layer 980 can be the same as or different than the receiving substrate 760, the carrier release layer 770, and the dielectric layer 780, respectively.

In step 850, the ferromagnetic layer regions on the patterning substrate assembly are placed in contact (e.g., direct physical contact) with the exposed dielectric layer on the receiving substrate assembly.

Figure 9G:
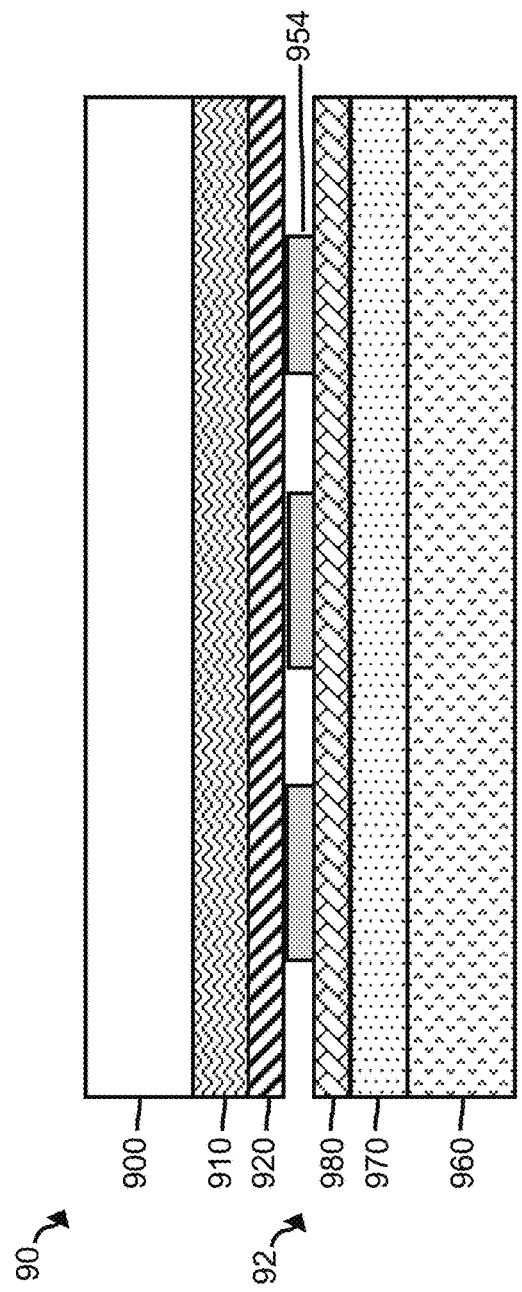

FIG. 9G is an example cross-sectional view of the structure formed in step 850. The patterning substrate assembly 90 in FIG. 9G has been flipped upside down compared to the patterning substrate assembly 90 in FIGS. 9A-7E. After the patterning substrate assembly 90 is rotated vertically by 180 degrees, the patterning substrate assembly 90 and the receiving substrate assembly 92 are move toward each other so that the ferromagnetic layer(s) regions 954 on the patterning substrate assembly 90 are in contact (e.g., direct physical contact) with the dielectric layer 980 in the receiving substrate assembly 92.

In step 860, a bond is formed between the ferromagnetic layer regions on the patterning substrate assembly and the exposed dielectric layer on the receiving substrate assembly. The bond can be formed by applying pressure to the patterning and receiving substrate assemblies 90, 92 and/or by heating the patterning and receiving substrate assemblies 90, 92, for example as described above with respect to step 660. An optional vacuum (e.g., less than or equal to about 10 µTorr) can be applied during step 860 to remove or reduce the number of voids at the bonding interface. While the bond is formed, the dielectric layer 920 and/or the dielectric layer 980 can reflow in step 870 to fill the gaps between neighboring ferromagnetic layer(s) regions 954, for example as illustrated in FIG. 9H. Additionally or alternatively, a dielectric layer can be deposited (e.g., spun on) to fill the gaps, for example according to step 680.

In step 880 (via placeholder B), the patterning substrate is detached from the patterning substrate assembly. The patterning substrate is detached by activating the carrier release layer in the patterning substrate assembly, such as by exposing the carrier release layer to a solvent, exposing the carrier release layer to light, heating the carrier release layer, and/or applying pressure or force to the carrier release layer. Activating the carrier release layer can cause its physical integrity to decrease, which can reduce the bond or adhesion between the carrier release layer and the patterning substrate and/or between the carrier release layer and the dielectric layer. Step 880 can be the same as step 670.

FIG. 9I is an example cross-sectional view of the structure formed in step 880. In this example cross-sectional view, the carrier release layer 910 is being removed by exposing the carrier release layer 910 to light from a laser 905 that ablates or burns off the carrier release layer 910 (e.g., to compromise the physical integrity of the carrier release layer 910) to release or detach the patterning substrate 900, thereby detaching the patterning substrate assembly 90 (e.g., the patterning substrate 900) from the receiving substrate assembly 92. When the patterning substrate assembly 90 is detached from the receiving substrate assembly 92, the dielectric layer 920 and the ferromagnetic layer(s) regions 954 are transferred from the patterning substrate assembly 90 to the receiving substrate assembly 92.

If additional ferromagnetic layer(s) are to be formed on or transferred to the receiving substrate assembly (i.e., step 890=yes), the method 80 proceeds to step 892. In step 892, one or more additional ferromagnetic layer(s) are formed on a new patterning substrate (e.g., in a new patterning substrate assembly. The ferromagnetic layer(s) can be formed according to steps 800-834. The ferromagnetic layer(s) formed on the new patterning substrate assembly are then bonded and transferred to the receiving substrate assembly in the same manner as in steps 850-880. One or both of the dielectric layer(s) that are adjacent to the ferromagnetic layer(s) formed in step 892 are reflowed in step 894, which can be the same as step 870. Additionally or alternatively, a dielectric layer can be deposited (e.g., spun on) to fill the gaps, for example according to step 680. In some embodiments, a total of 2 to 100 ferromagnetic layer(s) or another number of ferromagnetic layer(s) can be formed or transferred to the receiving substrate assembly.

Alternatively, the new patterning substrate can be prefabricated in which case step 892 only includes bonding and transferring the additional ferromagnetic layer(s) to the receiving substrate assembly, which can be performed in the same manner as steps 850-880.

In another embodiment, the additional ferromagnetic layer(s) can be formed according to steps 600-630 or another method (e.g., as disclosed herein) and transferred according to steps 650-670 or another method (e.g., as disclosed herein).

In some embodiments, the ferromagnetic layer regions 954 on the new patterning substrate assembly can be placed directly over the ferromagnetic layer(s) regions 954 on the receiving substrate assembly or they can be offset with respect to each other, which can increase the packing density of ferromagnetic layers on the receiving substrate assembly. One or more alignment structures can be formed on the receiving substrate assembly and/or on the patterning substrate assembly, which can be used by optics systems to align or offset the ferromagnetic layer regions with respect to each other.

FIG. 9J is an example cross-sectional view of the structure formed in step 892 and 894. The receiving substrate 92 includes two layers or rows of ferromagnetic layer regions 954. The receiving substrate 92 also includes two dielectric layers 920 and two dielectric layers 980.

After step 894, the method returns to step 890. This process can proceed in a loop with steps 892 and 894 repeated until the desired number of layers or rows of ferromagnetic layer regions 954 are formed on the receiving substrate assembly 92.

If no additional ferromagnetic layer(s) are to be formed on the receiving substrate assembly (i.e., step 890=no), the method 80 proceeds to step 896 where the receiving substrate is detached from the receiving substrate assembly. The receiving substrate is detached by activating the carrier release layer in the receiving substrate assembly, such as by exposing the carrier release layer to a solvent, exposing the carrier release layer to light, heating the carrier release layer, and/or applying pressure or force to the carrier release layer. Activating the carrier release layer can cause its physical integrity to decrease, which can reduce the bond or adhesion between the carrier release layer and the receiving substrate and/or between the carrier release layer and the neighboring dielectric layer.

Figure 9L:
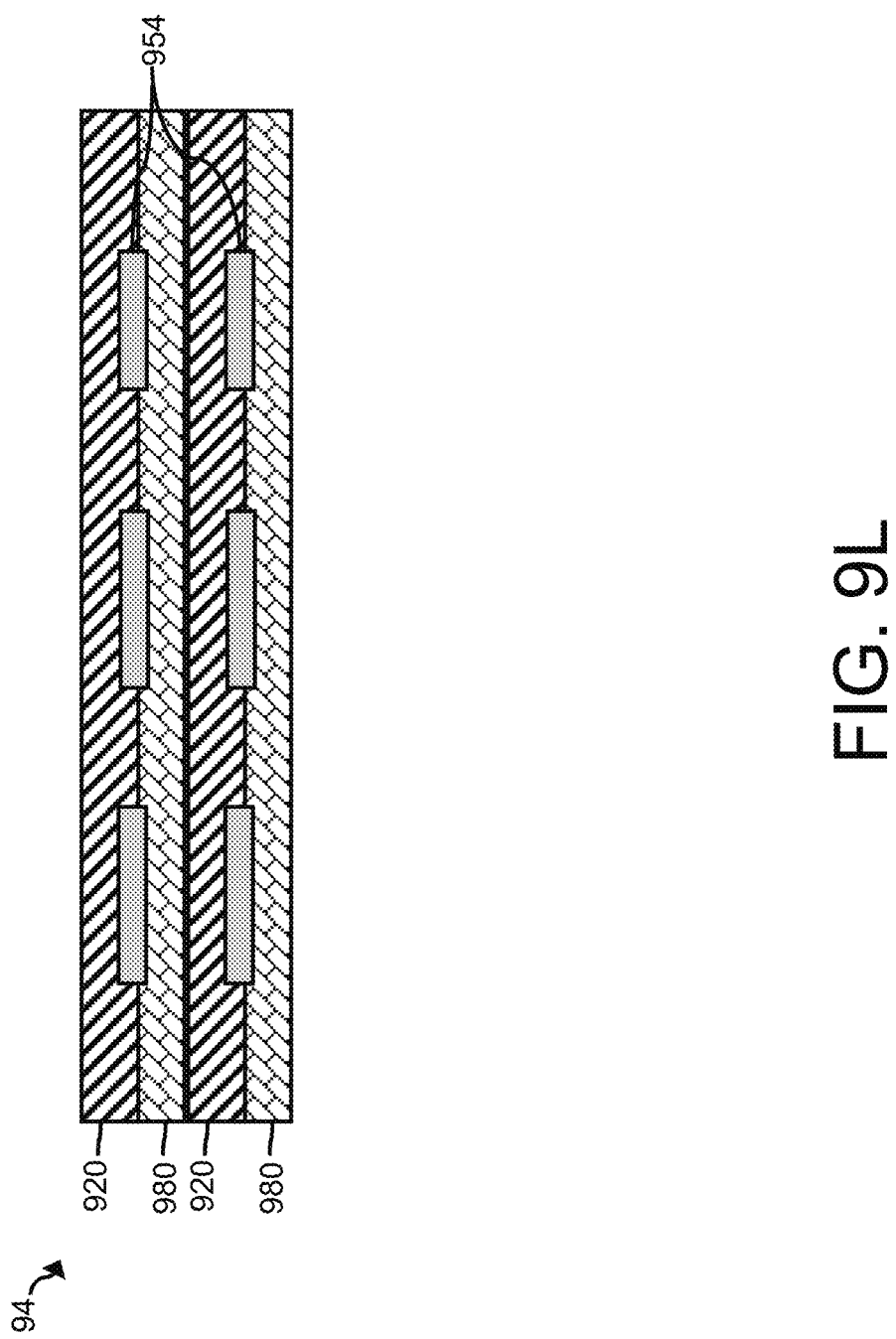

FIG. 9K is an example cross-sectional view of the structure formed in step 896 where the receiving substrate assembly 92 had the same structure as in FIG. 9J prior to detaching the receiving substrate 960 from the receiving substrate assembly 92. After the receiving substrate 760 is detached and removed, a ferromagnetic-dielectric composite material 94 is formed, as illustrated in FIG. 9L. The ferromagnetic-dielectric composite material 94 includes dielectric layers 980, 920, and ferromagnetic layer regions 954. Depending on how the ferromagnetic-dielectric composite material 94 is formed, the ferromagnetic-dielectric composite material 94 can include additional or fewer rows of ferromagnetic layer regions 954. The easy axes of magnetization can be aligned in the ferromagnetic layer regions 954. In addition, the hard axes of magnetization can be aligned in the ferromagnetic layer regions 954. The ferromagnetic-dielectric composite material 94 can be the same as ferromagnetic-dielectric composite material 10.

Figure 10:
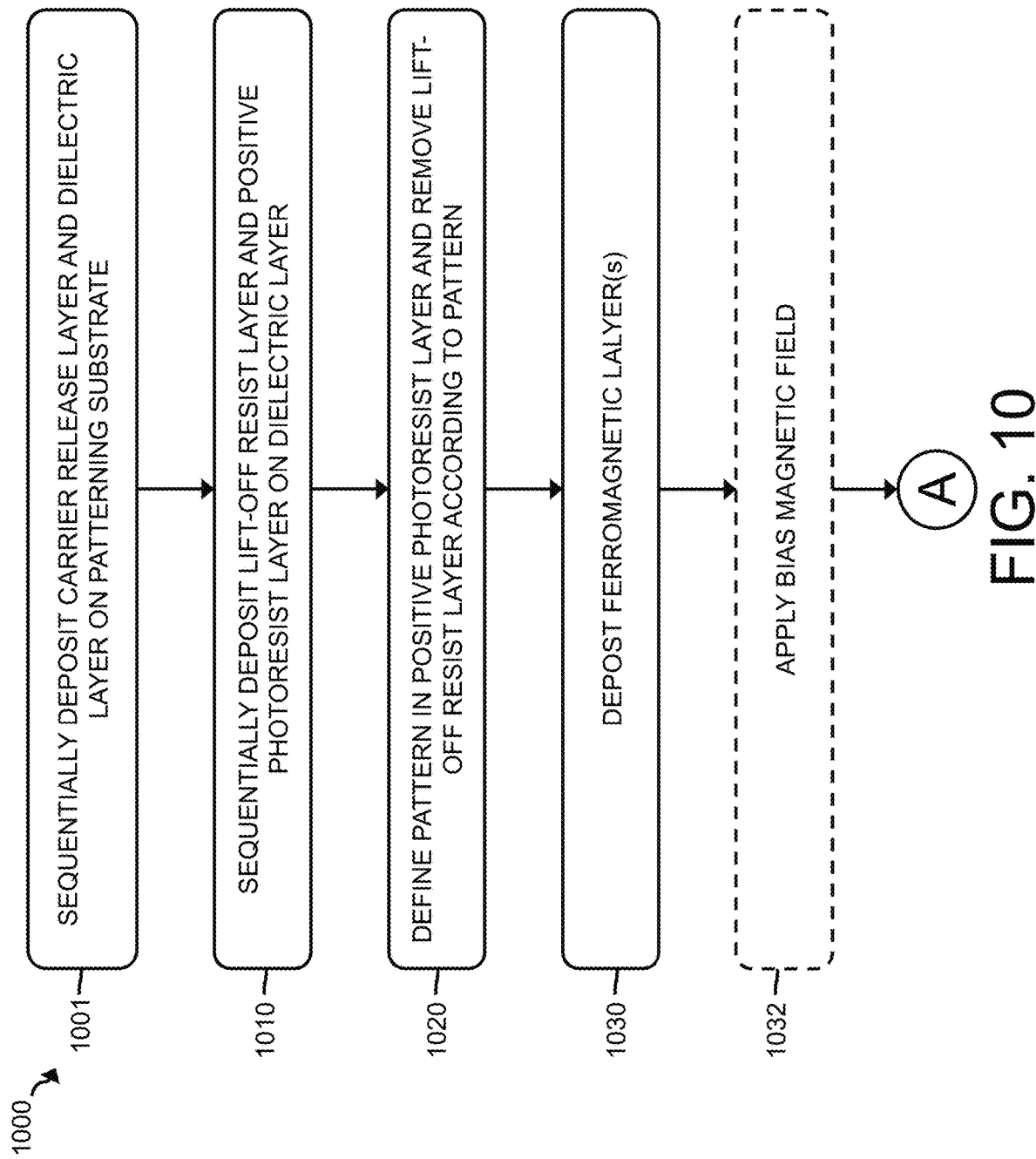
FIG. 10 is a flow chart of a method for manufacturing a ferromagnetic-dielectric composite material according to another embodiment.
Figure 10:
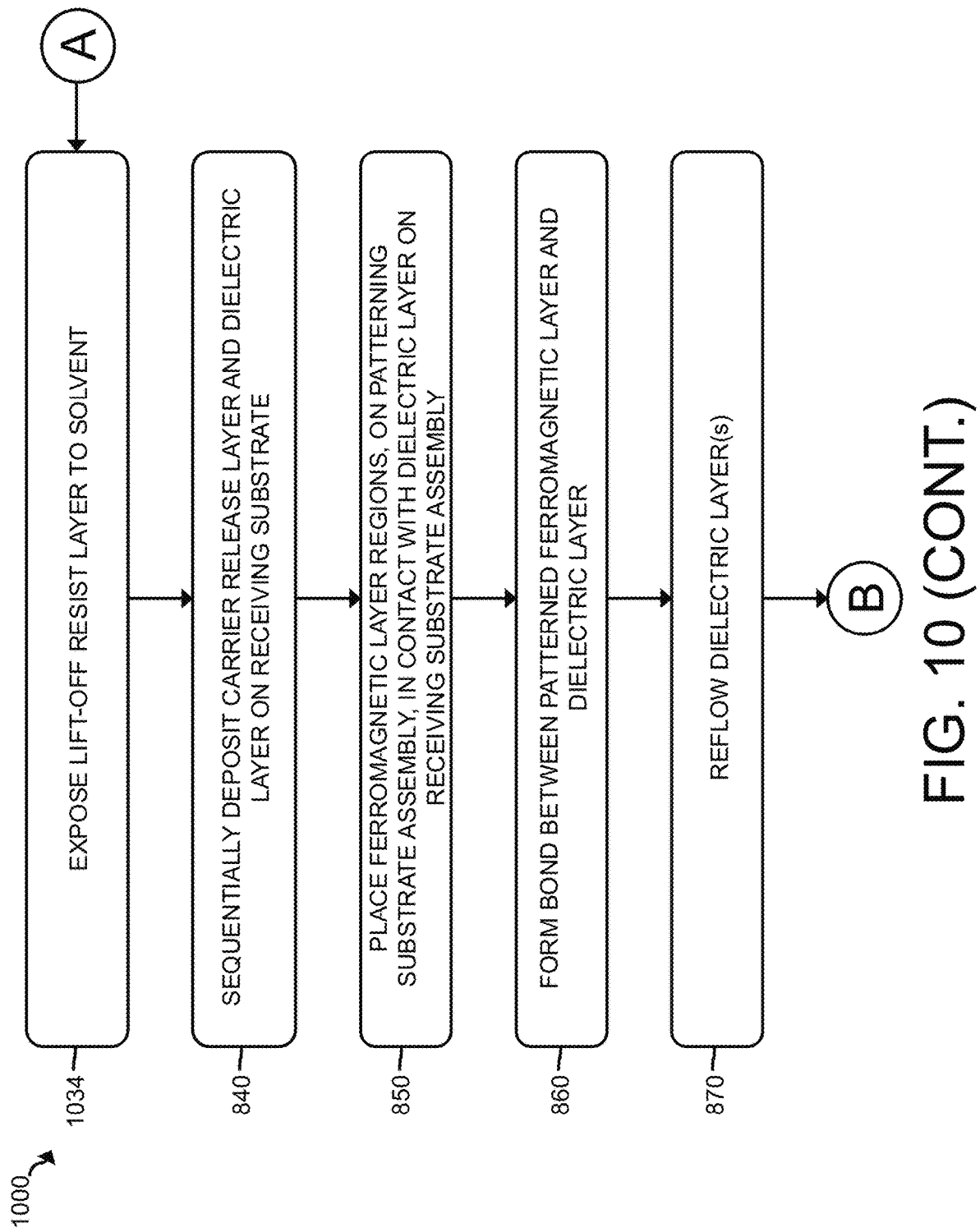
Figure 10:
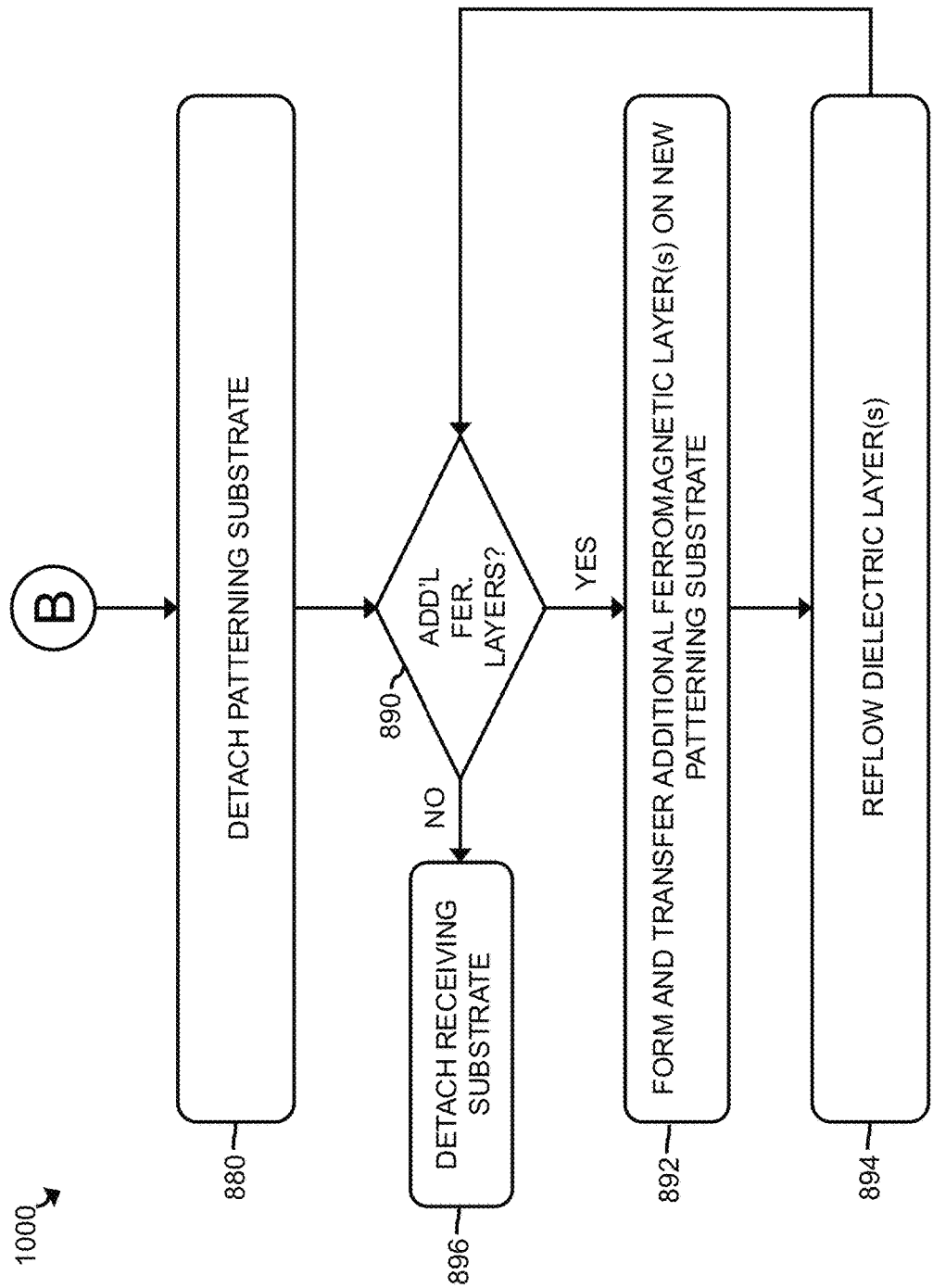

FIG. 10 is a flow chart of a method 1000 for manufacturing a ferromagnetic-dielectric composite material according to another embodiment. Method 1000 can be used to manufacture material 10.

In step 1001, a carrier release layer and a dielectric layer are sequentially deposited on a patterning substrate. The carrier release layer is deposited on the patterning substrate and the dielectric layer is deposited on the carrier release layer. Step 1001 can be the same as step 800 and/or step 600.

An example cross-sectional view of a patterning substrate assembly 1100 that includes a patterning substrate 1101, a carrier release layer 1110, and a dielectric layer 1120 formed according to step 1001 is illustrated in FIG. 11A. The patterning substrate 1100, the carrier release layer 1110, and the dielectric layer 1120 can be the same as the patterning substrate 700, the carrier release layer 710, and/or the dielectric layer 720, respectively. Additionally or alternatively, the patterning substrate 1100, the carrier release layer 1110, and the dielectric layer 1120 can be the same as the patterning substrate 900, the carrier release layer 910, and/or the dielectric layer 920, respectively.

In step 1010, a lift-off resist layer and a photoresist layer are sequentially deposited on the dielectric layer. The photoresist layer is preferably a positive photoresist layer but can also be a negative photoresist layer.

An example cross-sectional view of the patterning substrate assembly 1100 including the lift-off resist layer 1130 and a photoresist layer 1140 is illustrated in FIG. 11B.

In step 1020, a pattern is defined in the photoresist layer and the lift-off resist layer is removed according to the patterned photoresist layer. The pattern can be defined through photolithography and then removing the photoresist layer regions through photolithography and exposure to light. The lift-off resist layer can be removed by etching or exposing it to a solvent.

FIG. 11C is an example cross-sectional view of the patterning substrate assembly 1100 formed in step 1020. The photoresist layer 1140 is formed into a pattern 1145 of isolated photoresist layer regions 1142 by photolithography and development. Gaps or holes 1144 are formed between adjacent or neighboring isolated photoresist layer regions 1142. The gaps or holes 1144 are used to remove (e.g., etch) the underlying lift-off resist layer 1130 to form isolated lift-off resist layer regions 1132. Gaps or holes 1134 are formed between adjacent or neighboring isolated lift-off resist layer regions 1132.

The isolated lift-off resist layer regions 1132 are aligned with the isolated photoresist layer regions 1142. In addition, the gaps or holes 1134 are aligned with the gaps or holes 1144. The gaps or holes 1134, 1144 reveal exposed dielectric layer regions 1122.

In step 1030, one or more ferromagnetic layer(s) is/are deposited onto the patterning substrate assembly (e.g., onto the patterned photoresist layer and the patterned lift-off resist layer). When more than one ferromagnetic layer is deposited, a non-ferromagnetic layer, such as an insulator layer, can be deposited between some or all neighboring ferromagnetic layers. Step 1030 can be the same as step 830 and/or step 620.

Figure 11D:
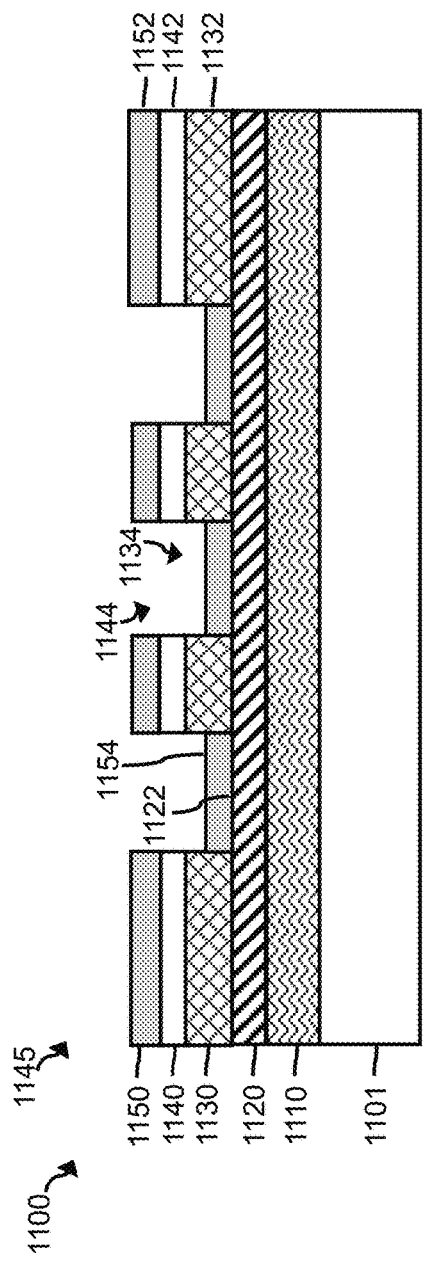

FIG. 11D is an example cross-sectional view of the patterning substrate assembly 1100, including the ferromagnetic layer(s) 1150, formed in step 1030. The ferromagnetic layer(s) 1150 include ferromagnetic layer(s) regions 1152 that are deposited on the isolated photoresist layer regions 1142 and ferromagnetic layer(s) regions 1154 that are deposited on the exposed dielectric layer regions 1122 in the gaps or holes 1134, 1144. As such, the ferromagnetic layer(s) 1150 conform to the pattern 1145.

In optional step 1032, a bias magnetic field is applied during or after the ferromagnetic deposition step 1030 to set the easy axis or magnetization in a direction parallel to the bias magnetic field, which can set the hard axis of magnetization in a direction orthogonal to the bias magnetic field in the major plane of the ferromagnetic layer. Step 1032 can be the same as step 832 and/or step 630. A cross-sectional illustration of this step would appear the same or similar to as structure 70 in FIG. 7D.

Figure 11E:
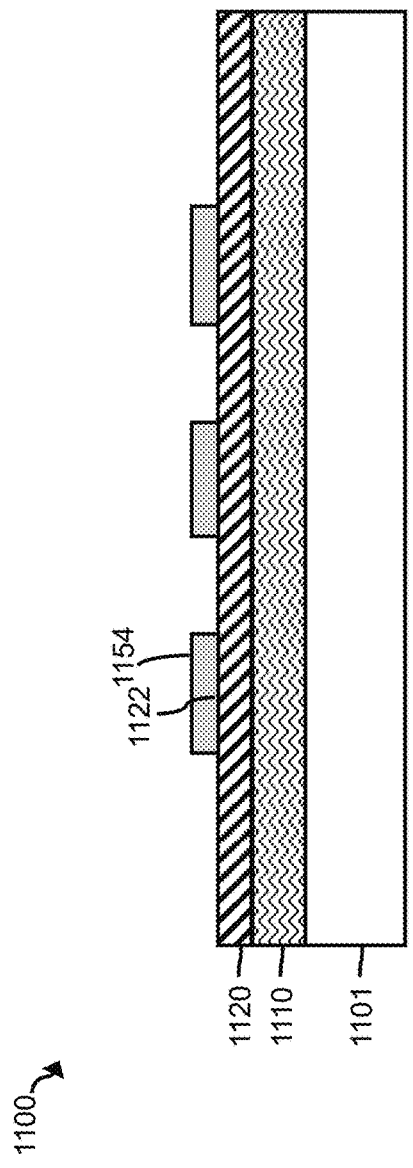

In step 1034 (via placeholder A), the lift-off resist layer is exposed to a solvent. The lift-off resist layer is partially, substantially, or fully soluble in the solvent. Exposing the isolated lift-off resist layer regions 1132 to a solvent causes the isolated photoresist layer regions 1142 and the ferromagnetic layer(s) regions 1152 to be lifted off (e.g., removed) from the patterning substrate assembly 1100, as illustrated in FIG. 11E. The ferromagnetic layer(s) regions 1154 remain on the exposed dielectric layer regions 1122 in step 1034.

The remaining steps of method 1000 (i.e., steps 840, 850, 860, 870, 880, 890, 892, 894, and 896) are the same as described in method 80. The cross-sectional illustrations of the structures formed in the remaining steps of method 1000 are the same as described in method 80 (i.e., FIGS. 9F-9L).

Figure 12:
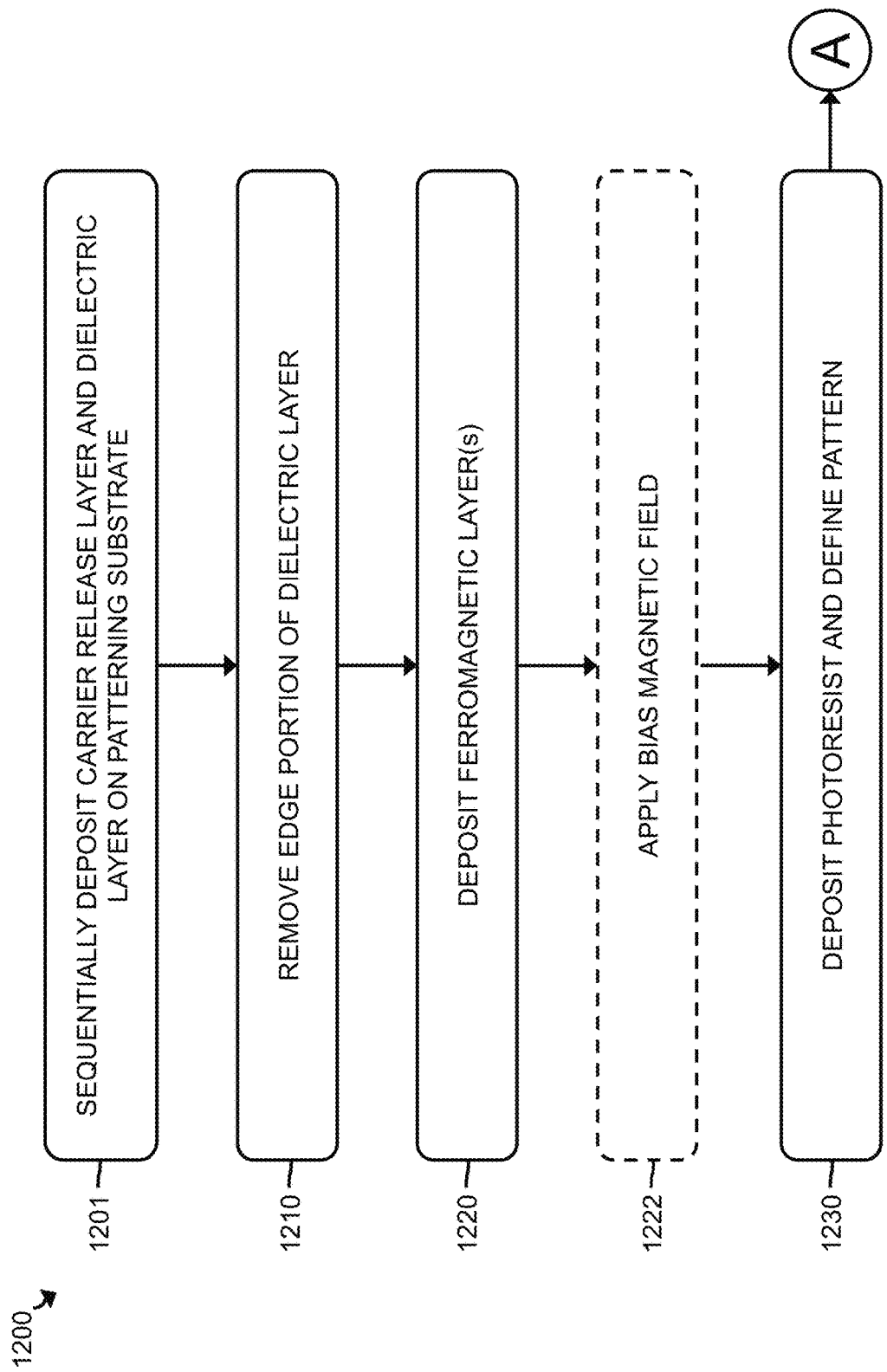
FIG. 12 is a flow chart of a method for manufacturing a ferromagnetic-dielectric composite material according to another embodiment.
Figure 12:
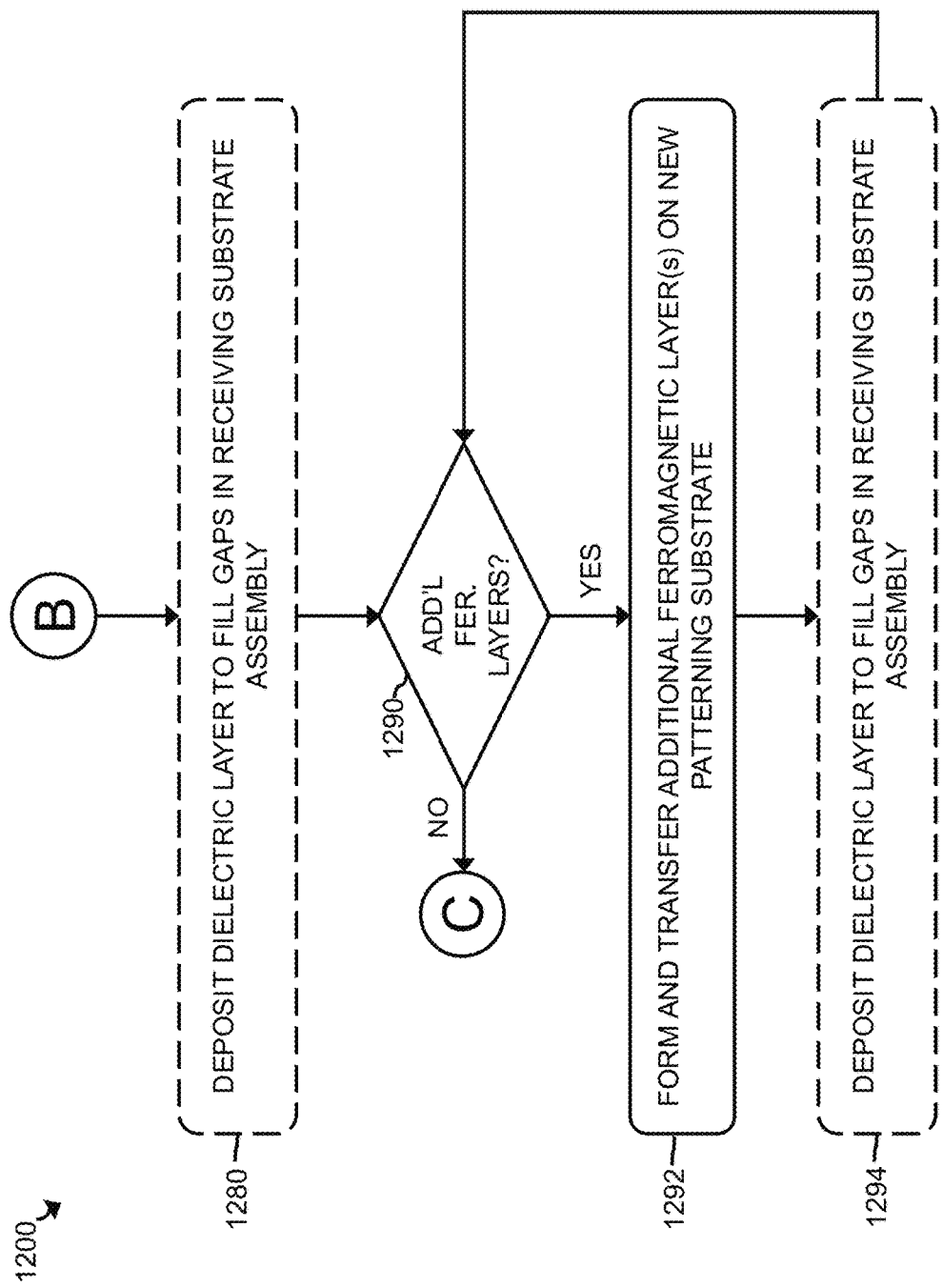
Figure 12:
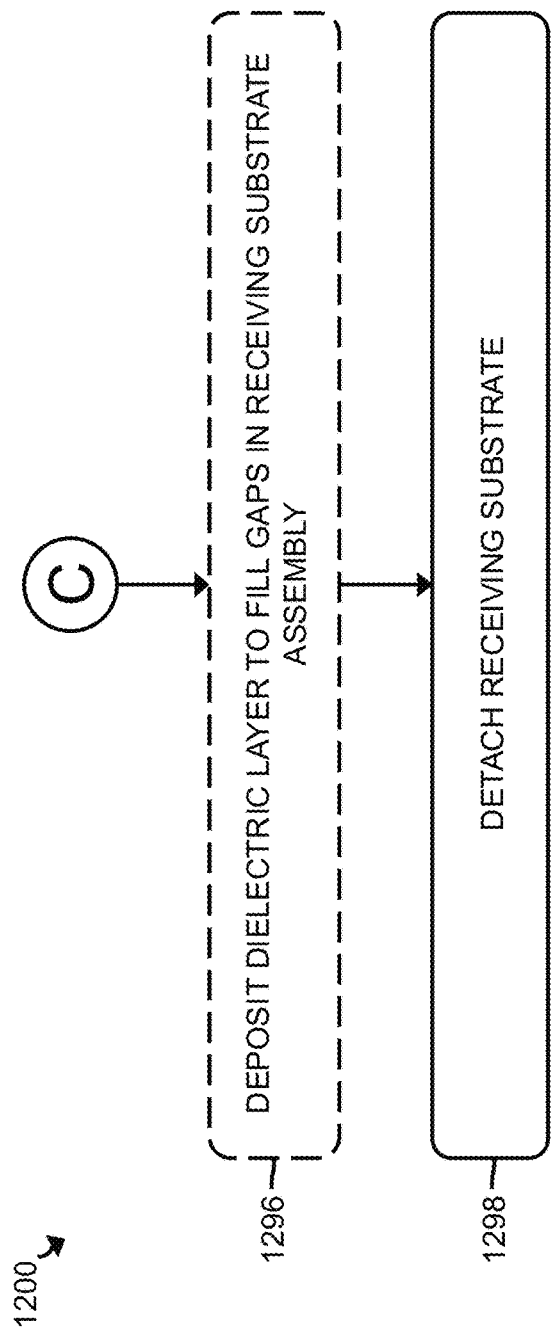

FIG. 12 is a flow chart of a method 1200 for manufacturing a ferromagnetic-dielectric composite material according to another embodiment. Method 1200 can be used to manufacture material 10.

In step 1201, a carrier release layer and a dielectric layer are sequentially deposited on a patterning substrate. The carrier release layer is deposited on the patterning substrate and the dielectric layer is deposited on the carrier release layer. Step 1201 can be the same as step 1001, step 800 and/or step 600.

Figure 13A:
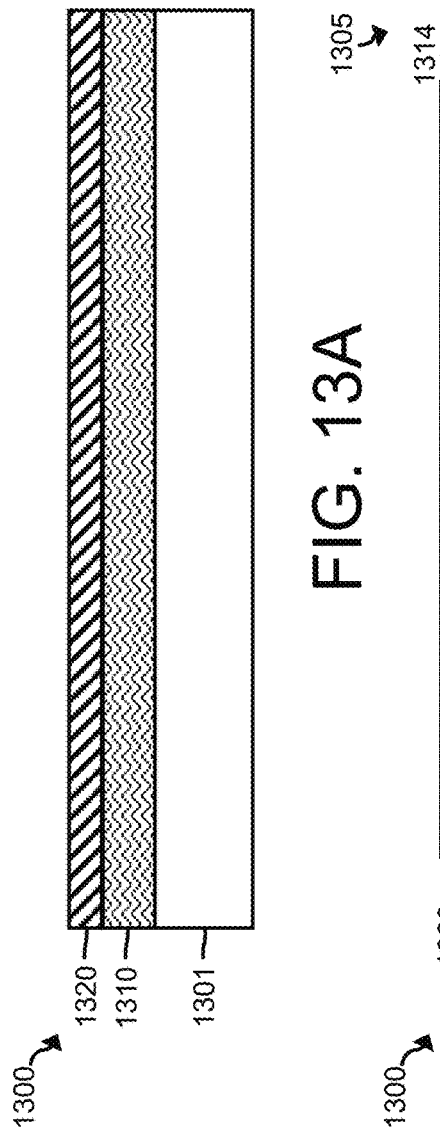

An example cross-sectional view of a patterning substrate assembly 1300 that includes a patterning substrate 1301, a carrier release layer 1310, and a dielectric layer 1320 formed according to step 1201 is illustrated in FIG. 13A. The patterning substrate 1300, the carrier release layer 1310, and the dielectric layer 1320 can be the same as the patterning substrate 700, the carrier release layer 710, and/or the dielectric layer 720, respectively. Additionally or alternatively, the patterning substrate 1300, the carrier release layer 1310, and the dielectric layer 1320 can be the same as the patterning substrate 900, the carrier release layer 910, and/or the dielectric layer 920, respectively. Additionally or alternatively, the patterning substrate 1300, the carrier release layer 1310, and the dielectric layer 1320 can be the same as the patterning substrate 1100, the carrier release layer 1110, and the dielectric layer 1120, respectively.

In step 1210, the edge portion of the dielectric layer is removed to expose the underlying edge portion of the carrier release layer. The edge portion of the dielectric layer can be removed by selectively exposing the dielectric layer to a solvent, by exposing the edge portion to light through photolithography and then exposing the dielectric layer to a solvent, or by depositing and patterning a photoresist layer on the dielectric layer and then etching the dielectric layer using the patterned photoresist layer.

Figure 13B:
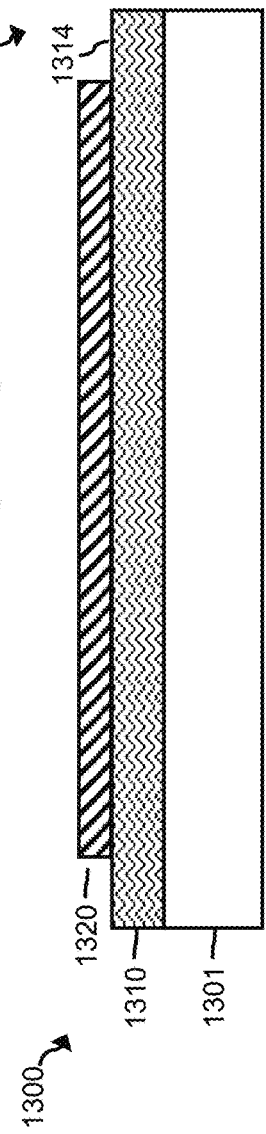

An example cross-sectional view that illustrates the dielectric layer 1320 removed at the edge 1305 is illustrated in FIG. 13B. The removed dielectric layer 1320 reveals exposed carrier release layer regions 1314 at the edge 1305.

In step 1220, one or more ferromagnetic layer(s) is/are deposited on the patterning substrate assembly (e.g., on the dielectric layer and the exposed carrier release layer at the edge of the patterning substrate assembly). When more than one ferromagnetic layer is deposited, a non-ferromagnetic layer, such as an insulator layer, can be deposited between some or all neighboring ferromagnetic layers. Step 1220 can be the same as step 1030, step 830, and/or step 620.

Figure 13C:
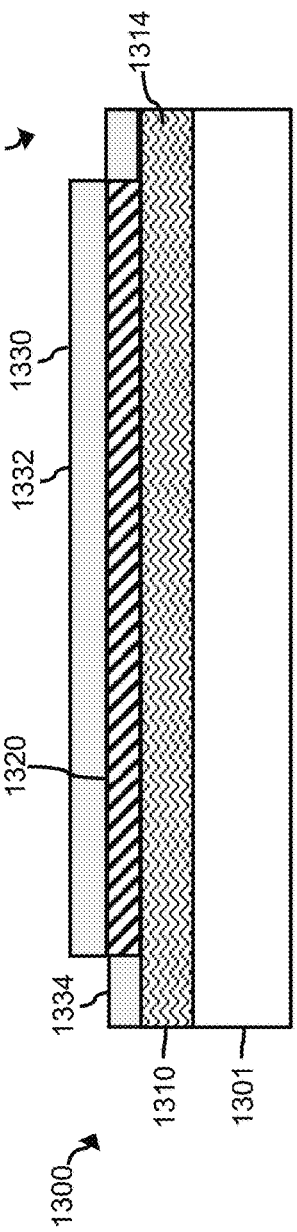

FIG. 13C is an example cross-sectional view of the patterning substrate assembly 1300, including the ferromagnetic layer(s) 1330, formed in step 1220. The ferromagnetic layer(s) 1330 include ferromagnetic layer(s) regions 1332 that are deposited on the dielectric layer 1320 and ferromagnetic layer(s) regions 1334 that are deposited on the exposed carrier release layer regions 1314.

In optional step 1222, a bias magnetic field is applied during or after the ferromagnetic deposition step 1220 to set the easy axis or magnetization in a direction parallel to the bias magnetic field, which can set the hard axis of magnetization in a direction orthogonal to the bias magnetic field in the major plane of the ferromagnetic layer. Step 1222 can be the same as step 1032, step 832, and/or step 630. A cross-sectional illustration of this step would appear the same or similar to as structure 70 in FIG. 7D.

In step 1230, a photoresist layer is deposited and patterned on the patterning substrate assembly (e.g., on the ferromagnetic layer(s)). The patterned photoresist layer includes holes or gaps that expose portion of the underlying ferromagnetic layer(s).

Figure 13D:
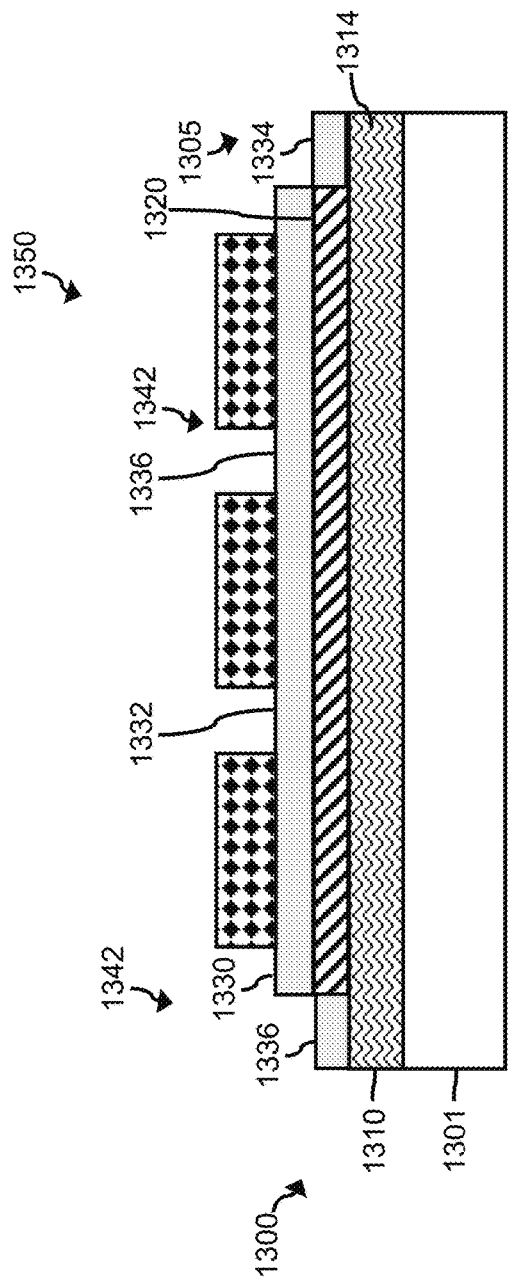

FIG. 13D is an example cross-sectional view of the patterning substrate assembly 1300, including the patterned photoresist layer 1340, formed in step 1230. The patterned photoresist layer 1340 includes a pattern 1350 of holes 1342 that reveal exposed ferromagnetic layer(s) regions 1336. The holes 1342 are over the ferromagnetic layer(s) regions 1332 and over the ferromagnetic layer(s) regions 1334.

In step 1232 (via placeholder A), the ferromagnetic layer(s) regions that are exposed by the holes or gaps in the patterned photoresist layer are removed. The ferromagnetic layer(s) can be removed by wet etching or another method.

Figure 13E:
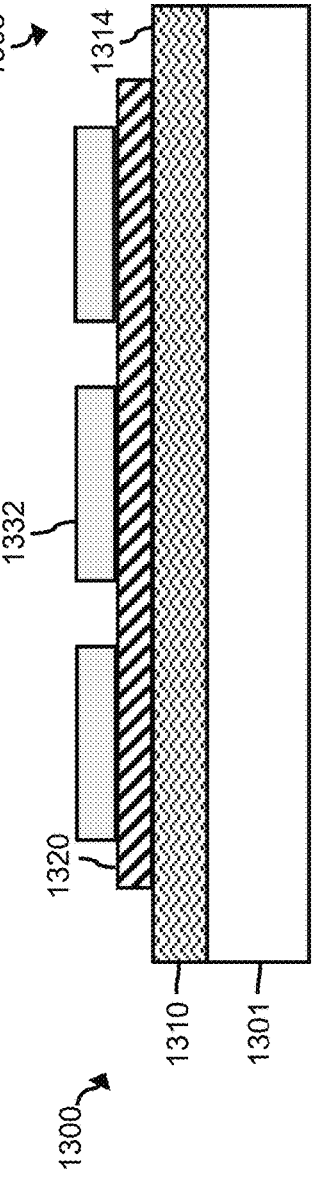

FIG. 13E is an example cross-sectional view of the patterning substrate assembly 1300 formed in step 1232. The exposed ferromagnetic layer(s) regions 1336 are removed leaving patterned ferromagnetic layer(s) regions 1332 on the dielectric layer 1320 and the exposed carrier release layer regions 1314. The removed dielectric layer 1320 at the edge 1305 of the patterning substrate assembly 1300 provides a pathway for solvent to contact the exposed carrier release layer regions 1314 during subsequent removal of the patterning substrate 1301 and transfer of the patterned ferromagnetic layer(s) regions 1332 to the receiving substrate.

In step 1240, a carrier release layer and a dielectric layer are sequentially deposited on a receiving substrate (e.g., a second substrate). Step 1240 can be the same as step 840 and/or step 640.

An example cross-sectional view of a receiving substrate assembly 1302 that includes a receiving substrate 1360, a carrier release layer 1370, and a dielectric layer 1380 formed according to step 1240 is illustrated in FIG. 13F. The receiving substrate 1360, the carrier release layer 1370, and the dielectric layer 1380 can be the same as or different than the patterning substrate 1301, the carrier release layer 1310, and the dielectric layer 1320, respectively. Additionally or alternatively, the receiving substrate 1360, the carrier release layer 1370, and the dielectric layer 1380 can be the same as or different than the receiving substrate 760, the carrier release layer 770, and the dielectric layer 780, respectively. Additionally or alternatively, the receiving substrate 1360, the carrier release layer 1370, and the dielectric layer 1380 can be the same as or different than the receiving substrate 960, the carrier release layer 970, and the dielectric layer 980, respectively.

In step 1250, the patterned ferromagnetic layer on the patterning substrate assembly is placed in contact (e.g., direct physical contact) with the exposed dielectric layer on the receiving substrate assembly. Step 1250 can be the same as step 850 and/or step 650.

FIG. 13G is an example cross-sectional view of the structure formed in step 1250. The patterning substrate assembly 1300 in FIG. 7G has been flipped upside down compared to the patterning substrate assembly 1300 in FIGS. 7A-7E. After the patterning substrate assembly 1300 is rotated vertically by 180 degrees, the patterning substrate assembly 1300 and the receiving substrate assembly 1302 are moved towards each other so that the patterned ferromagnetic layer(s) regions 1332 on the patterning substrate assembly 1300 are in contact (e.g., direct physical contact) with the dielectric layer 1380 in the receiving substrate assembly 1302.

Figure 13H:
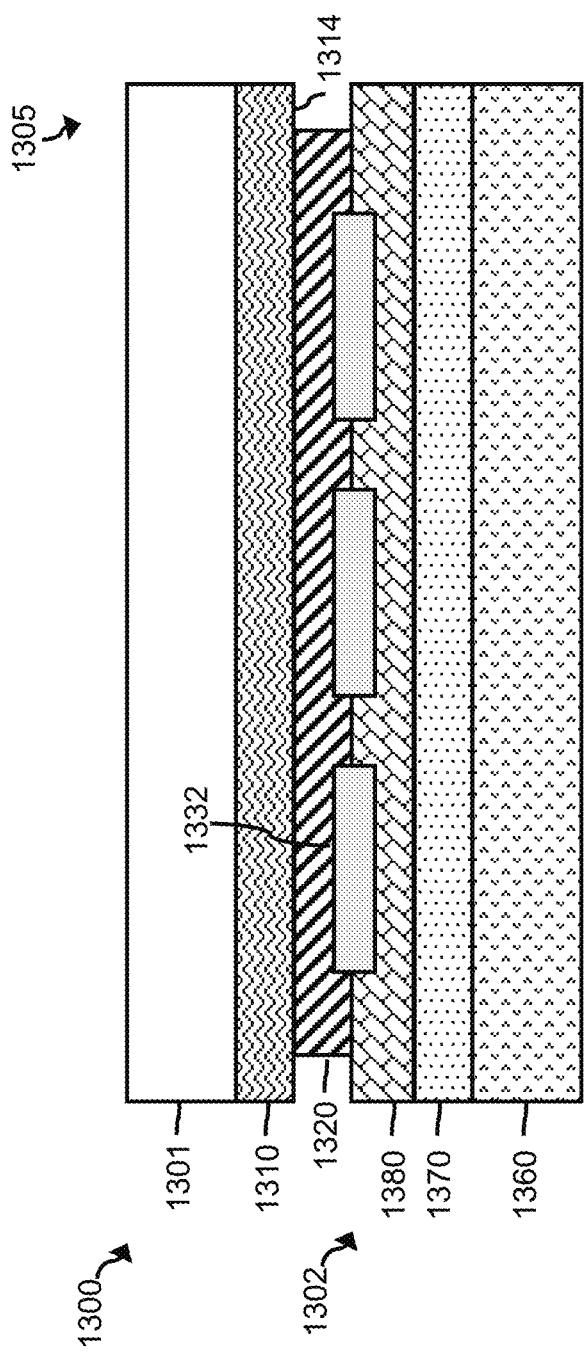

In step 1260, a bond is formed between the patterned ferromagnetic layer on the patterning substrate assembly and the dielectric layer on the receiving substrate assembly. Step 1260 can be the same as step 860 and/or step 660. In some embodiments, the dielectric layer 1380 and/or the dielectric layer 1320 can reflow during step 1260 to fill the holes or gaps between neighboring patterned ferromagnetic layer(s) regions 1332, for example as illustrated in FIG. 13H. The reflowed dielectric layer(s) 1320, 1380 do not fully cover the exposed carrier release layer regions 1314.

In step 1270, the patterning substrate is detached from the patterning substrate assembly. The patterning substrate is detached by activating the carrier release layer in the patterning substrate assembly, such as by exposing the carrier release layer (exposed carrier release layer regions 1314) to a solvent (e.g., via, exposing the carrier release layer to light, heating the carrier release layer, and/or applying pressure or force to the carrier release layer. Activating the carrier release layer can cause its physical integrity to decrease, which can reduce the bond or adhesion between the carrier release layer and the patterning substrate and/or between the carrier release layer and the dielectric layer.

Figure 13I:
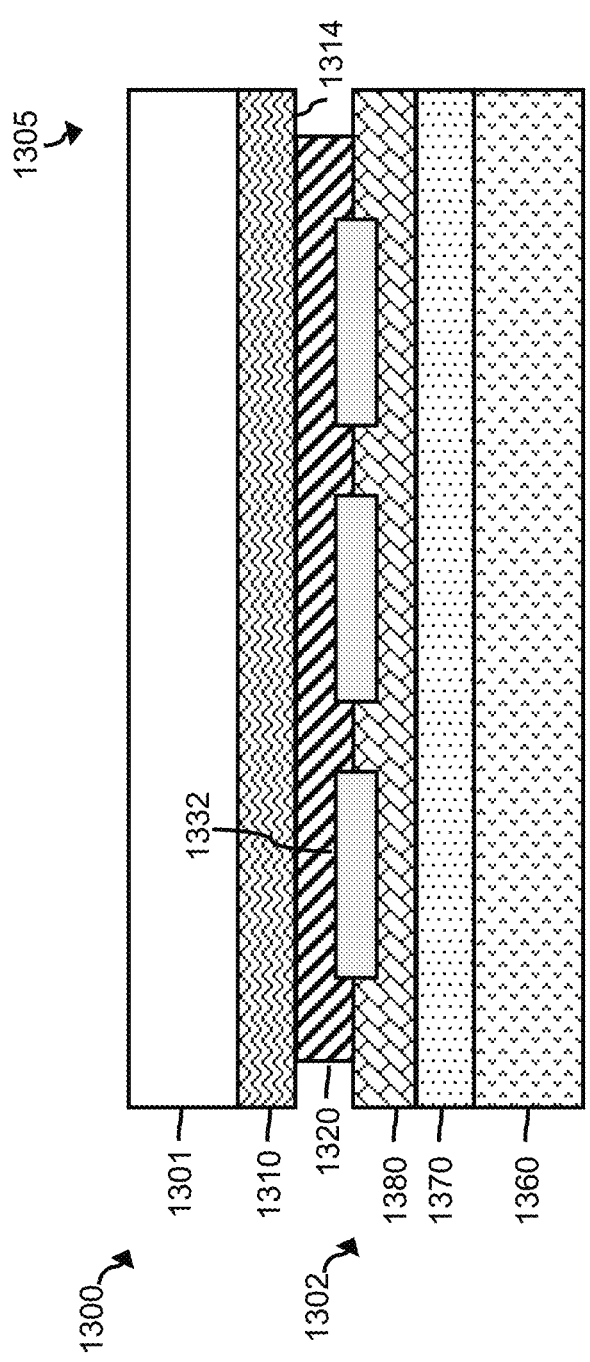

FIG. 13I is an example cross-sectional view of the structure formed in step 1270. In this example cross-sectional view, the carrier release layer 1310 has been removed by exposing the carrier release layer 1310 to a solvent. The solvent can initially contact the exposed carrier release layer regions 1314 and then contact some or all the inner regions of the carrier release layer 1310 as the exposed carrier release layer regions 1314 at least partially dissolves. As a result, the remainder of the patterning substrate 1301 is detached from the receiving substrate assembly 1302. When the patterning substrate 1301 is detached from the receiving substrate assembly 1302, the dielectric layer 1320 and the patterned ferromagnetic layer(s) regions 1332 are transferred from the patterning substrate assembly 1300 to the receiving substrate assembly 1302.

In optional step 1280 (via placeholder B), a dielectric layer is deposited on the receiving substrate assembly after the patterning substrate is detached from the receiving substrate assembly. The dielectric layer can fill in the gaps, holes, or voids between neighboring patterned ferromagnetic layer(s) regions 1332.

If additional ferromagnetic layer(s) are to be formed on or transferred to the receiving substrate assembly (i.e., step 1290=yes), the method 1200 proceeds to step 1292. In step 1292, one or more additional ferromagnetic layer(s) are formed on a new patterning substrate (e.g., in a new patterning substrate assembly) in the same manner as in steps 1200-1230 or according to another method (e.g., as described herein). The ferromagnetic layer(s) formed on the new patterning substrate assembly are then bonded and transferred to the receiving substate assembly in the same manner as in steps 1250-1280. Alternatively, the new patterning substrate can be prefabricated in which case step 1292 only includes bonding and transferring the additional ferromagnetic layer(s) to the receiving substate assembly, which can be performed in the same manner as steps 1250-1280. The dielectric layer(s) adjacent to the transferred ferromagnetic layer(s) can be reflowed during step 1292 to fill the gaps between neighboring patterned ferromagnetic layer(s) regions. In some embodiments, a total of 2 to 100 ferromagnetic layer(s) or another number of ferromagnetic layer(s) can be formed or transferred to the receiving substrate assembly.

In some embodiments, the patterned ferromagnetic layer(s) regions in the new patterning substrate assembly can be placed directly over the patterned ferromagnetic layer(s) regions 1332 in the receiving substrate assembly 1302 or they can be offset with respect to each other, which can increase the packing density of ferromagnetic layers on the receiving substrate assembly. One or more alignment structures can be formed on the receiving substrate assembly and/or on the patterning substrate assembly, which can be used by optics systems to align or offset the patterned ferromagnetic layer(s) regions with respect to each other.

FIG. 13J is an example cross-sectional view of the structure formed in step 1292 where the dielectric layer 1380 and/or the dielectric layer 1320 were reflowed during step 1260 to fill the holes or gaps between neighboring patterned ferromagnetic layer(s) regions 1332.

In optional step 1294, a dielectric layer is deposited on the receiving substrate assembly after the new patterning substrate is detached from the receiving substrate assembly to fill the gaps in the receiving substrate assembly. Optional step 1294 can be performed in the same manner as optional step 1280.

After optional step 1294, the method returns to step 1290. This process can proceed in a loop with steps 1292 and 1294 repeated until the desired number of ferromagnetic layer(s) are formed on the receiving substrate assembly.

If no additional ferromagnetic layer(s) are to be formed on the receiving substrate assembly (i.e., step 1290=no), the method 1200 proceeds to optional step 1296 (via placeholder C). In optional step 1296, a dielectric layer is deposited on the receiving substrate assembly to fill any voids, holes, or gaps in the receiving substrate assembly.

In step 1298, the receiving substrate is detached from the receiving substrate assembly. The receiving substrate is detached by activating the carrier release layer in the receiving substrate assembly, such as by exposing the carrier release layer to a solvent, exposing the carrier release layer to light, heating the carrier release layer, and/or applying pressure or force to the carrier release layer. Activating the carrier release layer can cause its physical integrity to decrease, which can reduce the bond or adhesion between the carrier release layer and the receiving substrate and/or between the carrier release layer and the neighboring dielectric layer.

Figure 13L:
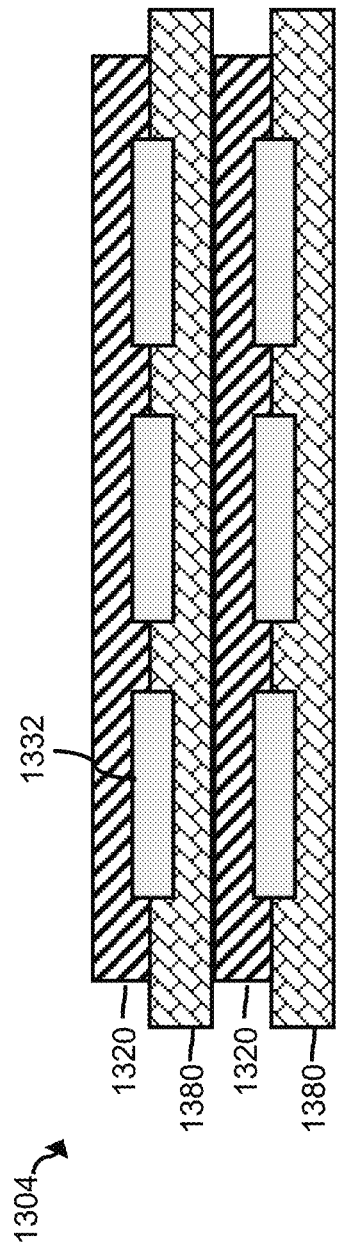
Figure 13M:
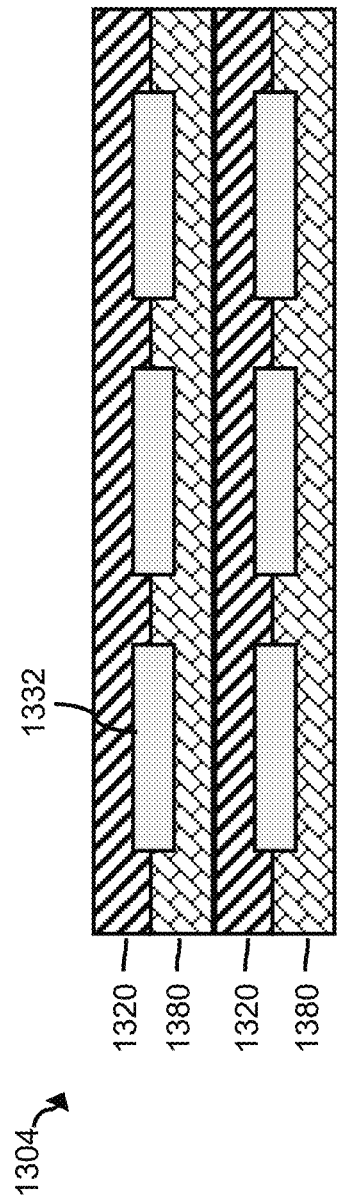

FIG. 13K is an example cross-sectional view of the structure formed in step 1298 where the receiving substrate assembly 72 had the same structure as in FIG. 13J prior to detaching the receiving substrate 1360 from the receiving substrate assembly 1302. The carrier release layer 1370 is removed in FIG. 13K. After the receiving substrate 1360 is detached and removed, a ferromagnetic-dielectric composite material 1304 is formed, as illustrated in FIG. 13L. The ferromagnetic-dielectric composite material 1304 includes dielectric layers 1320 and 1380 and patterned ferromagnetic layer(s) regions 1332. Depending on how the ferromagnetic-dielectric composite material 1304 is formed, the ferromagnetic-dielectric composite material 1304 can include additional or fewer rows of patterned ferromagnetic layer(s) regions 1332. The easy axes of magnetization can be aligned in the patterned ferromagnetic layer(s) regions 1332. In addition, the hard axes of magnetization can be aligned in the patterned ferromagnetic layer(s) regions 1332. The ferromagnetic-dielectric composite material 1304 can be the same as ferromagnetic-dielectric composite material 10. The sides of the ferromagnetic-dielectric composite material 1304 can be planarized to remove side portions of dielectric layers 1380, for example as illustrated in FIG. 13M.

Figure 14:
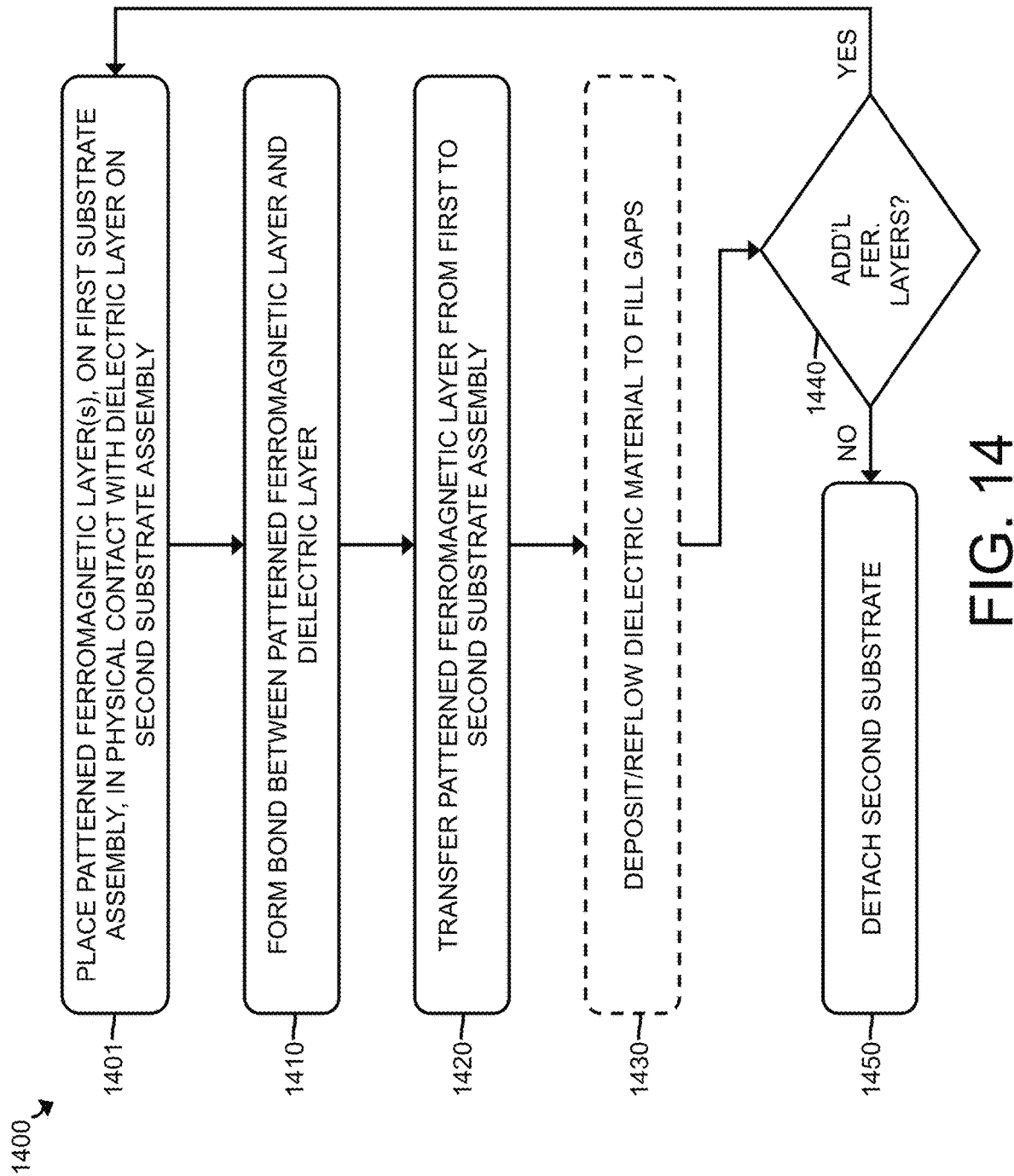
FIG. 14 is a flow chart of a method for manufacturing a ferromagnetic-dielectric composite material according to another embodiment.

FIG. 14 is a flow chart of a method 1400 for manufacturing a ferromagnetic-dielectric composite material according to another embodiment. Method 1400 can be used to manufacture material 10.

In step 1401, one or more patterned ferromagnetic layers, on a first substrate assembly, is placed in physical contact with a dielectric layer on a second substrate assembly. The first substrate assembly, including the patterned ferromagnetic layer(s), can be pre-fabricated or formed according to any of the methods described herein. For example, the first substrate assembly can be formed according to steps 600-630, steps 800-832, steps 1001-1032, or steps 1200-1232. Step 1401 can be the same as step 650, 850, and/or 1250.

In step 1410, a bond is formed between the patterned ferromagnetic layer(s) and the dielectric layer that have been placed in physical contact with each other. Step 1410 can be the same as step 660, step 860, or step 1260.

In step 1420, the patterned ferromagnetic layer(s) is/are transferred from the first substrate assembly to the second substate assembly. This step can be performed by activating a carrier release layer on the first substrate assembly to detach the first substrate from the first substrate assembly. Step 1420 can be the same as step 670, step 880, or step 1270.

In optional step 1430, a dielectric layer is optionally deposited on the patterned ferromagnetic layer(s) to fill any gaps between adjacent/neighboring patterned ferromagnetic layer regions. Alternatively, the dielectric layer(s) in the first and/or second substrate assemblies can be reflowed (e.g., during step 1410) to fill any such gaps.

If additional ferromagnetic layer(s) are to be transferred to the second substrate assembly (i.e., step 1440=yes), the method returns to step 1401 in a loop where one or more additional ferromagnetic layers on a new first substrate assembly are placed in contact with the dielectric layer on the patterned ferromagnetic layer regions that was transferred to the second substate assembly in step 1420. This loop continues until no additional ferromagnetic layer(s) are to be transferred to the second substrate assembly (i.e., step 1440=no), in which case the method proceeds to step 1450 where the second substrate is detached from the second substrate assembly. In some embodiments, a total of 2 to 100 ferromagnetic layer(s) or another number of ferromagnetic layer(s) can be formed or transferred to the receiving substrate assembly. The second substrate can be detached by activating a carrier release layer on the second substrate assembly to detach the second substrate from the second substrate assembly. Step 1450 can be the same as step 698, step 896, or step 1298.

Figure 15:
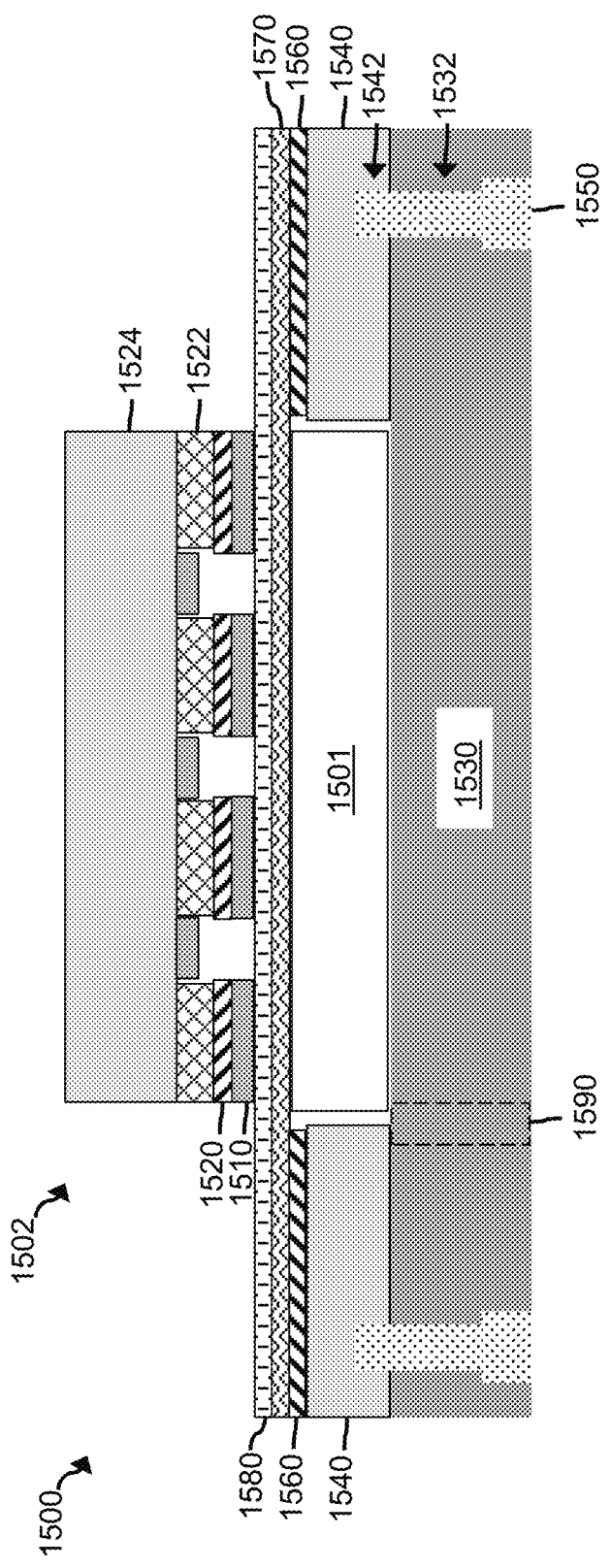
FIG. 15 is a cross-sectional illustration of an apparatus, in a first state, that can be used to support the receiving substrate during manufacturing.

FIG. 15 is a cross-sectional illustration of an apparatus 1500 that can be used to support the receiving substrate 1501 during transfer of the ferromagnetic layer(s) 1510 and dielectric layer 1520 from the patterning substrate assembly 1502. The patterning substrate assembly 1502 also includes a carrier release layer 1522 and a patterning substrate 1524.

The apparatus 1500 includes a body 1530 that is configured to support the bottom planar surface of the receiving substrate 1501. The body 1530 is wider than the receiving substrate 1501 such that the body 1530 can also support a support ring 1540 that is disposed around the receiving substrate 1501. The body 1530 and the support ring 1540 include threaded holes 1532, 1542 that are configured to engage complementary threads on bolts 1550. The threaded holes 1532, 1542 are aligned so that the bolts 1550 can engage and pass through both holes 1532, 1542.

A ring of adhesive such as double-sided polyimide tape 1560 is disposed on the support ring 1540. A polyimide, polymer, or ceramic film layer 1570 is disposed on the double-sided polyimide tape 1560 and the top surface of the receiving substrate 1501. The film layer 1570 can have a thickness of about 20 μm or another thickness. A dielectric layer such as SU-8 1580 is disposed on the film layer 1570. The SU-8 layer 1580 can function as an adhesive between the film layer 1570 and the ferromagnetic layer 1510.

When the ferromagnetic layer(s) 1510 and dielectric layer 1520 are debonded from the receiving substrate 1524, this can cause stress on the layers 1510, 1520. The apparatus 1500 is configured to mechanically support the film layer 1570 from the back using the receiving substrate 1501 and the support ring 1540.

The apparatus 1500 has a first state in which the bolts 1550 are in the holes 1532, 1542 to rigidly support or engage the support ring 1540. The apparatus 1500 is in the first state in FIG. 15. The apparatus 1500 can be in the first state during transfer of layers 1510, 1520 from the patterning substrate assembly 1502 to the receiving substrate 1501. In addition, the apparatus can be in the first state during other processing steps, such as depositing (e.g., spin coating) the SU-8 layer 1580 on the film layer 1570.

Figure 16:
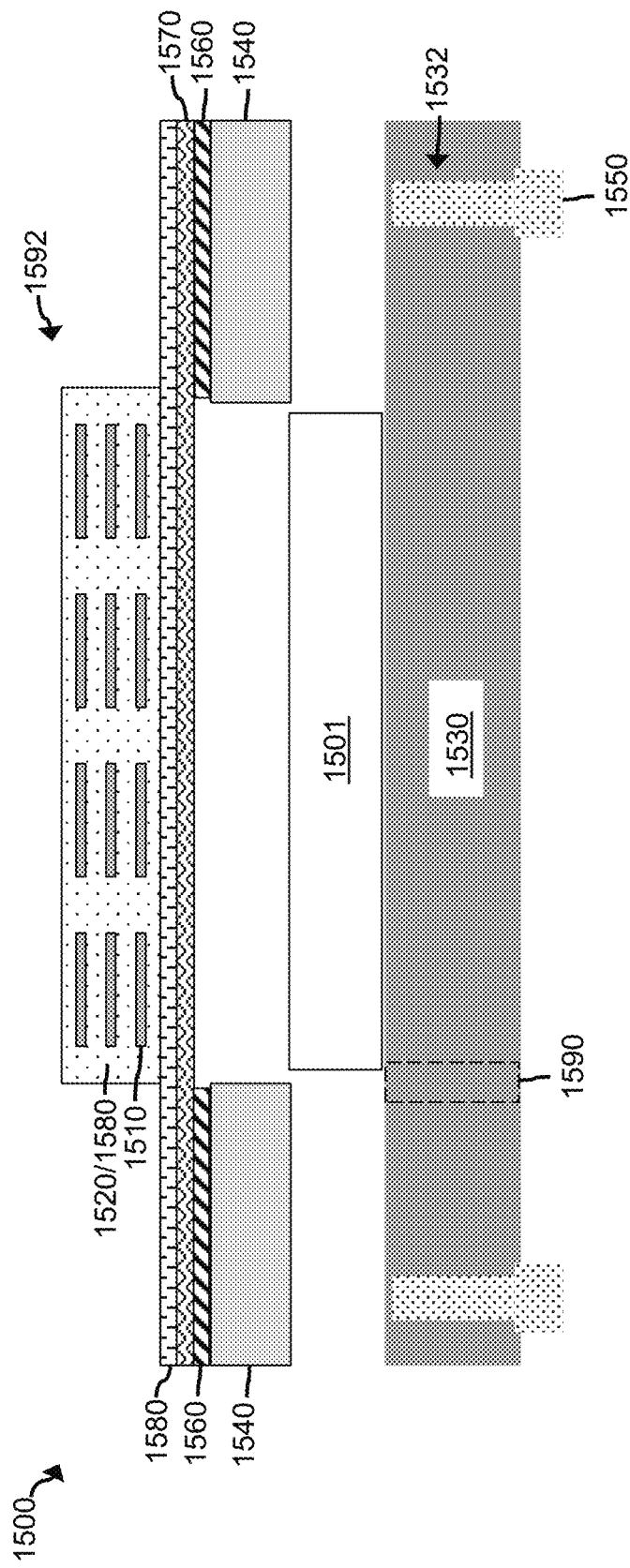
FIG. 16 is a cross-sectional illustration of the apparatus illustrated in FIG. 15 in a second state.

The apparatus 1500 has a second state in which the bolts 1550 are removed at least from hole 1542 to release the support ring 1540, as illustrated in FIG. 16. The apparatus 1500 can be placed in the second state after all rows of ferromagnetic layer(s) 1510 and dielectric layers 1520 are transferred to the receiving substrate 1501 to form material 1592 and the patterning substrate 1524 has been detached from the patterning substrate assembly 1502. Material 1592 can be the same as material 10.

An air channel 1590 defined through the body 1530 can allow air to pass through to release any suction between the support ring 1540 and the body 1530. The material 1592 and the support ring 1540 can be separated by at least partially removing the film layer 1570, such as by cutting (e.g., laser cutting) the film layer 1570. The receiving substrate, support ring, and body are constructed from steel, aluminum or another material that is impervious to the solvents used in the previous release steps. The body and receiving substrate are attached to the support ring during the process of disposing a dielectric such as SU-8 on the supporting polymer film, and during bonding. The support ring and the transferred ferromagnetic composite may be removed from the support ring during immersion in a solvent while releasing the patterning substrate, or during the final removal of the composite from the frame once all layers have been transferred.

Figure 17:
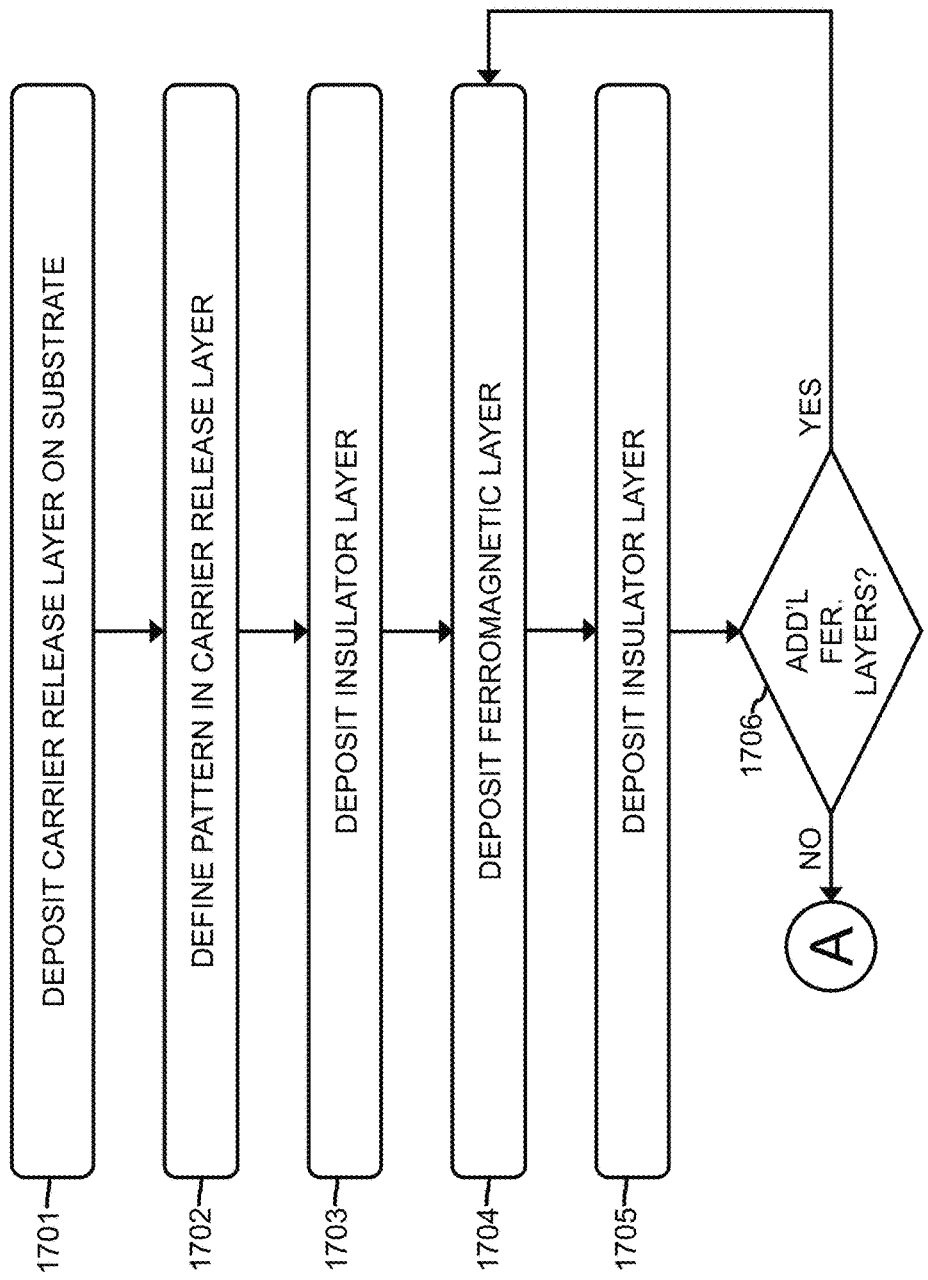
FIG. 17 is a flow chart of a method for manufacturing a ferromagnetic-dielectric composite material according to another embodiment.
Figure 17:
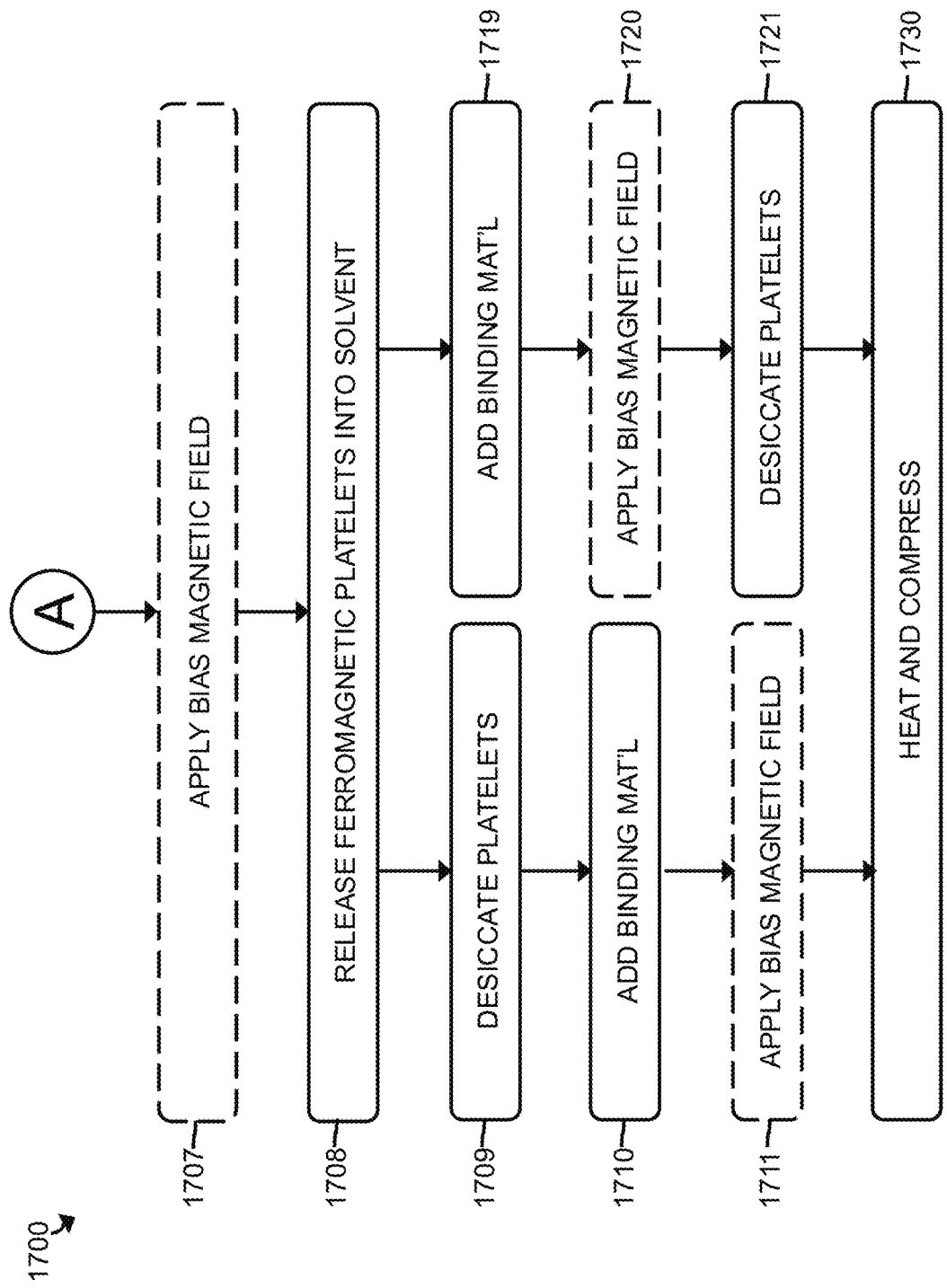

FIG. 17 is a flow chart of a method 1700 for manufacturing a ferromagnetic-dielectric composite material according to another embodiment. Method 1700 can be used to manufacture material 10.

In step 1701, a carrier release layer is deposited on a substrate. An example cross-sectional view of a substrate assembly 1800 that includes a substrate 1801 and a carrier release layer 1810 formed according to step 1701 is illustrated in FIG. 18A.

In step 1702, a pattern is defined in the carrier release layer. The pattern can be defined in a photoresist layer deposited on the carrier release layer through photolithography. The pattern can then be defined in the carrier release layer through etching or exposing it to a solvent. After the pattern is defined in the carrier release layer, the remaining photoresist layer can be removed with a solvent. An example cross-sectional view of the substrate assembly 1800 that includes a patterned carrier release layer 1812 is illustrated in FIG. 18B. The patterned carrier release layer 1812 defines and/or reveals exposed substrate regions 1802 according to a pattern 1805.

In step 1703, a first insulator layer is deposited on the patterned carrier release layer and the exposed substrate regions. An example cross-sectional view of the substrate assembly 1800 that includes a first insulator layer 1820 deposited on the patterned carrier release layer 1812 and exposed substrate regions 1802 is illustrated in FIG. 18C. The regions of the first insulator layer 1820 deposited on the patterned carrier release layer 1812 form isolated insulator layer regions 1822 according to the pattern 1805. The regions of insulator layer 1820 deposited on the exposed substrate regions 1802 form isolated insulator layer regions 1824 according to the pattern 1805.

The first insulator layer 1820 can comprise the same material as or a different material than dielectric 110 and/or non-ferromagnetic layer 510. The first insulator layer 1820 can have a thickness of about 2 nm to about 200 nm, including about 10 nm, about 25 nm, about 50 nm, about 75 nm, about 100 nm, about 125 nm, about 150 nm, about 175 nm, and any thickness or thickness range between any two of the foregoing thicknesses. The thickness can be measured along or with respect to axis 1845.

Figure 18D:
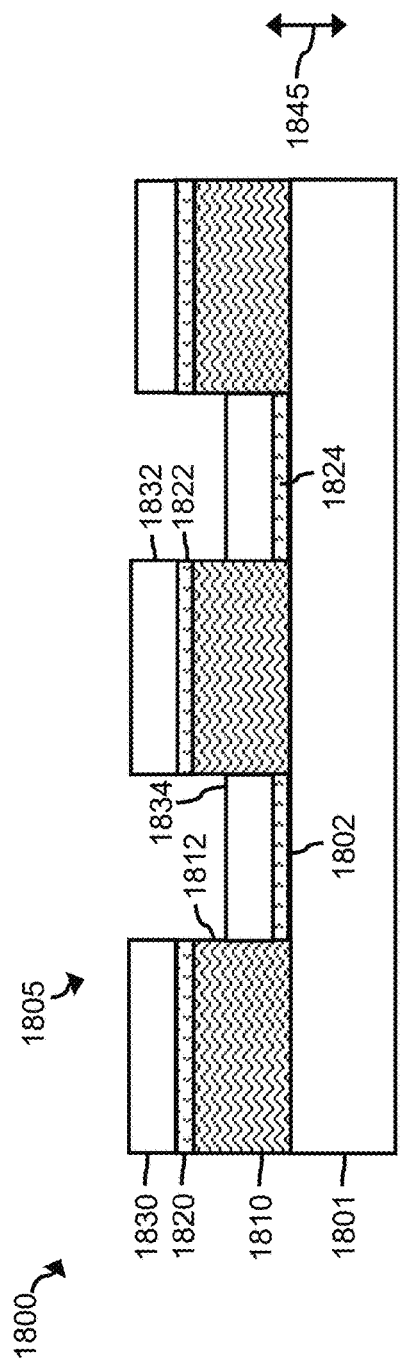

In step 1704, a ferromagnetic layer is deposited on the first insulator layer. An example cross-sectional view of the substrate assembly 1800 that includes a ferromagnetic layer 1830 deposited on the first insulator layer 1820 is illustrated in FIG. 18D. The ferromagnetic layer 1830 is deposited on the isolated insulator layer regions 1822, 1824 to form isolated ferromagnetic layer regions 1832, 1834, respectively, according to the pattern 1805. The ferromagnetic layer 1830 can include a soft ferromagnetic layer and/or a hard ferromagnetic layer. In some embodiments, each ferromagnetic layer 1830 can include a soft ferromagnetic layer and a hard ferromagnetic layer that are magnetically coupled to each other, such as soft ferromagnetic layer 5021 and hard ferromagnetic layer 5022 in ferromagnetic layer 520.

Figure 18E:
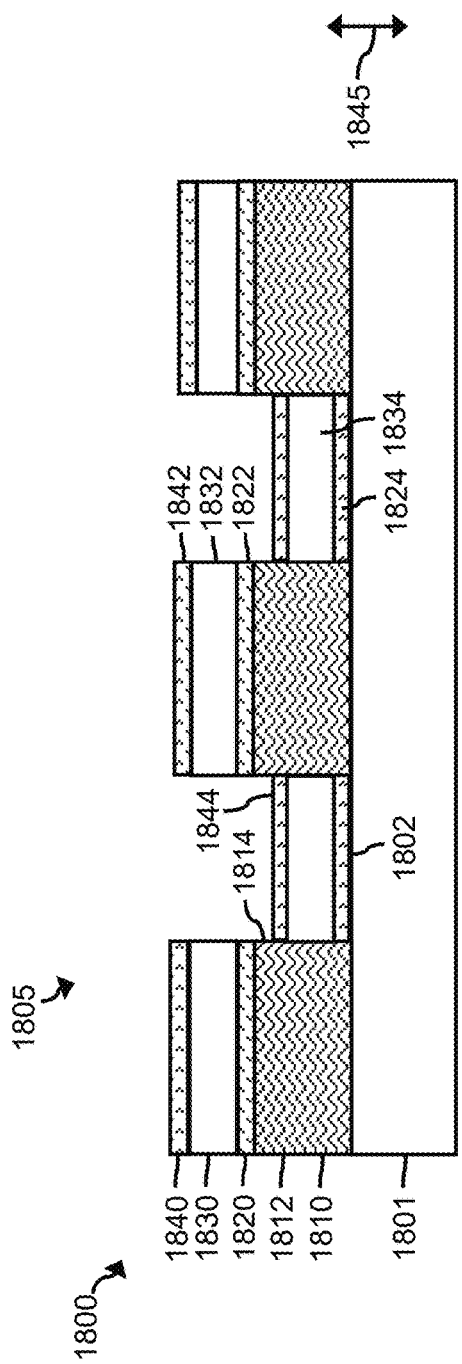

In step 1705, a second insulator layer is deposited on the ferromagnetic layer. An example cross-sectional view of the substrate assembly 1800 that includes a second insulator layer 1840 deposited on the ferromagnetic layer 1830 is illustrated in FIG. 18E. The second insulator layer 1840 is deposited on the isolated ferromagnetic layer regions 1832, 1834 to form isolated insulator regions 1842, 1844, respectively, according to the pattern 1805.

If additional ferromagnetic layers are to be deposited (i.e., step 1706=yes), steps 1704 and 1705 are repeated to form additional alternating ferromagnetic and insulator layers. Each ferromagnetic layer is located between and in physical contact with neighboring first and second insulator layers. When no additional ferromagnetic layers are to be deposited (i.e., step 1706=no), the method proceeds to optional step 1707 (via placeholder A). The height or thickness, with respect to axis 1845, of the laminated ferromagnetic layer(s) and insulator layers is preferably smaller than the height or thickness, with respect to axis 1845, of the patterned carrier release layer 1812 such that an exposed portion 1814 of the patterned carrier release layer 1812 is maintained.

In optional step 1707, a bias magnetic field is applied during or after the ferromagnetic deposition step(s) 1704. The bias magnetic field can permanently or semi-permanently set the easy axis of magnetization of the ferromagnetic layer in a direction parallel to the bias magnetic field. Permanently or semi-permanently setting the direction of the easy axis of magnetization can permanently or semi-permanently set the direction of the hard axis of magnetization in a direction orthogonal to the easy axis of magnetization in the major plane of the ferromagnetic layer. When the bias magnetic field is applied after the ferromagnetic deposition step(s) 1704, the bias magnetic field can be applied while heating or annealing the substrate assembly 1800 in the form of a magnetic anneal at a temperature of about 200° C. to about 340° C. with a magnetic field of about 0.1 Tesla to about 1.5 Tesla and a duration of about 10 to about 200 minutes. The structure can be heated or annealed in an oven or can be placed near a heat source. The bias magnetic field can be a DC magnetic field. The same magnetic field applied during deposition of the ferromagnetic layer(s) can have the same magnitude and duration as the magnetic field applied during the magnetic anneal.

Figure 18F:
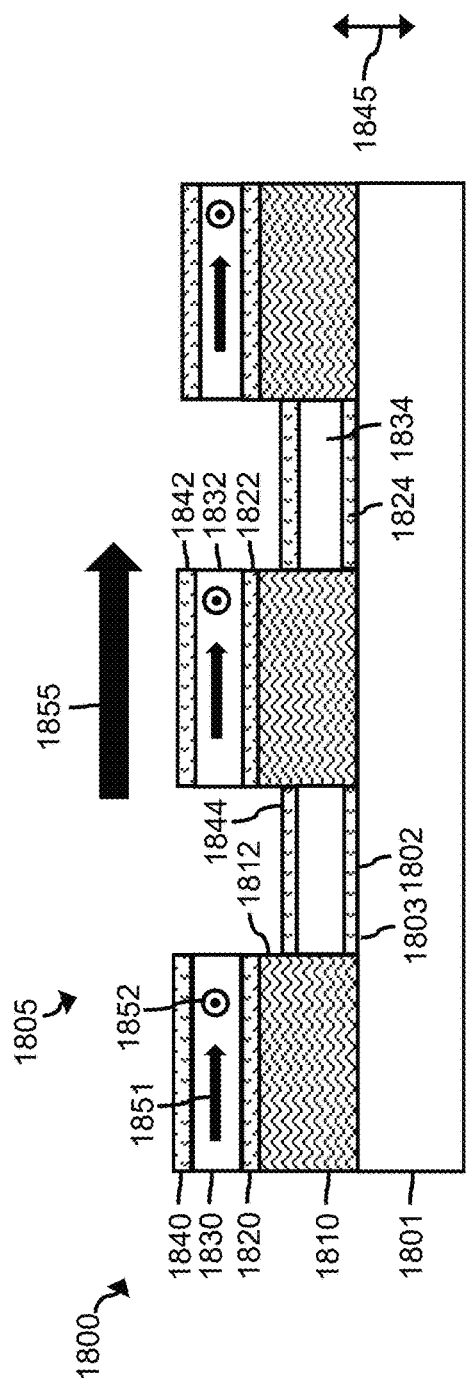

FIG. 18F is an example cross-sectional view of the substrate assembly 1800 when an optional bias magnetic field 1855 is applied. The easy axis of magnetization 1851 of the ferromagnetic layer 1830 is permanently or semi-permanently aligned with the axis of the bias magnetic field 1855. Aligning the easy axis of magnetization 1851 with the axis of the bias magnetic field 1855 induces the hard axis of magnetization 1852 of the ferromagnetic layer 1830 to be aligned in a direction orthogonal to the easy axis of magnetization 1851 within the major plane of the ferromagnetic layer 1830. For example, the major plane of the ferromagnetic layer 1830 is parallel to the top surface 1803 of the substrate 1801.

In step 1708, the patterned carrier release layer is exposed to a solvent. The solvent releases the material deposited on the patterned carrier release layer, such as by at least partially dissolving the patterned carrier release layer. The released material can be referred to as ferromagnetic film platelets, which can be the same as ferromagnetic film platelets 100, 400, and/or 500 according to an embodiment.

Figure 18G:
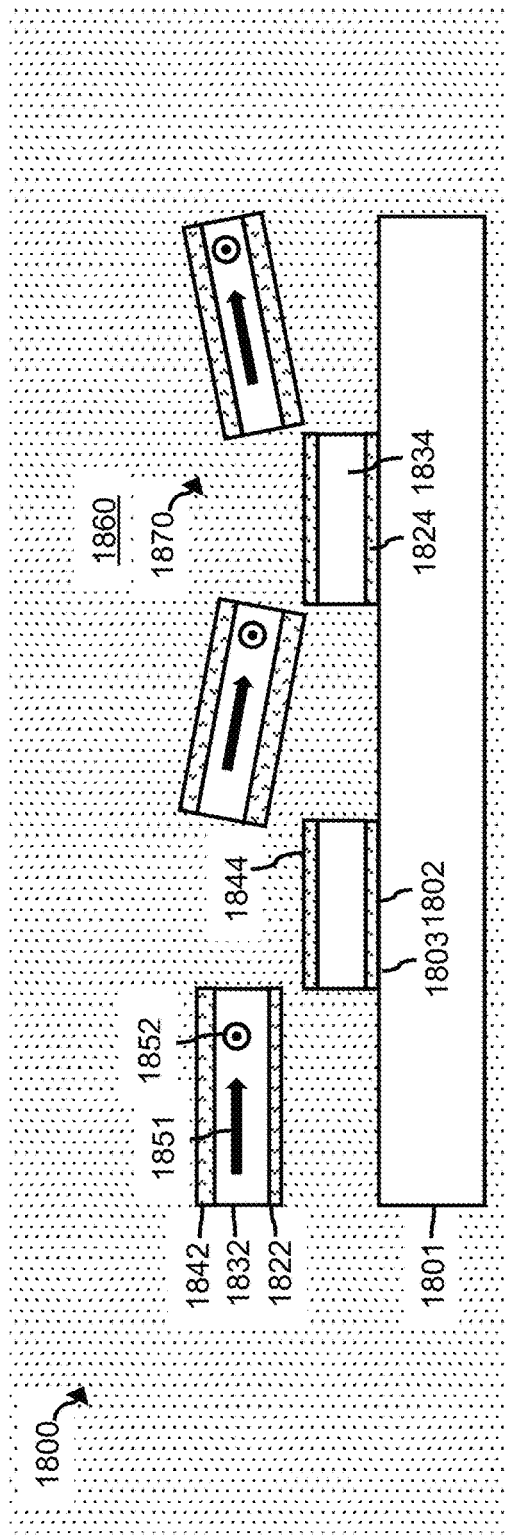

FIG. 18G is an example cross-sectional view of the substrate assembly 1800 when the substrate assembly 1800 including the patterned carrier release layer 1812 (e.g., exposed portion 1814 of the patterned carrier release layer 1812) is exposed a solvent 1860. The solvent 1860 causes the patterned carrier release layer 1812 to at least partially dissolve to release the material deposited on the patterned carrier release layer 1812 (i.e., isolated insulator layer regions 1822, isolated ferromagnetic layer regions 1832, and isolated second insulator regions 1842) to form ferromagnetic film platelets 1870. The ferromagnetic film platelets 1870 are released into the solvent 1860. The material deposited on the substrate 1801 (i.e., isolated insulator layer regions 1824, isolated ferromagnetic layer regions 1834, and isolated second insulator regions 1844) are not released by the solvent 1860. The solvent 1860 can comprise or consist of acetone, isopropyl alcohol, a solvent stripper (e.g., an N-methylpyrrolidone (NMP)-based solvent such as Remover-PG™, available from Kayaku Advanced Materials), a photoresist developer (e.g., a metal-ion-free (MIF) photoresist developer such as AZ-300-MIF™, available from EMD Performance Materials Corp.), deionized water, and/or another solvent.

In a first embodiment, the method 1700 can proceed through steps 1709-1711. In a second embodiment, the method 1700 can proceed through steps 1719-1721.

In step 1709 of the first embodiment, the platelets are desiccated by evaporating and/or removing the solvent. After the solvent is evaporated and/or removed, dry platelets remain. The dry platelets can be placed or dispensed in a mold. Alternatively, the platelets and the solvent can be placed or dispensed in a mold prior to desiccation.

In step 1710, a binding material is added to the platelets. The binding material can comprise or consist of a thermoplastic binding agent such as PMMA or bisbenzocyclobutene (BCB), or an epoxy. The binding material is preferably in liquid form. FIG. 18H is an example cross-sectional view of a mold 1880 that holds the binding material 1875 and the platelets 1870. The platelets 1870 are in a disordered state where the easy axes of magnetization 1851 of the isolated ferromagnetic layer regions 1832 in the platelets 1870 are not aligned.

In step 1711, an optional bias magnetic field is applied to the binding material and platelets in the mold. The bias magnetic field can be a DC magnetic field that extends along an axis through the mold to align or substantially align the easy axes of magnetization 1851 of the isolated ferromagnetic layer regions 1832 in the platelets 1870. FIG. 18I is an example cross-sectional view of the mold 1880 when a bias magnetic field 1885 is applied. The bias magnetic field aligns or substantially aligns (e.g., within about 5° to about 100 of each other) the easy axes of magnetization 1851 of the isolated ferromagnetic layer regions 1832 in the platelets 1870.

Figure 18J:
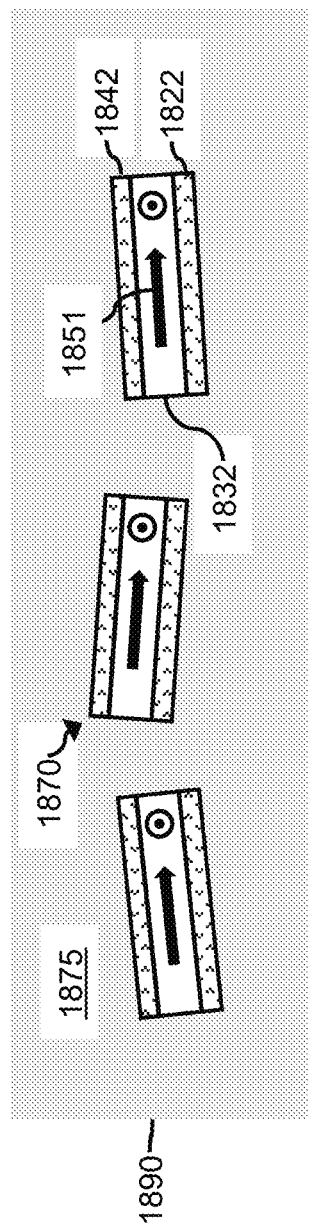

In step 1730, the binding material and the platelets are heated and compressed in the mold. The heat and/or compression can cure the binding material to form a solid in the shape of the mold (e.g., a coupon). The easy axes of magnetization 1851 of the isolated ferromagnetic layer regions 1832 in the platelets 1870 can be aligned or substantially aligned in the cured binding material 1875. The optional bias magnetic field in step 1711 can be applied during at least some of step 1730 so that the easy axes of magnetization 1851 remain substantially aligned until the binding material is cured. The heat and compression can reduce the thickness of the cured binding material 1875 to a controlled thickness. The material can be heated to a temperature of about 90° C. to about 400° C. (including any value or range between these temperatures), and a pressure of about 1 MPa to about 1 GPa (including any value or range between these pressures), can be applied to compress the material. The temperature and pressure can be based, at least in part, on the glass temperature of the binding material and the desired final thickness of the coupon 1890. After the binding material 1875 is cured and compressed, the coupon 1890 can be removed from the mold 1880, as illustrated in FIG. 18J.

In step 1719 of the second embodiment, a binding material is added to the solvent after the ferromagnetic film platelets are released. The binding material added in step 1719 can be the same as the binding material added in step 1710. The binding material, the solvent, and the ferromagnetic film can be placed and/or added to a mold (e.g., mold 1880). An example cross-sectional illustration of step 1719 can appear the same as FIG. 18H, except that reference number 1875 would represent both the solvent and the binding material In step 1720, an optional bias magnetic field is applied to the solvent, binding material, and platelets in the mold. The bias magnetic field can align or substantially align the easy axes of magnetization 1851 of the isolated ferromagnetic layer regions 1832 in the platelets 1870. Step 1720 can be the same as step 1711. An example cross-sectional illustration of step 1820 can appear the same as FIG. 18I, except that reference number 1875 would represent both the solvent and the binding material.

In step 1721, the platelets are desiccated by evaporating and/or removing the solvent. Heat can be used to evaporate the solvent, which can also cure the binding material. The easy axes of magnetization 1851 of the isolated ferromagnetic layer regions 1832 in the platelets 1870 can be aligned or substantially aligned in the cured binding material. The optional bias magnetic field in step 1720 can be applied during at least some of step 1721 so that the easy axes of magnetization 1851 remain substantially aligned until the binding material is cured.

In step 1730, cured binding material and the platelets are heated and compressed in the mold to form a coupon 1890. The heat and/or compression can reduce the thickness of the cured binding material 1875. The coupon 1890 can be removed from the mold 1880, as illustrated in FIG. 18J.

Figure 19:
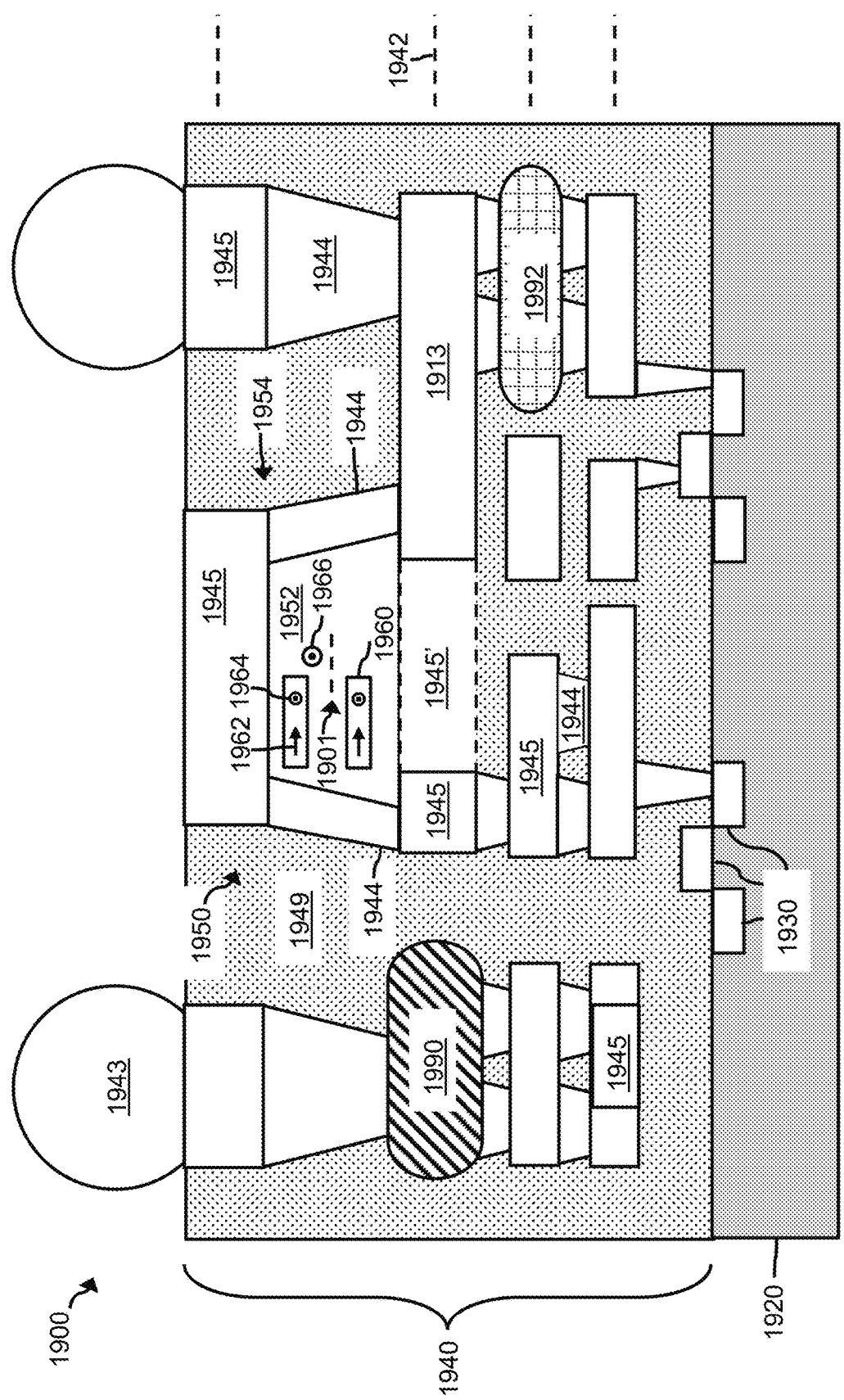
FIG. 19 is an example cross-sectional illustration of a multilevel wiring structure that includes an inductor having a ferromagnetic polymer composite material core according to an embodiment.

FIG. 19 is an example cross-sectional illustration of a multilevel wiring structure 1900 that includes an inductor having a ferromagnetic polymer composite material core according to an embodiment. The structure 1900 includes a multilevel wiring network 1940 having multiple wiring planes 1942. The multilevel wiring network 1940 is electrically coupled to active circuit components 1930, such as CMOS devices or transistors, that have been fabricated on a semiconductor substrate 1920. The active circuit components 1930 can be any kind such as planar or three-dimensional transistors, FinFETs, or the like. The substrate 1920 can be a bulk, SOI, Si-based, or other semiconductor-based substrate, without limitation. Pertaining to the same die, and over the semiconductor substrate 1920 and the components 1930, the multilevel wiring network 1940 has been fabricated.

The multilevel wiring network 1940 is arranged into wiring planes 1942 and can include addition or fewer wiring planes than those illustrated in FIG. 19. Each wiring plane 1942 contains conductive wire segments 1945. Electrical connections between conducive wire segments 1945 of differing wiring planes 1942 are provided by conductive VIAs 1944. Also shown are typical IC chip contact structures 1943, usually referred to in the art as C4 contacts, solder bumps, or copper pillars, but any other contacts for the chip's external communication are acceptable without limitation. The spaces in the wiring network 1940 are typically filled with a dielectric insulating material 1949, of which quite a few are known in the art, such as $SiO_2$.

An inductor 1950 is integrated into the multilevel wiring network 1940. The inductor 1950 includes a core 1952 that is formed of ferromagnetic polymer composite material such as ferromagnetic polymer composite material 10. The wiring segments 1945 are substantially parallel with the wiring planes 1942. The inductor 1950 further includes a conductive winding 1954 that forms a general spiral on the outside of the core 1952. The conductive winding 1954 is piecewise constructed of wire segments 1945 and of VIAs 1944. The wire segments 1945 forming the conductive winding 1954 are disposed in at least two of the wiring planes 1942 and the VIAs 1944 that form parts of the conductive winding 1954 that are vertical or orthogonal to a principal plane 1901 of the core 1952 interconnect the wire segments 1945 in the at least two wiring planes 1942. The wire segment 1945' underneath the core 1952 is delineated with dashed lines indicating that, depending how the conductive winding 1954 is constructed, it may not be visible in the depicted cross-sectional plane. A wire segment can function as a lead 1913 to the conductive winding 1954 is also shown.

The ferromagnetic polymer composite material in core 1952 includes rows of patterned or isolated ferromagnetic layer regions 1960. The ferromagnetic layers in the patterned or isolated ferromagnetic layer regions 1960 can be magnetically anisotropic such that the easy and hard axes of magnetization 1962, 1964 of the ferromagnetic layers are aligned in orthogonal directions with the principal plane of the respective ferromagnetic layers. The easy and hard axes of magnetization 1962, 1964 in the patterned or isolated ferromagnetic layer regions 1960 can be aligned in a common direction or orientation. For example, in FIG. 19 the hard axes of magnetization 1964 are aligned with each other and with a coil axis 1966 along which the conductive winding 1954 extends.

One or more optional components, shown as representative structures 1990, 1992, can also be integrated into the multilevel wiring structure 1940. Each representative structure 1990, 1992 can include one or more capacitors (e.g., trench capacitors, MIM capacitors, etc.), resistors, transformers, diodes, and/or inductors. Such components, including inductor 1950, can be electrically coupled in series, in parallel, or a combination thereof, to one another.

The useful properties of the ferromagnetic composite material include a high permeability, low coercivity and low AC loss from eddy currents. These properties are advantageous for inductors, transformers, and antennae that are used in communications, signal processing, and power converter circuits.

The invention should not be considered limited to the particular embodiments described above, but rather should be understood to cover all aspects of the invention as fairly set out in the attached claims. Various modifications, equivalent processes, as well as numerous structures to which the invention may be applicable, will be apparent to those skilled in the art to which the invention is directed upon review of this disclosure. The claims are intended to cover such modifications and equivalents.

Also some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

What is claimed is:

1. A method for manufacturing a ferromagnetic-dielectric composite material, comprising:
    depositing a carrier release layer on a substrate;
    defining a pattern in the carrier release layer to form patterned carrier release layer, the patterned carrier release layer defining exposed substrate regions;
    depositing a first insulator layer on the patterned carrier release layer and the exposed substrate regions to form first and second isolated insulator layer regions, the first isolated insulator layer regions disposed on the patterned carrier release layer, each second isolated insulator layer region disposed on a respective exposed substrate region;
    depositing a ferromagnetic layer on the first insulator layer to form first and second isolated ferromagnetic layer regions, each first isolated ferromagnetic layer region disposed on a respective first isolated insulator layer region, each second ferromagnetic layer region disposed on a respective second isolated insulator layer region;
    depositing a second insulator layer on the ferromagnetic layer to form a third and fourth isolated insulator layer regions, each third isolated insulator layer region disposed on a respective first isolated ferromagnetic layer region, each fourth isolated insulator layer region disposed on a respective second isolated ferromagnetic layer region;
    exposing the carrier release layer to a solvent to release a plurality of ferromagnetic film platelets, each ferromagnetic film platelet including the respective first isolated insulator layer region, the respective first isolated ferromagnetic layer region, and a respective third isolated insulator layer region;
    desiccating the plurality of ferromagnetic film platelets;
    adding a binding material to the plurality of ferromagnetic film platelets; and
    forming a coupon that includes the plurality of ferromagnetic film platelets.

2. The method of claim 1, wherein the plurality of ferromagnetic film platelets are desiccated before the binding material is added.

3. The method of claim 2, wherein the binding material is in a liquid form when the binding material is added to the plurality of ferromagnetic film platelets.

4. The method of claim 3, further comprising applying a bias magnetic field to align an easy axis of magnetization of the respective first isolated ferromagnetic layer region of each ferromagnetic film platelet in the liquid binding material.

5. The method of claim 4, further comprising curing the liquid binding material to form the coupon that includes a solid binding material and the plurality of ferromagnetic film platelets, the easy axes of magnetization substantially aligned with each other.

6. The method of claim 1, wherein the plurality of ferromagnetic film platelets are desiccated after the binding material is added to the plurality of ferromagnetic film platelets and the solvent.

7. The method of claim 6, further comprising applying a bias magnetic field to align an easy axis of magnetization of the respective first isolated ferromagnetic layer region of each ferromagnetic film platelet in the solvent and the binding material.

8. The method of claim 7, wherein desiccating the plurality of ferromagnetic film platelets includes:
    evaporating the solvent; and
    curing the binding material,
    wherein the desiccating occurs while the easy axes of magnetization are substantially aligned with each other.

* * * * *